United States Patent
Kitajima

(10) Patent No.: US 12,078,828 B2
(45) Date of Patent: *Sep. 3, 2024

(54) LAMINATE, OPTICAL FILTER, SOLID IMAGE PICKUP ELEMENT, IMAGE DISPLAY DEVICE, INFRARED SENSOR, AND KIT

(71) Applicant: FUJIFILM Corporation, Tokyo (JP)

(72) Inventor: Shunsuke Kitajima, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 919 days.

This patent is subject to a terminal disclaimer.

(21) Appl. No.: 16/534,729

(22) Filed: Aug. 7, 2019

(65) Prior Publication Data

US 2019/0361158 A1 Nov. 28, 2019

Related U.S. Application Data

(63) Continuation of application No. PCT/JP2018/004338, filed on Feb. 8, 2018.

(30) Foreign Application Priority Data

Mar. 7, 2017 (JP) .................. 2017-042621

(51) Int. Cl.
- *G02B 5/20* (2006.01)
- *C03C 17/42* (2006.01)
- (Continued)

(52) U.S. Cl.
CPC .............. *G02B 5/208* (2013.01); *C03C 17/42* (2013.01); *G03F 7/0007* (2013.01);
(Continued)

(58) Field of Classification Search
CPC ... G02B 5/208; C03C 17/42; C03C 2217/213; C03C 2218/116; C03C 2218/154;
(Continued)

(56) References Cited

U.S. PATENT DOCUMENTS

| 4,311,623 A | 1/1982 | Supcoe |
| 8,094,254 B2 | 1/2012 | Yamazaki et al. |

(Continued)

FOREIGN PATENT DOCUMENTS

| EP | 2471876 A1 | 7/2012 |
| JP | 2007-9096 A | 1/2007 |

(Continued)

OTHER PUBLICATIONS

Machine translation of WO 2016035695 (2016).*
(Continued)

*Primary Examiner* — Martin J Angebranndt
(74) *Attorney, Agent, or Firm* — Birch, Stewart, Kolasch & Birch, LLP

(57) ABSTRACT

A laminate includes: a near infrared light absorbing layer that includes a near infrared absorbing colorant; and a color filter layer that is arranged adjacent to the near infrared light absorbing layer in a thickness direction and includes a chromatic colorant, in which in at least one of the near infrared light absorbing layer or the color filter layer, a content of a compound in which an acid group selected from a sulfo group, a phosphate group, or a carboxyl group is bonded to a colorant skeleton is 0.1 to 99.9 mass % with respect to a total mass of compounds having a colorant skeleton.

8 Claims, 1 Drawing Sheet

(51) Int. Cl.
| | |
|---|---|
| *G03F 7/00* | (2006.01) |
| *G03F 7/004* | (2006.01) |
| *G03F 7/031* | (2006.01) |
| *G03F 7/033* | (2006.01) |
| *G03F 7/16* | (2006.01) |
| *G03F 7/20* | (2006.01) |
| *G03F 7/38* | (2006.01) |
| *H01L 27/146* | (2006.01) |

(52) U.S. Cl.
CPC ............ *G03F 7/0045* (2013.01); *G03F 7/031* (2013.01); *G03F 7/033* (2013.01); *C03C 2217/213* (2013.01); *C03C 2218/116* (2013.01); *C03C 2218/154* (2013.01); *G03F 7/162* (2013.01); *G03F 7/168* (2013.01); *G03F 7/2004* (2013.01); *G03F 7/38* (2013.01); *H01L 27/14621* (2013.01)

(58) Field of Classification Search
CPC ...... G03F 7/0007; G03F 7/0045; G03F 7/031; G03F 7/033; G03F 7/162; G03F 7/168; G03F 7/2004; G03F 7/38
See application file for complete search history.

(56) References Cited

U.S. PATENT DOCUMENTS

| | | | | |
|---|---|---|---|---|
| 11,015,077 | B2 * | 5/2021 | Takahashi | C09B 67/008 |
| 11,209,582 | B2 * | 12/2021 | Arayama | G03F 7/028 |
| 11,209,583 | B2 * | 12/2021 | Parker | B29D 11/0074 |
| 11,518,827 | B2 * | 12/2022 | Makino | C08K 5/0041 |
| 11,518,883 | B2 * | 12/2022 | Jia | C08G 77/20 |
| 11,586,108 | B2 * | 2/2023 | Arayama | C08F 220/68 |
| 2007/0238802 | A1 * | 10/2007 | Harada | C09B 23/0008 |
| | | | | 522/75 |
| 2011/0012075 | A1 * | 1/2011 | Nii | C07D 487/04 |
| | | | | 546/256 |
| 2011/0310470 | A1 * | 12/2011 | Horie | G02F 1/133502 |
| | | | | 359/352 |
| 2017/0023713 | A1 * | 1/2017 | Takiguchi | H01L 27/1462 |
| 2017/0038507 | A1 | 2/2017 | Norizuiki et al. | |
| 2017/0174869 | A1 * | 6/2017 | Arayama | C09B 69/001 |
| 2018/0356573 | A1 * | 12/2018 | Arayama | G03F 7/032 |
| 2020/0013821 | A1 * | 1/2020 | Oota | H01L 27/1462 |
| 2023/0118444 | A1 * | 4/2023 | Matsumura | C09D 11/037 |
| | | | | 252/587 |

FOREIGN PATENT DOCUMENTS

| | | | | |
|---|---|---|---|---|
| JP | 2007009096 A | * | 1/2007 | |
| JP | 2010212027 A | * | 9/2010 | |
| JP | JF2012-78396 A | | 4/2012 | |
| JP | 2012118264 A | * | 6/2012 | |
| JP | 2012208165 A | * | 10/2012 | |
| JP | 2012211266 A | * | 11/2012 | |
| JP | 2013213862 A | * | 10/2013 | |
| JP | 2014/89408 A | | 5/2014 | |
| JP | 2014085565 A | * | 5/2014 | |
| JP | 2014089408 A | * | 5/2014 | ............ G02B 5/201 |
| JP | 2015025117 A | * | 2/2015 | ............ B32B 27/06 |
| JP | 2015028602 A | * | 2/2015 | ........... C08K 5/0041 |
| JP | 2015030782 A | * | 2/2015 | ............ C09B 11/24 |
| TW | 201609991 A | | 3/2016 | |
| WO | WO 2011/024898 A1 | | 3/2011 | |
| WO | WO-2011024896 A1 | * | 3/2011 | ........... C09B 57/004 |
| WO | WO-2014189099 A1 | * | 11/2014 | ........... C08K 5/0091 |
| WO | WO-2015166873 A1 | * | 11/2015 | ........... C07D 487/04 |
| WO | WO-2016035695 A1 | * | 3/2016 | ............... C08F 2/44 |

OTHER PUBLICATIONS

Machine translation of WO 2015166873 (2015).*
Machine translation of WO 2014189099 (2014).*
International Preliminary Report on Patentability and Written Opinion of the International Searching Authority dated Sep. 19, 2019, for International Application No. PCT/JP2018/004338, with an English Translation.
International Search Report, dated May 15, 2018, for International Application No. PCT/JP2018/004338. with an English translation.
Japanese Office Action for corresponding Japanese Application No. 2019-504405, dated Oct. 6, 2020, with English translation.
Japanese Office Action for corresponding Japanese Application No. 2019-504405, dated Mar. 30, 2021, with English translation.
Taiwanese Office Action and Search Report for corresponding Taiwanese Application No. 107104850, dated Feb. 2, 2021, with English translation of the Office Action.
Japanese Notice of Reasons for Refusal for Japanese Application No. 2021-107149, dated Jul. 26, 2022, with an English translation.

* cited by examiner

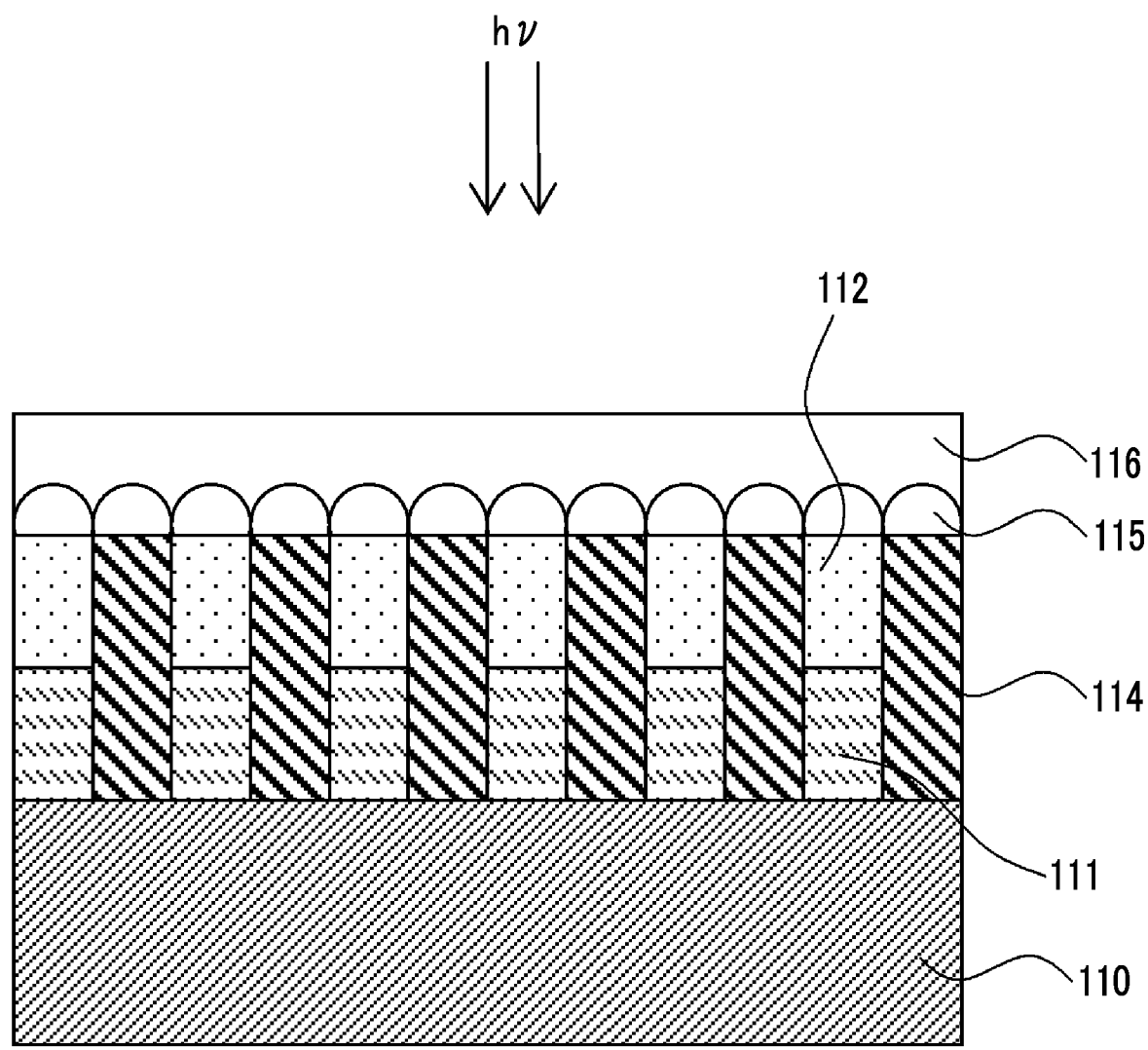

LAMINATE, OPTICAL FILTER, SOLID IMAGE PICKUP ELEMENT, IMAGE DISPLAY DEVICE, INFRARED SENSOR, AND KIT

CROSS-REFERENCE TO RELATED APPLICATIONS

This application is a Continuation of PCT International Application No. PCT/JP2018/004338 filed on Feb. 8, 2018, which claims priority under 35 U.S.C § 119(a) to Japanese Patent Application No. 2017-042621 filed on Mar. 7, 2017. Each of the above application(s) is hereby expressly incorporated by reference, in its entirety, into the present application.

BACKGROUND OF THE INVENTION

1. Field of the Invention

The present invention relates to a laminate including a near infrared light absorbing layer that includes a near infrared absorbing colorant and a color filter layer that includes a chromatic colorant. In addition, the present invention relates to an optical filter, a solid image pickup element, an image display device, and an infrared sensor that include the laminate. In addition, the present invention relates to a kit that is used for manufacturing the laminate.

2. Description of the Related Art

In a video camera, a digital still camera, a mobile phone with a camera function, or the like, a charge coupled device (CCD) or a complementary metal-oxide semiconductor (CMOS), which is a solid image pickup element for a color image, is used. In a light receiving section of this solid image pickup element, a silicon photodiode having sensitivity to infrared light is used. To that end, visibility may be corrected by providing a near infrared light absorbing layer such as a near infrared cut filter (for example, refer to WO2015/166873A).

SUMMARY OF THE INVENTION

A near infrared light absorbing layer may be used in a state where a color filter layer is laminated on the near infrared light absorbing layer. According to an investigation by the present inventors, it was found that, in a case where a color filter layer is laminated on a near infrared light absorbing layer that includes a near infrared absorbing colorant, spectral characteristics of the near infrared light absorbing layer are likely to vary as compared to a case where a near infrared light absorbing layer that includes a near infrared absorbing colorant is heated alone. It was found that, in particular, in a case where an oxygen barrier film is further formed on a laminate including a near infrared light absorbing layer and a color filter layer, spectral characteristics of the heated near infrared light absorbing layer are likely to vary.

Accordingly, an object of the present invention is to provide a laminate having excellent heat resistance. In addition, another object of the present invention is to provide an optical filter, a solid image pickup element, an image display device, and an infrared sensor that include the laminate. In addition, still another object of the present invention is to provide a kit with which the laminate having excellent heat resistance can be manufactured.

According to an investigation, the present inventors found that, in a laminate in which, in at least one of a near infrared light absorbing layer or a color filter layer, a content of a compound in which an acid group selected from a sulfo group, a phosphate group, or a carboxyl group is bonded to a colorant skeleton is 0.1 to 99.9 mass % with respect to a total mass of compounds having a colorant skeleton, heat resistance is excellent and spectral characteristics are not likely to vary even after heating, thereby completing the present invention. The present invention provides the following.

<1> A laminate comprising:
a near infrared light absorbing layer that includes a near infrared absorbing colorant; and
a color filter layer that is arranged adjacent to the near infrared light absorbing layer in a thickness direction and includes a chromatic colorant,
in which in at least one of the near infrared light absorbing layer or the color filter layer, a content of a compound in which an acid group selected from the group consisting of a sulfo group, a phosphate group, and a carboxyl group is bonded to a colorant skeleton is 0.1 to 99.9 mass % with respect to a total mass of compounds having a colorant skeleton.
<2> The laminate according to <1>,
in which the color filter layer includes colored pixels of multiple colors, and
in each of the colored pixels, a content of the compound in which an acid group selected from a sulfo group, a phosphate group, or a carboxyl group is bonded to a colorant skeleton is 0.1 to 99.9 mass % with respect to the total mass of the compounds having a colorant skeleton.
<3> The laminate according to <1> or <2>,
in which in the near infrared light absorbing layer and the color filter layer, a content of the compound in which an acid group selected from a sulfo group, a phosphate group, or a carboxyl group is bonded to a colorant skeleton is 0.1 to 99.9 mass % with respect to the total mass of the compounds having a colorant skeleton.
<4> The laminate according to any one of <1> to <3>,
in which the near infrared absorbing colorant is at least one selected from the group consisting of a pyrrolopyrrole compound, a cyanine compound, and a squarylium compound.
<5> The laminate according to any one of <1> to <4>, further comprising:
an oxygen barrier film.
<6> The laminate according to any one of <1> to <4>, further comprising:
an oxygen barrier film that is formed on a laminate including the near infrared light absorbing layer and the color filter layer.
<7> The laminate according to <5> or <6>, in which an oxygen permeability of the oxygen barrier film is 200 ml/m$^2$·day·atm or lower.
<8> An optical filter comprising:
the laminate according to any one of <1> to <7>.
<9> A solid image pickup element comprising:
the laminate according to any one of <1> to <7>.
<10> An image display device comprising:
the laminate according to any one of <1> to <7>.
<11> An infrared sensor comprising:
the laminate according to any one of <1> to <7>.

<12> A kit that is used for manufacturing a laminate, the laminate including:
a near infrared light absorbing layer that includes a near infrared absorbing colorant, and
a color filter layer that is arranged adjacent to the near infrared light absorbing layer in a thickness direction and includes a chromatic colorant,
in which in at least one of the near infrared light absorbing layer or the color filter layer, a content of a compound in which an acid group selected from a sulfo group, a phosphate group, or a carboxyl group is bonded to a colorant skeleton is 0.1 to 99.9 mass % with respect to a total mass of compounds having a colorant skeleton, and the kit comprising:
a near infrared light absorbing layer-forming composition that includes a near infrared absorbing colorant; and
a color filter layer-forming composition that includes a chromatic colorant,
in which in at least one of the near infrared light absorbing layer-forming composition or the color filter layer-forming composition, a content of a compound in which an acid group selected from the group consisting of a sulfo group, a phosphate group, and a carboxyl group is bonded to a colorant skeleton is 0.1 to 99.9 mass % with respect to a total mass of compounds having a colorant skeleton.

According to the present invention, a laminate having excellent heat resistance can be provided. In addition, an optical filter, a solid image pickup element, an image display device, and an infrared sensor that include the laminate can be provided. In addition, a kit with which the laminate having excellent heat resistance can be manufactured can be provided.

BRIEF DESCRIPTION OF THE DRAWINGS

FIG. 1 is a schematic diagram showing an embodiment of an infrared sensor.

DESCRIPTION OF THE PREFERRED EMBODIMENTS

Hereinafter, the details of the present invention will be described.

In this specification, numerical ranges represented by "to" include numerical values before and after "to" as lower limit values and upper limit values.

In this specification, unless specified as a substituted group or as an unsubstituted group, a group (atomic group) denotes not only a group (atomic group) having no substituent but also a group (atomic group) having a substituent. For example, "alkyl group" denotes not only an alkyl group having no substituent (unsubstituted alkyl group) but also an alkyl group having a substituent (substituted alkyl group).

In this specification, unless specified otherwise, "exposure" denotes not only exposure using light but also drawing using a corpuscular beam such as an electron beam or an ion beam. Examples of the light used for exposure include an actinic ray or radiation, for example, a bright light spectrum of a mercury lamp, a far ultraviolet ray represented by excimer laser, an extreme ultraviolet ray (EUV ray), an X-ray, or an electron beam.

In this specification, "(meth)acrylate" denotes either or both of acrylate or methacrylate, "(meth)acryl" denotes either or both of acryl and methacryl, "(meth)allyl" denotes either or both of allyl and methallyl, and "(meth)acryloyl" denotes either or both of acryloyl and methacryloyl.

In this specification, a weight-average molecular weight and a number-average molecular weight are defined as values in terms of polystyrene obtained by gel permeation chromatography (GPC). In this specification, an weight-average molecular weight (Mw) and a number-average molecular weight (Mn) can be obtained by using HLC-8220 (manufactured by Tosoh Corporation), using TSKgel Super AWM-H (manufactured by Tosoh Corporation; 6.0 mm ID (inner diameter)×15.0 cm) as a column, and using a 10 mmol/L lithium bromide N-methylpyrrolidinone (NMP) solution as an eluent.

In this specification, "near infrared light" denotes light (electromagnetic wave) in a wavelength range of 700 to 2,500 nm.

In this specification, a total solid content denotes the total mass of all the components of the composition excluding a solvent.

In this specification, the term "step" denotes not only an individual step but also a step which is not clearly distinguishable from another step as long as an effect expected from the step can be achieved.

<Laminate>

A laminate according to an embodiment of the present invention comprises:
a near infrared light absorbing layer that includes a near infrared absorbing colorant; and
a color filter layer that is arranged adjacent to the near infrared light absorbing layer in a thickness direction and includes a chromatic colorant,
wherein in at least one of the near infrared light absorbing layer or the color filter layer, a content of a compound in which an acid group selected from a sulfo group, a phosphate group, or a carboxyl group is bonded to a colorant skeleton (hereinafter, also referred to as "colorant compound to which the specific acid group is bonded") is 0.1 to 99.9 mass % with respect to a total mass of compounds having a colorant skeleton.

Even in a case where the laminate according to the embodiment of the present invention is heated at a high temperature (for example, 240° C. or higher), a variation in the spectral characteristics of the near infrared light absorbing layer can be suppressed, and thus the laminate has excellent heat resistance. The reason why this effect can be obtained is not clear but is presumed to be as follows. With the configuration in which, in at least one of the near infrared light absorbing layer or the color filter layer, the content of the colorant compound to which the specific acid group is bonded is 0.1 to 99.9 mass % with respect to the total mass of the compounds having a colorant skeleton, the decomposition or modification of the near infrared absorbing colorant caused by heating can be suppressed, and thus a variation in the spectral characteristics of the near infrared light absorbing layer can be suppressed.

In addition, in a case where an oxygen barrier film is further formed on a laminate including a near infrared light absorbing layer and a color filter layer, spectral characteristics of the heated near infrared light absorbing layer are likely to vary in the related art. However, according to the present invention, even in a case where an oxygen barrier film is further formed, a variation in the spectral characteristics of the near infrared light absorbing layer can be sufficiently suppressed. Therefore, in a case where the laminate according to the embodiment of the present invention further includes an oxygen barrier film in addition to the near infrared light absorbing layer and the color filter layer, the effect is particularly significant.

In the laminate according to the embodiment of the present invention, in at least one of the near infrared light absorbing layer or the color filter layer, the content of the colorant compound to which the specific acid group is bonded is preferably 1 mass % or higher, more preferably 3 mass % or higher, and still more preferably 5 mass % or higher with respect to the total mass of the compounds having a colorant skeleton. The upper limit is preferably 99 mass % or lower, more preferably 60 mass % or lower, and still more preferably 50 mass % or lower. In addition, as the acid group, a sulfo group or a carboxyl group is preferable, and a sulfo group is more preferable. Examples of the compounds having a colorant skeleton included in the laminate according to the present invention include a near infrared absorbing colorant, a chromatic colorant, and a colorant derivative. In addition, examples of the colorant compound to which the specific acid group is bonded include a colorant derivative. It is preferable that the colorant derivative is a compound represented by Formula (B1).

In Formula (B1), P represents a colorant skeleton, L represents a single bond or a linking group, X represents an acid group selected from a sulfo group, a phosphate group, or a carboxyl group, m represents an integer of 1 or more, n represents an integer of 1 or more, in a case where m represents 2 or more, a plurality of L's and a plurality of X's may be the same as or different from each other, and in a case where n represents 2 or more, a plurality of X's may be the same as or different from each other.

Examples of the colorant skeleton represented by P in Formula (B1) include a pyrrolopyrrole colorant skeleton, a diketo pyrrolo pyrrole colorant skeleton, a quinacridone colorant skeleton, an anthraquinone colorant skeleton, a dianthraquinone colorant skeleton, a benzoisoindole colorant skeleton, a thiazine indigo colorant skeleton, an azo colorant skeleton, a quinophthalone colorant skeleton, a phthalocyanine colorant skeleton, a naphthalocyanine colorant skeleton, a dioxazine colorant skeleton, a perylene colorant skeleton, a perinone colorant skeleton, a benzimidazolone colorant skeleton, a benzothiazole colorant skeleton, a benzimidazole colorant skeleton, and a benzoxazole colorant skeleton. Among these, at least one selected from a pyrrolopyrrole colorant skeleton, a diketo pyrrolo pyrrole colorant skeleton, a phthalocyanine colorant skeleton, a quinacridone colorant skeleton, or a benzimidazolone colorant skeleton is preferable.

Examples of the linking group represented by L in Formula (B1) include a group composed of 1 to 100 carbon atoms, 0 to 10 nitrogen atoms, 0 to 50 oxygen atoms, 1 to 200 hydrogen atoms, and 0 to 20 sulfur atoms. Examples of the linking group include —CH$_2$—, >CH—, >C<, —O—, —CO—, —COO—, —OCO—, —NH—, —N<, —CONH—, —CON<, an aliphatic ring group, an aromatic hydrocarbon ring group, a heterocyclic group, and a group of a combination thereof. It is preferable that the heterocyclic group is a 5- or 6-membered ring. In addition, the heterocyclic group may be a monocycle or a fused ring. The heterocyclic group is preferably a monocycle or a fused ring composed of 2 to 8 rings, and more preferably a monocycle or a fused ring composed of 2 to 4 rings. In addition, examples of a heteroatom constituting the heterocyclic group include a nitrogen atom, an oxygen atom, and a sulfur atom. The number of heteroatoms constituting the heterocyclic group is preferably 1 to 3 and more preferably 1 or 2.

Specific examples of the colorant derivative include compounds having the following structures. In addition, for example, compounds described in JP1981-118462A (JP-556-118462A), JP1988-264674A (JP-563-264674A), JP1989-217077A (JP-H1-217077A), JP1991-009961A (JP-H3-009961A), JP1991-026767A (JP-H3-026767A), JP1991-153780A (JP-H3-153780A), JP1991-045662A (JP-H3-045662A), JP1992-285669A (JP-H4-285669A), JP1994-145546A (JP-H6-145546A), JP1994-212088A (JP-H6-212088A), JP1994-240158A (JP-H6-240158A), JP1998-030063A (JP-H10-030063A), JP1998-195326A (JP-H10-195326A), paragraphs "0086" to "0098" of WO2011/024896A, and paragraphs "0063" to "0094" of WO2012/102399A can be used, the contents of which are incorporated herein by reference. Each of the following compounds 3, 6, and 9 is a mixture of compounds in which two or three sulfo groups, phosphate groups, or carboxyl groups in total are bonded to four isoindole rings, and the average number of sulfo groups, phosphate groups, or carboxyl groups bonded to four isoindole rings is 2.2.

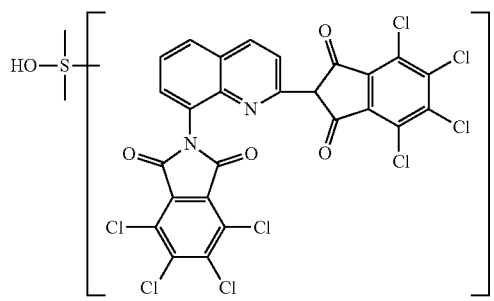

1

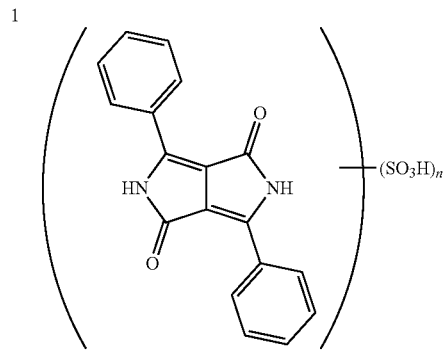

2 n = 1 or 2

-continued
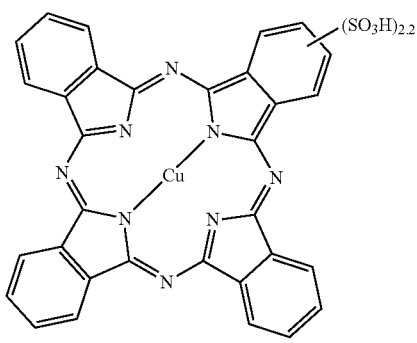
3
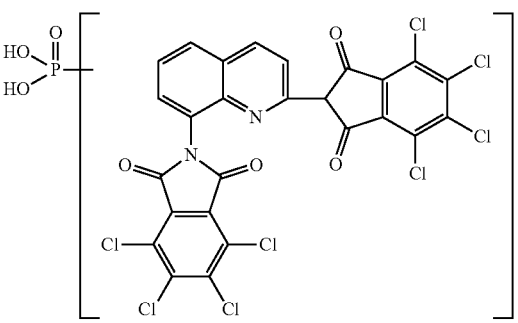
5
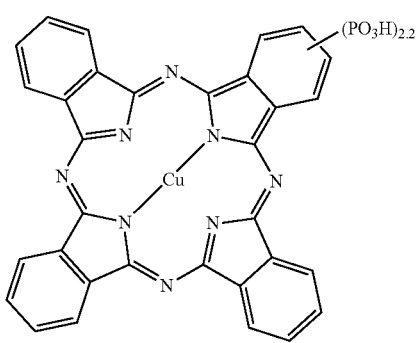
6
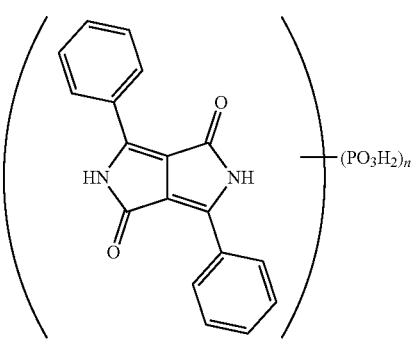
7
n = 1 or 2
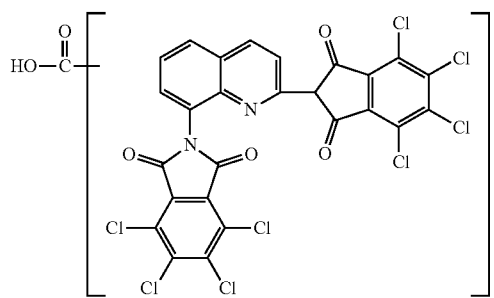
8
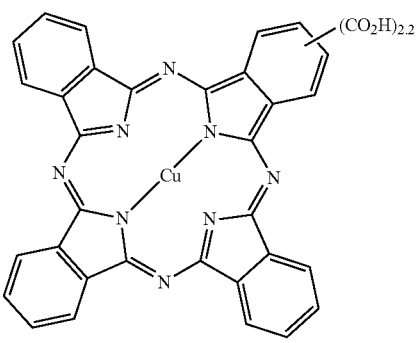
9
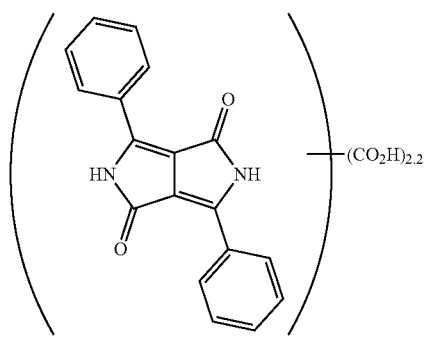
10
n = 1 or 2

-continued

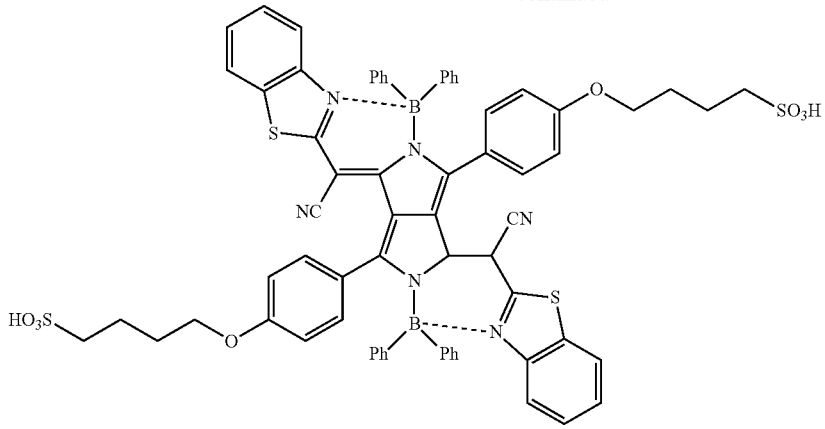

In the laminate according to the embodiment of the present invention, in the color filter layer, the content of the colorant compound to which the specific acid group is bonded is preferably 0.1 to 99.9 mass % with respect to the total mass of the compound having a colorant skeleton. The lower limit is preferably 1 mass % or higher, more preferably 3 mass % or higher, and still more preferably 5 mass % or higher. The upper limit is preferably 99 mass % or lower, more preferably 60 mass % or lower, and still more preferably 50 mass % or lower. The chromatic colorant included in the color filter layer is a pigment, and an aspect in which the color filter layer further includes the colorant compound to which the specific acid group is bonded in addition to the pigment is more preferable. In this aspect, the near infrared light absorbing layer may include or may not include the colorant compound to which the specific acid group is bonded. In addition, in a case where the near infrared absorbing colorant does not include the colorant compound to which the specific acid group is bonded, it is preferable that the near infrared absorbing colorant included in the near infrared light absorbing layer is a dye. In addition, in a case where the near infrared absorbing colorant included in the near infrared light absorbing layer is a pigment, it is preferable that the near infrared light absorbing layer includes the colorant compound to which the specific acid group is bonded.

In a more preferable aspect of the laminate according to the embodiment of the present invention, in the near infrared light absorbing layer and the color filter layer, the content of the colorant compound to which the specific acid group is bonded is 0.1 to 99.9 mass % with respect to the total mass of the compounds having a colorant skeleton. The lower limit is preferably 1 mass % or higher, more preferably 3 mass % or higher, and still more preferably 5 mass % or higher. The upper limit is preferably 99 mass % or lower, more preferably 60 mass % or lower, and still more preferably 50 mass % or lower.

In the laminate according to the embodiment of the present invention, the near infrared absorbing colorant included in the near infrared light absorbing layer is preferably a compound having an absorption in a wavelength range of 700 to 1,300 nm, more preferably a compound having a maximum absorption wavelength in a wavelength range of 700 to 1,300 nm, and still more preferably a compound having a maximum absorption wavelength in a wavelength range of 700 to 1,000 nm. The near infrared absorbing colorant is a compound having a colorant skeleton.

The near infrared absorbing colorant may be any one of a pigment or a dye and is preferably a dye. A dye tends to have lower heat resistance than a pigment. However, according to the present invention, even in a case where a dye is used as the near infrared absorbing colorant, a laminate having excellent heat resistance can be obtained. Therefore, in a case where a dye is used as the near infrared absorbing colorant, the effects of the present invention are particularly significant. In addition, in the present invention, it is also preferable that a combination of a dye and a pigment is used as the near infrared absorbing colorant. In a case where a combination of a dye and a pigment is used, a ratio dye: pigment of the mass of the dye to the mass of the pigment is preferably 99.9:0.1 to 0.1:99.9, more preferably 99.9:0.1 to 10:90, and still more preferably 99.9:0.1 to 20:80.

In this specification, the dye refers to a colorant compound that is likely to be soluble in a solvent, and the pigment refers to a colorant compound that is not likely to be soluble in a solvent. The solubility of the dye in 100 g of at least one solvent selected from cyclopentanone, cyclohexanone, or dipropylene glycol monomethyl ether at 23° C. is preferably 1 g or higher, more preferably 2 g or higher, and still more preferably 5 g or higher. In addition, the solubility of the pigment in 100 g of each solvent of cyclopentanone, cyclohexanone, or dipropylene glycol monomethyl ether at 23° C. is preferably lower than 1 g, more preferably 0.1 g or lower, and still more preferably 0.01 g or lower.

It is preferable that the near infrared absorbing colorant is a compound that includes a π-conjugated plane having a monocyclic or fused aromatic ring. The near infrared absorbing colorant may include the π-conjugated plane separately from a colorant skeleton but preferably includes a colorant skeleton in the π-conjugated plane.

The number of atoms constituting the π-conjugated plane other than hydrogen is preferably 6 or more, more preferably 14 or more, still more preferably 20 or more, still more preferably 25 or more, and still more preferably 30 or more. For example, the upper limit is preferably 80 or less and more preferably 50 or less.

The number of monocyclic or fused aromatic rings included in the π-conjugated plane is preferably 2 or more, more preferably 3 or more, still more preferably 4 or more, and still more preferably 5 or more. The upper limit is, for example, preferably 100 or less, more preferably 50 or less, and still more preferably 30 or less. Examples of the aromatic ring include a benzene ring, a naphthalene ring, a pentalene ring, an indene ring, an azulene ring, a heptalene ring, an indacene ring, a perylene ring, a pentacene ring, a quaterrylene ring, an acenaphthene ring, a phenanthrene ring, an anthracene ring, a naphthacene ring, a chrysene ring, a triphenylene ring, a fluorene ring, a pyridine ring, a quinoline ring, an isoquinoline ring, an imidazole ring, a benzimidazole ring, a pyrazole ring, a thiazole ring, a benzothiazole ring, a triazole ring, a benzotriazole ring, an oxazole ring, a benzoxazole ring, an imidazoline ring, a pyrazine ring, a quinoxaline ring, a pyrimidine ring, a quinazoline ring, a pyridazine ring, a triazine ring, a pyrrole ring, an indole ring, an isoindole ring, a carbazole ring, and a fused ring including the above-described ring.

The near infrared absorbing colorant has a maximum absorption wavelength in a wavelength range of 700 to 1,000 nm, and a ratio $A^1/A^2$ of an absorbance $A^1$ at a wavelength of 500 nm to an absorbance $A^2$ at the maximum absorption wavelength is preferably 0.08 or lower and more preferably 0.04 or lower. According to this aspect, a near infrared light absorbing layer having excellent visible transparency and infrared shielding properties can be obtained.

It is preferable that the near infrared light absorbing layer includes at least two compounds having different maximum absorption wavelengths as the near infrared absorbing colorant. According to this aspect, the waveform of the absorption spectrum of the near infrared light absorbing layer is wider than that in a case where the near infrared light absorbing layer includes only one near infrared absorbing colorant, and near infrared light in a wide wavelength range can be shielded.

In the present invention, as the near infrared absorbing colorant, at least one selected from a pyrrolopyrrole compound, a cyanine compound, a squarylium compound, a phthalocyanine compound, a naphthalocyanine compound, a quaterrylene compound, a merocyanine compound, a croconium compound, an oxonol compound, a diimmonium compound, a dithiol compound, a triarylmethane compound, a pyrromethene compound, an azomethine compound, an anthraquinone compound, or a dibenzofuranone compound is preferable, at least one selected from a pyrrolopyrrole compound, a cyanine compound, a squarylium compound, a phthalocyanine compound, a naphthalocyanine compound, or a quaterrylene compound is more preferable, at least one selected from a pyrrolopyrrole compound, a cyanine compound, or a squarylium compound is still more preferable, and a pyrrolopyrrole compound is still more preferable. Examples of the diimmonium compound include a compound described in JP2008-528706A, the content of which is incorporated herein by reference. Examples of the phthalocyanine compound include a compound described in paragraph "0093" of JP2012-077153A, oxytitaniumphthalocyanine described in JP2006-343631A, and a compound described in paragraphs "0013" to "0029" of JP2013-195480A, the contents of which are incorporated herein by reference. Examples of the naphthalocyanine compound include a compound described in paragraph "0093" of JP2012-077153A, the content of which is incorporated herein by reference. In addition, as the cyanine compound, the phthalocyanine compound, the naphthalocyanine compound, the diimmonium compound, or the squarylium compound, for example, a compound described in paragraphs "0010" to "0081" of JP2010-111750A may be used, the content of which is incorporated herein by reference. In addition, the details of the cyanine compound can be found in, for example, "Functional Colorants by Makoto Okawara, Masaru Matsuoka, Teijiro Kitao, and Tsuneoka Hirashima, published by Kodansha Scientific Ltd.", the content of which is incorporated herein by reference. In addition, a compound described in paragraphs JP2016-146619A can also be used as the near infrared absorbing colorant, the content of which is incorporated herein by reference.

As the pyrrolopyrrole compound, a compound represented by Formula (PP) is preferable. According to this aspect, a near infrared light absorbing layer having excellent heat resistance or light fastness is likely to be formed.

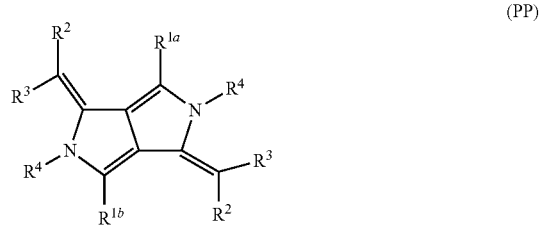

(PP)

In the formula, $R^{1a}$ and $R^{1b}$ each independently represent an alkyl group, an aryl group, or a heteroaryl group, $R^2$ and $R^3$ each independently represent a hydrogen atom or a substituent, $R^2$ and $R^3$ may be bonded to each other to form a ring, $R^4$, s each independently represent a hydrogen atom, an alkyl group, an aryl group, a heteroaryl group, —$BR^{4A}R^{4B}$, or a metal atom, $R^4$ may form a covalent bond or a coordinate bond with at least one selected from the group consisting of $R^{1a}$, $R^{1b}$, and $R^3$, and $R^{4A}$ and $R^{4B}$ each independently represent a substituent. The details of Formula (PP) can be found in paragraphs "0017" to "0047" of JP2009-263614A, paragraphs "0011" to "0036" of JP2011-068731A, and paragraphs "0010" to "0024" of WO2015/166873A, the contents of which are incorporated herein by reference.

$R^{1a}$ and $R^{1b}$ each independently represent preferably an aryl group or a heteroaryl group, and more preferably an aryl group. In addition, the alkyl group, the aryl group, and the heteroaryl group represented by $R^{1a}$ to $R^{1b}$ may have a substituent or may be unsubstituted. Examples of the substituent include an alkoxy group, a hydroxy group, a halogen atom, a cyano group, a nitro group, —$OCOR^{11}$, —$SOR^{12}$, and —$SO_2R^{13}$. $R^{11}$ to $R^{13}$ each independently represent a hydrocarbon group or a heterocyclic group. In addition, examples of the substituent include a substituent described in paragraphs "0020" and "0022" of JP2009-263614A and a substituent described below regarding Formula (SQ). For example, as the substituent, an alkoxy group, a hydroxy group, a cyano group, a nitro group, —$OCOR^{11}$, —$SOR^{12}$, or —$SO_2R^{13}$ is preferable. As the group represented by $R^{1a}$ and $R^{1b}$, an aryl group which has an alkoxy group having a branched alkyl group as a substituent, an aryl group which has a hydroxy group as a substituent, or an aryl group which has a group represented by —$OCOR^{11}$ as a substituent is preferable. The number of carbon atoms in the branched alkyl group is preferably 3 to 30 and more preferably 3 to 20.

It is preferable that at least one of $R^2$ or $R^3$ represents an electron-withdrawing group, and it is more preferable that $R^2$ represents an electron-withdrawing group (preferably a cyano group) and $R^3$ represents a heteroaryl group. It is preferable that the heteroaryl group is a 5- or 6-membered ring. In addition, the heteroaryl group is preferably a monocycle or a fused ring, more preferably a monocycle or a fused ring composed of 2 to 8 rings, and still more preferably a monocycle or a fused ring composed of 2 to 4 rings. The number of heteroatoms constituting the heteroaryl group is preferably 1 to 3 and more preferably 1 or 2. Examples of the heteroatom include a nitrogen atom, an oxygen atom, and a sulfur atom. It is preferable that the heteroaryl group has one or more nitrogen atoms.

It is preferable that $R^4$ represents a hydrogen atom or a group represented by —$BR^{4A}R^{4B}$. As the substituent represented by $R^{4A}$ and $R^{4B}$, a halogen atom, an alkyl group, an alkoxy group, an aryl group, or a heteroaryl group is preferable, an alkyl group, an aryl group, or a heteroaryl group is more preferable, and an aryl group is still more preferable. Specific examples of the group represented by —$BR^{4A}R^{4B}$ include a difluoroboron group, a diphenylboron group, a dibutylboron group, a dinaphthylboron group, and a catecholboron group. In particular, a diphenylboron group is preferable.

Specific examples of the compound represented by Formula (PP) include the following compounds. In the following structural formulae, Me represents a methyl group, and Ph represents a phenyl group. In addition, examples of the pyrrolopyrrole compound include a compound described in paragraphs "0016" to "0058" of JP2009-263614A, a compound described in paragraphs "0037" to "0052" of JP2011-068731A, and a compound described in paragraphs "0010" to "0033" of WO2015/166873A, the contents of which are incorporated herein by reference.

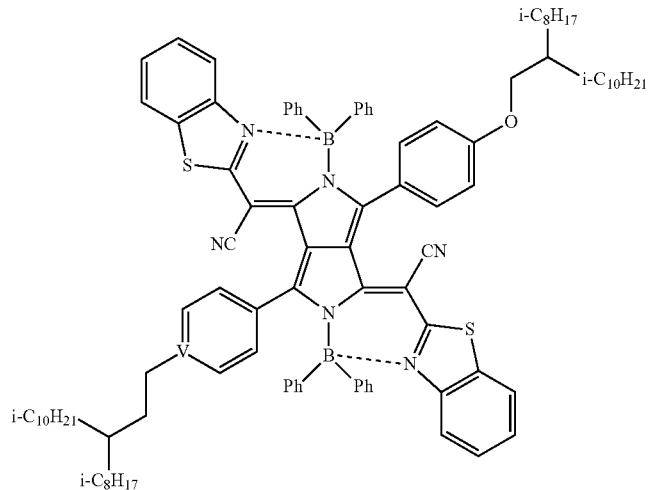

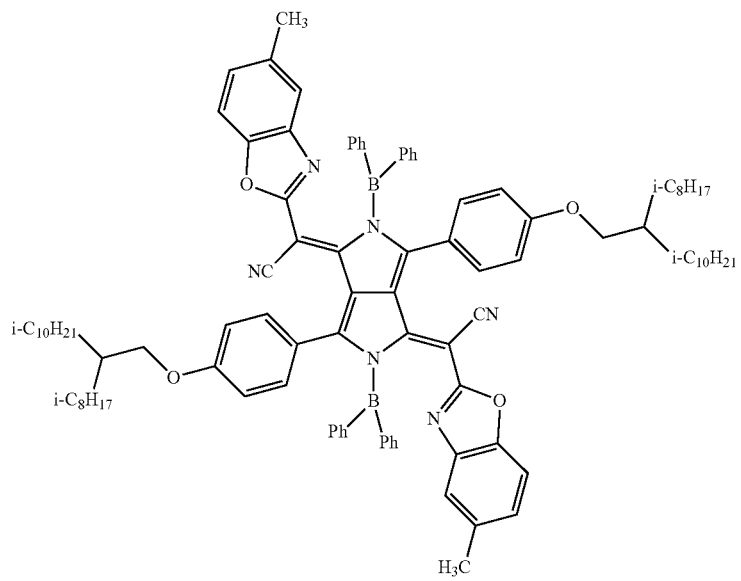

-continued
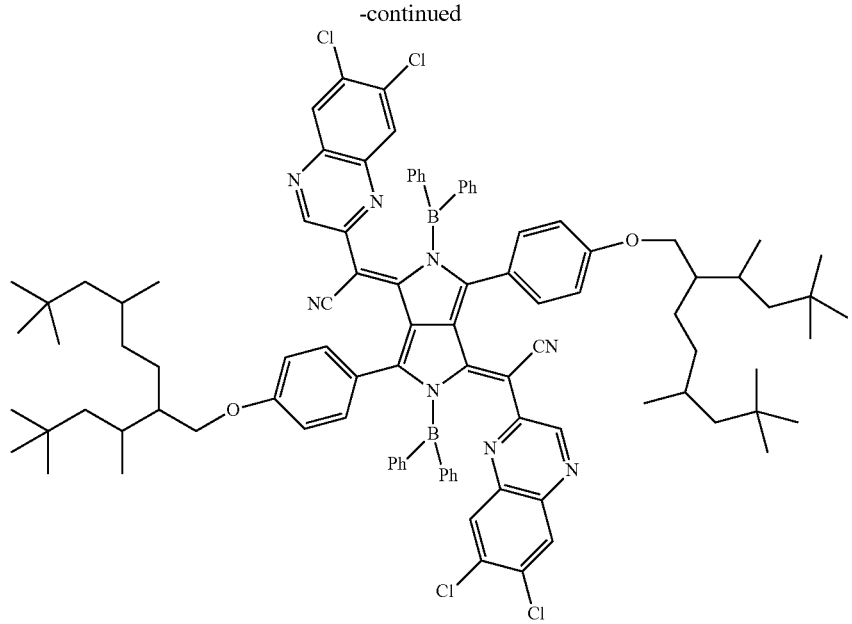
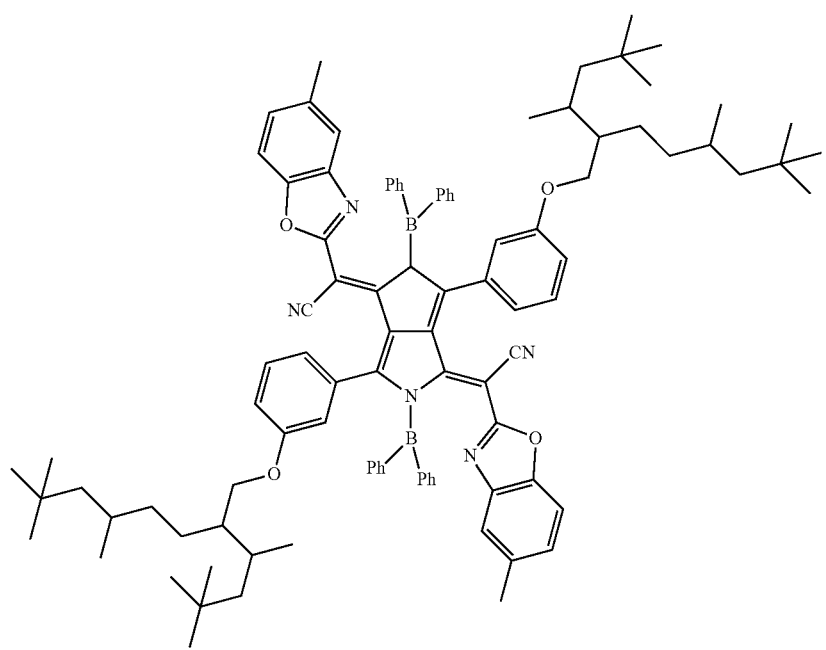

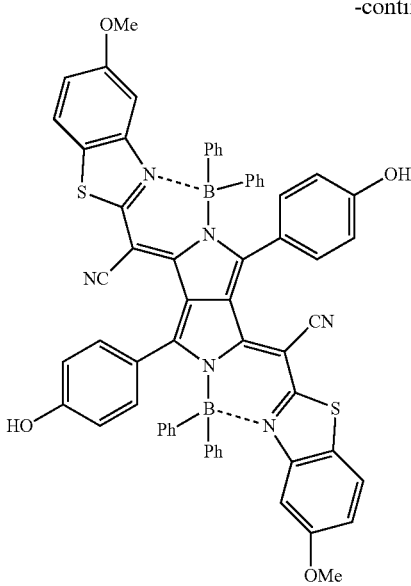

As the squarylium compound, a compound represented by the following Formula (SQ) is preferable.

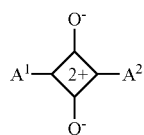

In Formula (SQ), $A^1$ and $A^2$ each independently represent an aryl group, a heteroaryl group, or a group represented by the following Formula (A-1).

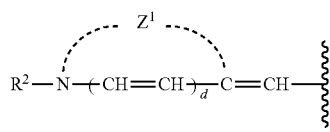

In Formula (A-1), $Z^1$ represents a non-metal atomic group for forming a nitrogen-containing heterocycle, $R^2$ represents an alkyl group, an alkenyl group, or an aralkyl group, d represents 0 or 1, and a wave line represents a direct bond.

The number of carbon atoms in the aryl group represented by $A^1$ and $A^2$ is preferably 6 to 48, more preferably 6 to 24, and still more preferably 6 to 12.

It is preferable that the heteroaryl group represented by $A^1$ and $A^2$ is a 5- or 6-membered ring. In addition, the heteroaryl group is preferably a monocycle or a fused ring composed of 2 to 8 rings, more preferably a monocycle or a fused ring composed of 2 to 4 rings, and still more preferably a monocycle or a fused ring composed of 2 or 3 rings. Examples of a heteroatom constituting the ring of the heteroaryl group include a nitrogen atom, an oxygen atom, and a sulfur atom. Among these, a nitrogen atom or a sulfur atom is preferable. The number of heteroatoms constituting the ring of the heteroaryl group is preferably 1 to 3 and more preferably 1 or 2.

The aryl group and the heteroaryl group may have a substituent. In a case where the aryl group and the heteroaryl group have two or more substituents, the substituents may be the same as or different from each other.

Examples of the sub stituent include a halogen atom, a cyano group, a nitro group, an alkyl group, an alkenyl group, an alkynyl group, an aryl group, a heteroaryl group, an aralkyl group, $—OR^{10}$, $—COR^{11}$, $—COOR^{12}$, $—OCOR^{13}$, $—NR^{14}R^{15}$, $—NHCOR^{16}$, $—CONR^{17}R^{18}$, $—NHCONR^{19}R^{20}$, $—NHCOOR^{21}$, $—SR^{22}$, $—SO_2R^{23}$, $—SO_2OR^{24}$, $—NHSO_2R^{25}$, and $—SO_2NR^{26}R^{27}$. $R^{10}$ to $R^{27}$ each independently represent a hydrogen atom, an alkyl group, an alkenyl group, an alkynyl group, an aryl group, a heteroaryl group, or an aralkyl group. In a case where $R^{12}$ in $—COOR^{12}$ represents a hydrogen atom, the hydrogen atom may be dissociable or may be in the form of a salt. In a case where $R^{24}$ in $—SO_2OR^{24}$ represents a hydrogen atom, the hydrogen atom may be dissociable or may be in the form of a salt.

Examples of the halogen atom include a fluorine atom, a chlorine atom, a bromine atom, and an iodine atom.

The number of carbon atoms in the alkyl group is preferably 1 to 20, more preferably 1 to 15, and still more preferably 1 to 8. The alkyl group may be linear, branched, or cyclic and is preferably linear or branched.

The number of carbon atoms in the alkenyl group is preferably 2 to 20, more preferably 2 to 12, and still more preferably 2 to 8. The alkenyl group may be linear, branched, or cyclic and is preferably linear or branched.

The number of carbon atoms in the alkynyl group is preferably 2 to 40, more preferably 2 to 30, and still more preferably 2 to 25. The alkynyl group may be linear, branched, or cyclic and is preferably linear or branched.

The number of carbon atoms in the aryl group is preferably 6 to 30, more preferably 6 to 20, and still more preferably 6 to 12.

An alkyl portion of the aralkyl group is the same as the above-described alkyl group. An aryl portion of the aralkyl group is the same as the above-described aryl group. The number of carbon atoms in the aralkyl group is preferably 7 to 40, more preferably 7 to 30, and still more preferably 7 to 25.

The heteroaryl group is preferably a monocycle or a fused ring composed of 2 to 8 rings, and more preferably a monocycle or a fused ring composed of 2 to 4 rings. The number of heteroatoms constituting the ring of the heteroaryl group is preferably 1 to 3. It is preferable that the heteroatoms constituting the ring of the heteroaryl group are a nitrogen atom, an oxygen atom, or a sulfur atom. It is preferable that the heteroaryl group is a 5- or 6-membered ring. The number of carbon atoms constituting the ring of the heteroaryl group is preferably 3 to 30, more preferably 3 to 18, and still more preferably 3 to 12.

The alkyl group, the alkenyl group, the alkynyl group, the aralkyl group, the aryl group, and the heteroaryl group may have a substituent or may be unsubstituted. Examples of the sub stituent include the above-described substituents.

Next, the group represented by Formula (A-1) which is represented by $A^1$ and $A^2$ will be described.

In Formula (A-1), $R^2$ represents an alkyl group, an alkenyl group, or an aralkyl group and preferably an alkyl group.

The number of carbon atoms in the alkyl group is preferably 1 to 30, more preferably 1 to 20, still more preferably 1 to 12, and still more preferably 2 to 8.

The number of carbon atoms in the alkenyl group is preferably 2 to 30, more preferably 2 to 20, and still more preferably 2 to 12.

The alkyl group and the alkenyl group may be linear, branched, or cyclic and is preferably linear or branched.

The number of carbon atoms in the aralkyl group is preferably 7 to 30 and more preferably 7 to 20.

In Formula (A-1), the nitrogen-containing heterocycle formed by $Z^1$ is preferably a 5- or 6-membered ring. In addition, the nitrogen-containing heterocycle is preferably a monocycle or a fused ring composed of 2 to 8 rings, more preferably a monocycle or a fused ring composed of 2 to 4 rings, and still more preferably a fused ring composed of 2 or 3 rings. In addition to a nitrogen atom, the nitrogen-containing heterocycle may include a sulfur atom. In addition, the nitrogen-containing heterocycle may have a substituent. Examples of the substituent include the above-described substituents.

The details of Formula (SQ) can be found in paragraphs "0020" to "0049" of JP2011-208101A, the content of which is incorporated herein by reference.

As shown below, cations in Formula (SQ) are present without being localized.

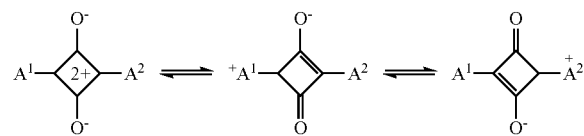

It is preferable that the squarylium compound is a compound represented by the following Formula (SQ-1).

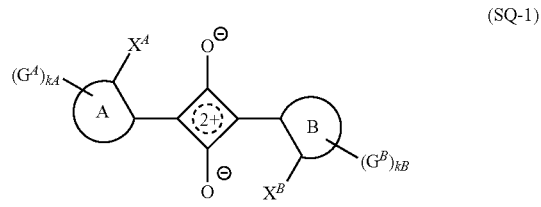

A ring A and a ring B each independently represent an aromatic ring.

$X^A$ and $X^B$ each independently represent a substituent.

$G^A$ and $G^B$ each independently represent a substituent.

kA represents an integer of 0 to $n_A$, and kB represents an integer of 0 to $n_B$.

$n_A$ and $n_B$ represent integers representing the maximum numbers of $G^A$'s and GB's which may be substituted in the ring A and the ring B, respectively.

$X^A$ and $G^A$, or $X^B$ and $G^B$ may be bonded to each other, and in a case where a plurality of $G^A$'s and a plurality of $G^B$'s are present, $G^A$'s and $G^B$'s may be bonded to each other to form ring structures, respectively.

Examples of the substituent represented by $G^A$ and $G^B$ include the substituents described above regarding the Formula (SQ).

Examples of the substituent represented by $X^A$ and $X^B$ include the substituents described above regarding Formula (SQ). Among these, a group having active hydrogen is preferable, —OH, —SH, —COOH, —SO$_3$H, —NR$^{X1}$R$^{X2}$, —NHCOR$^{X1}$, —CONR$^{X1}$R$^{X2}$, —NHCONR$^{X1}$R$^{X2}$, —NHCOOR$^{X1}$, —NHSO$_2$R$^{X1}$, —B(OH)$_2$, or —PO(OH)$_2$ is more preferable, and —OH, —SH, or —NR$^{X1}$R$^{X2}$ is still more preferable.

$R^{X1}$ and $R^{X1}$ each independently represent a hydrogen atom or a substituent. Examples of the substituent include an alkyl group, an alkenyl group, an alkynyl group, an aryl group, and a heteroaryl group. Among these, an alkyl group is preferable. The alkyl group is preferably linear or branched. The details of the alkyl group, the alkenyl group, the alkynyl group, the aryl group, and the heteroaryl group are the same as the ranges described regarding the sub stituents.

The ring A and the ring B each independently represent an aromatic ring. The aromatic ring may be a monocycle or a fused ring. Specific examples of the aromatic ring include a benzene ring, a naphthalene ring, a pentalene ring, an indene ring, an azulene ring, a heptalene ring, an indacene ring, a perylene ring, a pentacene ring, an acenaphthene ring, a phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, and a phenazine ring. Among these, a benzene ring or a naphthalene ring is preferable.

The aromatic ring may be unsubstituted or may have a substituent. Examples of the substituent include the substituents described above regarding the Formula (SQ).

$X^A$ and $G^A$, or $X^B$ and $G^B$ may be bonded to each other to form a ring, and in a case where a plurality of $G^A$'s and a plurality of $G^B$'s are present, $G^A$'s or $G^B$'s may be bonded to each other to form a ring. It is preferable that the ring is a 5- or 6-membered ring. The ring may be a monocycle or a fused ring. In a case where $X^A$ and $G^A$, $X^B$ and $G^B$, $G^A$'s, or $G^B$'s are bonded to each other to form a ring, the groups may be directly bonded to each other to form a ring, or may be bonded to each other to form a ring through a divalent linking group selected from the group consisting of an alkylene group, —CO—, —O—, —NH—, —BR—, and a combination thereof to form a ring. It is preferable that $X^A$ and $G^A$, $X^B$ and $G^B$, $G^A$'s, or $G^B$'s are bonded to each other through —BR— to form a ring. R represents a hydrogen atom or a substituent. Examples of the substituent include the substituents described above regarding Formula (SQ). Among these, an alkyl group or an aryl group is preferable.

kA represents an integer of 0 to $n_A$, kB represents an integer of 0 to $n_B$, $n_A$ represents an integer representing the maximum number of $G^A$'s which may be substituted in the ring A, and $n_B$ represents an integer representing the maximum number of $G^B$'s which may be substituted in the ring B. kA and kB each independently represent preferably an integer of 0 to 4, more preferably 0 to 2, and still more preferably 0 or 1.

Specific examples of the squarylium compound include the following compounds. Examples of the squarylium compound include a compound described in paragraphs "0044" to "0049" of JP2011-208101A, the content of which is incorporated herein by reference.

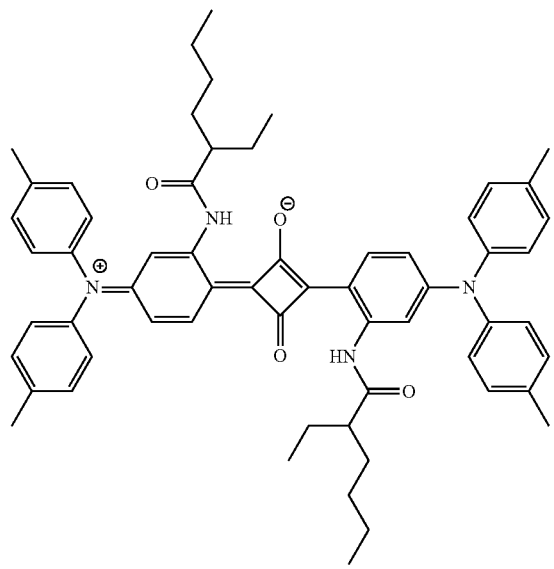 [SMILES: CCCCC(CC)C(=O)NC1=CC(=[N+](c2ccc(C)cc2)c2ccc(C)cc2)C=C/C1=C1\C(=O)C(c2ccc(N(c3ccc(C)cc3)c3ccc(C)cc3)cc2NC(=O)C(CC)CCCC)=C1[O-]]

As the cyanine compound, a compound represented by Formula (C) is preferable.

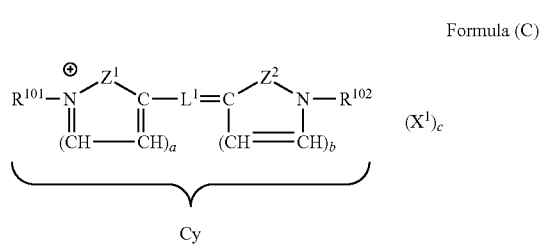

Formula (C)

In the formula, $Z^1$ and $Z^2$ each independently represent a non-metal atomic group for forming a 5- or 6-membered nitrogen-containing heterocycle which may be fused, $R^{101}$ and $R^{102}$ each independently represent an alkyl group, an alkenyl group, an alkynyl group, an aralkyl group, or an aryl group, $L^1$ represents a methine chain including an odd number of methine groups, a and b each independently represent 0 or 1, in a case where a represents 0, a carbon atom and a nitrogen atom are bonded through a double bond. In a case where b represents 0, a carbon atom and a nitrogen atom are bonded through a single bond, and in a case where a site represented by Cy in the formula is a cation site, $X^1$ represents an anion, and c represents the number of $X^1$'s for balancing charge. In a case where a site represented by Cy in the formula is an anion site, $X^1$ represents a cation, and c represents the number of $X^1$'s for balancing charge. In a case where charge of a site represented by Cy in the formula is neutralized in a molecule, c represents 0.

In Formula (C), $Z^1$ and $Z^2$ each independently represent a non-metal atomic group for forming a 5- or 6-membered nitrogen-containing heterocycle which may be fused. Another heterocycle, an aromatic ring, or an aliphatic ring may be fused to the nitrogen-containing heterocycle. It is preferable that the nitrogen-containing heterocycle is a 5-membered ring. A structure in which a benzene ring or a naphthalene ring is fused to the 5-membered nitrogen-containing heterocycle is more preferable. Specific examples of the nitrogen-containing heterocycle include an oxazole ring, an isoxazole ring, a benzoxazole ring, a naphthoxazole ring, an oxazolocarbazole ring, an oxazolodibenzofuran ring, a thiazole ring, a benzothiazole ring, a naphthothiazole ring, an indolenine ring, a benzoindolenine ring, an imidazole ring, a benzimidazole ring, a naphthoimidazole ring, a quinoline ring, a pyridine ring, a pyrrolopyridine ring, a furopyrrole ring, an indolizine ring, an imidazoquinoxaline ring, and a quinoxaline ring. Among these, a quinoline ring, an indolenine ring, a benzoindolenine ring, a benzoxazole ring, a benzothiazole ring, or a benzimidazole ring is preferable, and an indolenine ring, a benzothiazole ring, or a benzimidazole ring is more preferable. The nitrogen-containing heterocycle and a ring fused thereto may have a substituent. Examples of the substituent include the substituents described above regarding Formula (SQ).

In Formula (C), $R^{101}$ and $R^{102}$ each independently represent an alkyl group, an alkenyl group, an alkynyl group, an aralkyl group, or an aryl group. Preferable ranges of the above-described groups are the same as that described regarding the Formula (SQ). The alkyl group, the alkenyl group, the alkynyl group, the aralkyl group, and the aryl group may have a substituent or may be unsubstituted. Examples of the substituent include the substituents described above regarding Formula (SQ).

In Formula (C), $L^1$ represents a methine chain including an odd number of methine groups. It is preferable that $L^1$ represents a methine chain including 3, 5, or 7 methine groups.

The methine group may have a substituent. It is preferable that the methine group having a substituent is a methine group positioned at the center (meso position). Specific examples of the substituent include the substituent described regarding the Formula (SQ) and a group represented by Formula (a). In addition, two substituents in the methine chain may be bonded to each other to form a 5- or 6-membered ring.

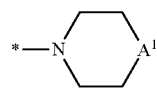

(a)

In Formula (a), * represents a linking portion to the methine chain, and $A^1$ represents —O—.

In Formula (C), a and b each independently represent 0 or 1. In a case where a represents 0, a carbon atom and a nitrogen atom are bonded through a double bond. In a case where b represents 0, a carbon atom and a nitrogen atom are bonded through a single bond. It is preferable that both a and b represent 0. In a case where both a and b represent 0, Formula (C) will be shown below.

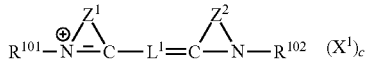

In a case where a site represented by Cy in Formula (C) is a cation site, $X^1$ represents an anion, and c represents the number of $X^1$'s for balancing charge. Examples of the anion include an halide ion ($Cl^{31}$, $Br^-$, or $I^-$), a p-toluenesulfonate ion, an ethyl sulfate ion, $PF_6^-$, $BF_4^-$ $ClO_4^-$, a tris(halogenoalkylsulfonyl)methide anion (for example, $(CF_3SO_2)_3C^-$), a di(halogenoalkylsulfonyl)imide anion (for example, $(CF_3SO_2)_2N^-$), and a tetracyanoborate anion.

In a case where a site represented by Cy in Formula (C) is an anion site, $X^1$ represents a cation, and c represents the number of $X^1$'s for balancing charge. Examples of the cation include an alkali metal ion (for example, $Li^+$, $Na^+$, or $K^+$), an alkali earth metal ion ($Mg^{2+}$, $Ca^{2+}$, $Ba^{2+}$, or $Sr^{2+}$), a transition metal ion (for example, $Ag^+$, $Fe^{2+}$, $C^{2+}$, $Ni^{2+}$, $Cu^{2+}$, or $Zn^{2+}$), other metal ions (for example, $Al^{3+}$), an ammonium ion, a triethylammonium ion, a tributylammonium ion, a pyridinium ion, a tetrabutylammonium ion, a guanidinium ion, a tetramethylguanidinium ion, and a diazabicycloundecenium ion. As the cation, $Na^+$, $K^+$, $Mg^{2+}$, $Ca^{2+}$, $Zn^{2+}$, or a diazabicycloundecenium ion is preferable.

In a case where charge of a site represented by Cy in Formula (C) is neutralized in a molecule, $X^1$ is not present. That is, c represents 0.

It is preferable that the cyanine compound is a compound represented by any one of the following Formulae (C-1) to (C-3).

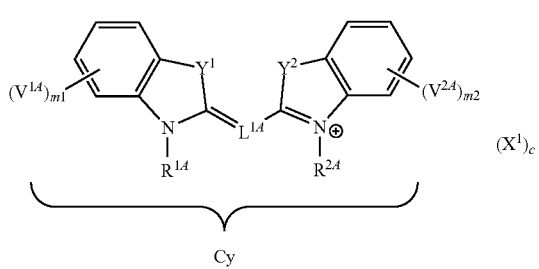

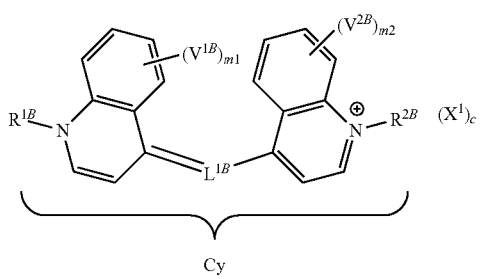

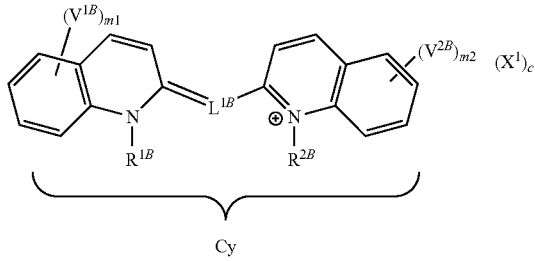

In the formulae, $R^{1A}$, $R^{2A}$, $R^{1B}$, and $R^{2B}$ each independently represent an alkyl group, an alkenyl group, an alkynyl group, an aralkyl group, or an aryl group.

$L^{1A}$ and $L^{1B}$ each independently represent a methine chain including an odd number of methine groups.

$Y^1$ and $Y^2$ each independently represent —S—, —O—, —$NR^{X1}$— or, —$CR^{X2}R^{X3}$—.

$R^{X1}$, $R^{X2}$, and $R^{X3}$ each independently represent a hydrogen atom or an alkyl group.

$V^{1A}$, $V^{2A}$, $V^{1B}$ and $V^{2B}$ each independently represent a substituent.

m1 and m2 each independently represent 0 to 4.

In a case where a site represented by Cy in the formula is a cation site, $X^1$ represents an anion, and c represents the number of $X^1$'s for balancing charge. In a case where a site represented by Cy in the formula is an anion site, $X^1$ represents a cation, and c represents the number of $X^1$'s for balancing charge. In a case where charge of a site represented by Cy in the formula is neutralized in a molecule, $X^1$ is not present.

The groups represented by $R^{1A}$, $R^{2A}$, and $R^{2B}$ have the same definitions and the same preferable ranges as those of the alkyl group, the alkenyl group, the alkynyl group, the aralkyl group, and the aryl group described regarding $R^{101}$ and $R^{102}$ of Formula (C).

$Y^1$ and $Y^2$ each independently represent —S—, —O—, —$NR^{X1}$— or, —$CR^{X2}R^{X3}$- and preferably —$NR^{X1}$—, —$R^{X2}$, and $R^{X3}$ each independently represent a hydrogen atom or an alkyl group and preferably an alkyl group. The number of carbon atoms in the alkyl group is preferably 1 to 10, more preferably 1 to 5, and still more preferably 1 to 3. The alkyl group may be linear, branched, or cyclic and is preferably linear or branched and more preferably linear. The alkyl group is still more preferably a methyl group or an ethyl group.

$L^{1A}$ and $L^{1B}$ have the same definitions and the same preferable ranges as those of $L^1$ in Formula (C).

Examples of the substituent represented by $V^{1A}$, $V^{2A}$, $V^{1B}$, and $V^{2B}$ include the substituents described regarding Formula (SQ).

m1 and m2 each independently represent 0 to 4 and preferably 0 to 2.

The anion and the cation represented by X1 have the same range and definitions and the same preferable ranges as those described regarding $X^1$ in Formula (C).

Specific examples of the cyanine compound include the following compounds. In addition, examples of the cyanine compound include a compound described in paragraphs "0044" and "0045" of JP2009-108267A, a compound described in paragraphs "0026" to "0030" of JP2002-194040, a compound described in JP2015-172004A, and a compound described in JP2015-172102A, the contents of which are incorporated herein by reference.

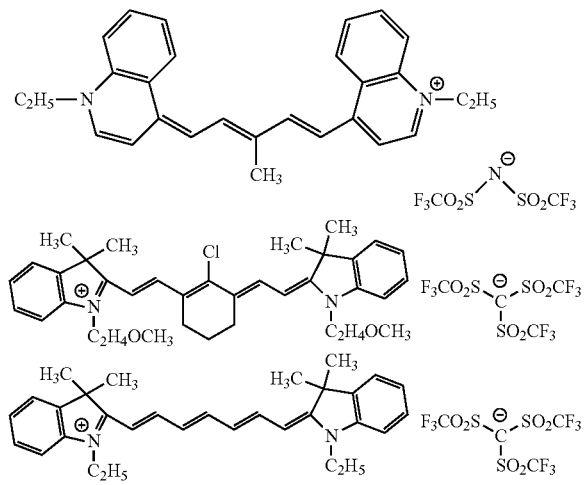

In the present invention, as the near infrared absorbing colorant, a commercially available product can also be used. Examples of the commercially available product include SDO-C33 (manufactured by Arimoto Chemical Co., Ltd.); EXCOLOR IR-14, EXCOLOR IR-10A, EXCOLOR TX-EX-801B, and EXCOLOR TX-EX-805K (manufactured by Nippon Shokubai Co., Ltd.); Shigenox NIA-8041, Shigenox NIA-8042, Shigenox NIA-814, Shigenox NIA-820, and Shigenox NIA-839 (manufactured by Hakkol Chemical Co., Ltd.); Epolite V-63, Epolight 3801, and Epolight3036 (manufactured by Epolin Inc.); PRO-JET 825LDI (manufactured by Fujifilm Corporation); NK-3027 and NK-5060 (manufactured by Hayashibara Co., Ltd.); and YKR-3070 (manufactured by Mitsui Chemicals, Inc.).

In the laminate according to the embodiment of the present invention, the near infrared light absorbing layer has a maximum absorption wavelength more preferably in a wavelength range of 700 to 1300 nm and still more preferably in a wavelength range of 700 to 1000 nm. In addition, a ratio $A^1/A^2$ of an absorbance $A^1$ at a wavelength of 500 nm to an absorbance $A^2$ at the maximum absorption wavelength is preferably 0.08 or lower and more preferably 0.04 or lower. It is preferable that the near infrared light absorbing layer satisfies at least one of the following conditions (1) to (4), it is more preferable that the near infrared light absorbing layer satisfies all the following conditions (1) to (4).

(1) A light transmittance at a wavelength of 400 nm is preferably 70% or higher, more preferably 80% or higher, still more preferably 85% or higher, and still more preferably 90% or higher (2) A light transmittance at a wavelength of 500 nm is preferably 70% or higher, more preferably 80% or higher, still more preferably 90% or higher, and still more preferably 95% or higher (3) A light transmittance at a wavelength of 600 nm is preferably 70% or higher, more preferably 80% or higher, still more preferably 90% or higher, and still more preferably 95% or higher (4) A light transmittance at a wavelength of 650 nm is preferably 70% or higher, more preferably 80% or higher, still more preferably 90% or higher, and still more preferably 95% or higher In the laminate according to the embodiment of the present invention, a transmittance of the near infrared light absorbing layer in the entire wavelength range of 400 to 650 nm is preferably 70% or higher, more preferably 80% or higher, and still more preferably 90% or higher. In addition, a transmittance at at least one point in a wavelength range of 700 to 1000 nm is preferably 20% or lower.

In the laminate according to the embodiment of the present invention, the thickness of the near infrared light absorbing layer is preferably 20 µm or less, more preferably 10 µm or less, and still more preferably 5 µm or less. For example, the lower limit is preferably 0.1 µm or more, more preferably 0.2 µm or more, and still more preferably 0.3 µm or more.

In the laminate according to the embodiment of the present invention, the chromatic colorant included in the color filter layer may be a pigment or a dye. From the viewpoint of heat resistance, it is preferable that the chromatic colorant is a pigment. It is preferable that the pigment is an organic pigment. Examples of the organic pigment are as follows:

Color Index (C.I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214 (all of which are yellow pigments);

C.I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279 (all of which are red pigments);

C.I. Pigment Green 7, 10, 36, 37, 58, and 59 (all of which are green pigments);

C.I. Pigment Violet 1, 19, 23, 27, 32, 37, and 42 (all of which are violet pigments); and C.I. Pigment Blue 1, 2, 15, 15:1, 15:2, 15:3, 15:4, 15:6, 16, 22, 60, 64, 66, 79, and 80 (all of which are blue pigments).

Among these organic pigments, one of the organic pigments may be used alone, or two or more of these organic pigments may be used in combination.

As the dye, well-known dyes can be used without any particular limitation. In terms of a chemical structure, a dye such as a pyrazole azo dye, an anilino azo dye, a triarylmethane dye, an anthraquinone dye, an anthrapyridone dye, a benzylidene dye, an oxonol dye, a pyrazolotriazole azo dye, a pyridone azo dye, a cyanine dye, a phenothiazine dye, a pyrrolopyrazole azomethine dye, a xanthene dye, a phthalocyanine dye, a benzopyran dye, an indigo dye, or a pyrromethene dye can be used. In addition, a polymer of the above-described dyes may be used. In addition, dyes described in JP2015-028144A and JP2015-034966A can also be used.

In the laminate according to the embodiment of the present invention, it is preferable that the color filter layer includes colored pixels of multiple colors. Examples of the colored pixels include pixels that exhibit colors such as red, green, blue, yellow, cyan, magenta, or white. In addition, in a case where the color filter layer includes colored pixels of multiple colors, in each of the colored pixels, the content of the colorant compound to which the specific acid group is bonded is preferably 0.1 to 99.9 mass % with respect to the total mass of the compound having a colorant skeleton. The lower limit is preferably 1 mass % or higher, more preferably 3 mass % or higher, and still more preferably 5 mass % or higher. The upper limit is preferably 99 mass % or lower, more preferably 60 mass % or lower, and still more preferably 50 mass % or lower. In addition, in each of the colored pixels of the color filter layer, the content of a compound in which an amino group is bonded to a colorant skeleton is preferably 3 mass % or lower, more preferably 1 mass % or higher, still more preferably 0.1 mass % or lower, and still more preferably 0% with respect to the total mass of the compounds having a colorant skeleton.

In the laminate according to the embodiment of the present invention, the thickness of the color filter layer is preferably 20 μm or less, more preferably 10 μm or less, and still more preferably 5 μm or less. For example, the lower limit is preferably 0.1 μm or more, more preferably 0.2 μm or more, and still more preferably 0.3 μm or more.

The laminate according to the embodiment of the present invention may further comprise an oxygen barrier film that is formed on a laminate including the near infrared light absorbing layer and the color filter layer. As described above, according to the present invention, even in a case where an oxygen barrier film is further formed on the laminate including the near infrared light absorbing layer and the color filter layer, a variation in the spectral characteristics of the near infrared light absorbing layer can be sufficiently suppressed. In addition, by providing the oxygen barrier film, a spectral variation of the color filter after a light fastness test can also be suppressed.

In a case where the laminate according to the embodiment of the present invention further includes the oxygen barrier film, the oxygen barrier film may be in contact with the laminate including the near infrared light absorbing layer and the color filter layer, or another layer may be interposed between the oxygen barrier film and the laminate. Examples of the other layer include a planarizing layer and a lens material. From the viewpoint of suppressing antireflection between an air layer and the lens material, it is preferable that the oxygen barrier film is arranged on the outermost layer of the laminate.

The oxygen barrier film can be formed using an inorganic material such as $SiO_2$, SiN, $Al_2O_3$, CaO, $Fe_2O_3$, MgO, $Ga_2O$, $ZrO_2$, $TiO_2$, or $CaF_2$, an alkoxy group-containing compound such as tetraethoxysilane, tetraethyl orthotitanate, tetramethoxysilane, ethyltriethoxysilane, or methyl trimethoxysilane, an organic polymer, or the like. Examples of the organic polymer include polyvinyl alcohol (PVA), polyvinyl pyrrolidone, a polyacrylamide, a water-soluble polyamide, a water-soluble salt of polyacrylic acid, a polymer of polyvinyl ether and maleic acid anhydride, an ethylene oxide polymer, a cellulose of a water-soluble salt such as ethyl cellulose, hydroxyethyl cellulose, or carboxyethyl cellulose, gum Arabic, an alkoxysilane group-containing polymer, and a mixture of two or more thereof.

The thickness of the oxygen barrier film is preferably 10 μm or less, more preferably 5 μm or less, and still more preferably 1 μm or less. The lower limit value of the thickness of the oxygen barrier film is not particularly limited and may be, for example, 0.05 μm or more.

The oxygen permeability of the oxygen barrier film is preferably 200 ml/m²·day·atm or lower, more preferably 150 ml/m²·day·atm or lower, and still more preferably 100 ml/m²·day·atm or lower. The lower limit is not particularly limited and is preferably 0 ml/m²·day·atm. The oxygen permeability of the oxygen barrier film can be measured, for example, as follows. As an oxygen electrode, Model 3600 (manufactured by Orbisphere Laboratories Japan Ink Co., Ltd.) is used. As an electrode separator, polyfluoroalkoxy (PFA) 2956A is used. Silicone series (SH111, manufactured by Dow Corning Corporation) is applied to the electrode separator at a thin thickness, and a thin film material to be measured is attached thereto to measure an oxygen concentration value. It was verified that the coating film of Silicone series does not affect the oxygen transmission rate. Next, the oxygen transmission rate (ml/m²·day·atm) is converted from the oxygen concentration value.

The details of the oxygen barrier film can be found in paragraphs "0153" to "0162" of JP2014-089408A, the content of which is incorporated herein by reference.

The laminate according to the embodiment of the present invention may further include, for example, a layer containing copper, a dielectric multi-layer film, or an ultraviolet absorbing layer. By the laminate according to the embodiment of the present invention further including the layer containing copper and/or the dielectric multi-layer film, an optical filter having a wide viewing angle and excellent infrared shielding properties is likely to be obtained. In addition, by including the ultraviolet absorbing layer, the laminate according to the embodiment of the present invention can function as an optical filter having excellent ultraviolet shielding properties. The details of the ultraviolet absorbing layer can be found in, for example, the description of an absorbing layer described in paragraphs "0040" to "0070" and paragraphs "0119" to "0145" of WO2015/099060A, the content of which is incorporated herein by reference. The details of the dielectric multi-layer film can be found in paragraphs "0255" to "0259" of JP2014-041318A, the content of which is incorporated herein by reference. As the layer containing copper, a glass substrate (copper-containing glass substrate) formed of glass containing copper, or a layer (copper complex-containing layer) containing a copper complex may also be used. Examples of the copper-containing glass substrate include a phosphate glass including copper and a fluorophosphate glass including copper. Examples of a commercially available product of the copper-containing glass include NF-50 (manufactured by AGC Techno Glass Co., Ltd.), BG-60 and BG-61 (both of which are manufactured by Schott AG), and CD5000 (manufactured by Hoya Corporation).

<Kit>

Next, a kit according to the embodiment of the present invention will be described.

The kit according to the embodiment of the present invention is used for manufacturing the laminate according to the embodiment of the present invention, the kit comprising:

a near infrared light absorbing layer-forming composition that includes a near infrared absorbing colorant; and a color filter layer-forming composition that includes a chromatic colorant, in which in at least one of the near infrared light absorbing layer-forming composition or the color filter layer-forming composition, a content of a compound in which an acid group selected from a sulfo group, a phosphate group, or a carboxyl group is bonded to a colorant skeleton is 0.1 to 99.9 mass % with respect to a total mass of compounds having a colorant skeleton.

In the kit according to the embodiment of the present invention, in the color filter layer-forming composition, the content of the colorant compound to which the specific acid group is bonded is preferably 0.1 to 99.9 mass % with respect to the total mass of the compound having a colorant skeleton. The lower limit is preferably 1 mass % or higher, more preferably 3 mass % or higher, and still more preferably 5 mass % or higher. The upper limit is preferably 99 mass % or lower, more preferably 60 mass % or lower, and still more preferably 50 mass % or lower. The chromatic colorant included in the color filter layer-forming composition is a pigment, and an aspect in which the color filter layer further includes the colorant compound to which the specific acid group is bonded in addition to the pigment is more preferable. In this aspect, the near infrared absorbing colorant included in the near infrared light absorbing layer-forming composition may be a pigment or a dye. However, in a case where the near infrared absorbing colorant is a dye, the effects of the present invention tend to be more significant. In a case where the near infrared absorbing colorant is a dye, the near infrared light absorbing layer-forming composition may include or may not include the colorant compound to which the specific acid group is bonded. However, it is preferable that the near infrared light absorbing layer-forming composition includes the above-described compound. In addition, in a case where the near infrared absorbing colorant is a pigment, it is preferable that the near infrared light absorbing layer-forming composition includes the colorant compound to which the specific acid group is bonded. In addition, in a case where the near infrared light absorbing layer-forming composition includes the colorant compound to which the specific acid group is bonded, the content of the colorant compound to which the specific acid group is bonded is preferably 0.1 to 99.9 mass % with respect to the total mass of the compound having a colorant skeleton. The lower limit is preferably 1 mass % or higher, more preferably 3 mass % or higher, and still more preferably 5 mass % or higher. The upper limit is preferably 99 mass % or lower, more preferably 60 mass % or lower, and still more preferably 50 mass % or lower.

Hereinafter, the near infrared light absorbing layer-forming composition and the color filter layer-forming composition will be described.

«Near Infrared Light Absorbing Layer-Forming Composition»

The near infrared light absorbing layer-forming composition includes the near infrared absorbing colorant. Examples of the near infrared absorbing colorant include the examples described above regarding the near infrared light absorbing layer.

In the near infrared light absorbing layer-forming composition, the content of the near infrared absorbing colorant is preferably 3 mass % or higher and more preferably 3 to 40 mass % with respect to the total solid content of the near infrared light absorbing layer-forming composition. The upper limit is preferably 35 mass % or lower, and more preferably 30 mass % or lower. The lower limit is preferably 4 mass % or higher and more preferably 5 mass % or higher. The near infrared absorbing colorants may be used alone, or two or more of the near infrared absorbing colorants may be used. In a case where two or more near infrared absorbing colorants are used in combination, it is preferable that the total content of the two or more near infrared absorbing colorants is in the above-described range.

In addition, in the near infrared light absorbing layer-forming composition, the content of the colorant compound to which the specific acid group is bonded is preferably 0.1 to 99.9 mass % with respect to the total mass of the compound having a colorant skeleton. The lower limit is preferably 1 mass % or higher, more preferably 3 mass % or higher, and still more preferably 5 mass % or higher. The upper limit is preferably 99 mass % or lower, more preferably 60 mass % or lower, and still more preferably 50 mass % or lower. Here, examples of the compounds having a colorant skeleton in the near infrared light absorbing layer-forming composition include a near infrared absorbing colorant and a colorant derivative.

(Colorant Derivative)

The near infrared light absorbing layer-forming composition may further include a colorant derivative. Examples of the colorant derivative include a compound in which a portion of a pigment is substituted with an acid group, a basic group, a group having a salt structure, or a phthalimidomethyl group, and it is preferable that the portion of the colorant is a compound substituted with an acid group (hereinafter, also referred to as "acidic colorant derivative"). As the acidic colorant derivative, the compound represented by Formula (B1) is preferable. Examples of the acid group include a sulfo group, a phosphate group, and a carboxyl group. Among these, a sulfo group or a carboxyl group is preferable, and a sulfo group is more preferable. In addition, it is also preferable that the colorant derivative used in the near infrared light absorbing layer-forming composition is a compound including a near infrared absorbing colorant and a common colorant skeleton. According to this aspect, the colorant derivative is likely to be adsorbed to the near infrared absorbing colorant, and the dispersibility of the near infrared absorbing colorant in the composition can be improved. For example, in a case where a pyrrolopyrrole compound is used as the near infrared absorbing colorant, it is preferable that the colorant derivative is a compound having a pyrrolopyrrole colorant skeleton.

In a case where the near infrared light absorbing layer-forming composition includes a colorant derivative, the content of the colorant derivative is preferably 1 to 50 parts by mass with respect to 100 parts by mass of the near infrared absorbing colorant. The lower limit value is preferably 3 parts by mass or more and more preferably 5 parts by mass or more. The upper limit value is preferably 40 parts by mass or less and more preferably 30 parts by mass or less. In a case where the content of the colorant derivative is in the above-described range, the dispersibility of the near infrared absorbing colorant can be improved, and the aggregation of the near infrared absorbing colorant can be efficiently suppressed. In addition, the content of the acidic colorant derivative is preferably 1 to 50 parts by mass with respect to 100 parts by mass of the near infrared absorbing colorant. The lower limit value is preferably 3 parts by mass or more and more preferably 5 parts by mass or more. The upper limit value is preferably 40 parts by mass or less and more preferably 30 parts by mass or less. In addition, it is preferable that the colorant derivative included in the near infrared light absorbing layer-forming composition substantially consists of only the acidic colorant derivative. The colorant derivative included in the near infrared light absorbing layer-forming composition substantially consists of only the acidic colorant derivative, the content of the acidic colorant derivative is preferably 99 mass % or higher and more preferably 99.9 mass % or higher with respect to the total mass of the colorant derivatives, and it is still more preferable that the colorant derivative consists of only the acidic colorant derivative.

In a case where the near infrared light absorbing layer-forming composition includes an acidic colorant derivative, the content of the acidic colorant derivative is preferably 0.1 to 99.9 mass % with respect to the total mass of the compound having a colorant skeleton. The lower limit is preferably 1 mass % or higher, more preferably 3 mass % or higher, and still more preferably 5 mass % or higher. The upper limit is preferably 99 mass % or lower, more preferably 60 mass % or lower, and still more preferably 50 mass % or lower. In the near infrared light absorbing layer-forming composition, only one colorant derivative may be used alone, or two or more colorant derivatives may be used. In a case where two or more colorant derivatives are used in combination, it is preferable that the total content of the two or colorant derivatives is in the above-described range.

(Other Near Infrared Absorber)

The near infrared light absorbing layer-forming composition may further include a near infrared absorber other than the near infrared absorbing colorant (also referred to as "the other near infrared absorber"). Examples of the other near infrared absorber include an inorganic pigment (inorganic particles). The shape of the inorganic pigment is not particularly limited and may have a sheet shape, a wire shape, or a tube shape irrespective of whether or not the shape is spherical or non-spherical. As the inorganic pigment, metal oxide particles or metal particles are preferable. Examples of the metal oxide particles include indium tin oxide (ITO) particles, antimony tin oxide (ATO) particles, zinc oxide (ZnO) particles, Al-doped zinc oxide (Al-doped ZnO) particles, fluorine-doped tin dioxide (F-doped $SnO_2$) particles, and niobium-doped titanium dioxide (Nb-doped $TiO_2$) particles. Examples of the metal particles include silver (Ag) particles, gold (Au) particles, copper (Cu) particles, and nickel (Ni) particles. In addition, as the inorganic pigment, a tungsten oxide compound can also be used. As the tungsten oxide compound, cesium tungsten oxide is preferable. The details of the tungsten oxide compound can be found in paragraph "0080" of JP2016-006476A, the content of which is incorporated herein by reference.

In a case where the near infrared light absorbing layer-forming composition includes the other near infrared absorber, the content of the other near infrared absorber is preferably 0.01 to 50 mass % with respect to the total solid content of the near infrared light absorbing layer-forming composition. The lower limit is preferably 0.1 mass % or higher and more preferably 0.5 mass % or higher. The upper limit is preferably 30 mass % or lower, and more preferably 15 mass % or lower.

In addition, the content of the other near infrared absorber is preferably 1 to 99 mass % with respect to the total mass of the near infrared absorbing colorant and the other near infrared absorber. The upper limit is preferably 80 mass % or lower, more preferably 50 mass % or lower, and still more preferably 30 mass % or lower.

In addition, it is also preferable that the near infrared light absorbing layer-forming composition does not substantially include the other near infrared absorber. Substantially not including the other near infrared absorber represents that the content of the other near infrared absorber is preferably 0.5 mass % or lower, more preferably 0.1 mass % or lower, and still more preferably 0 mass % with respect to the total mass of the near infrared absorbing colorant and the other near infrared absorber.

(Polymerizable Compound)

It is preferable that the near infrared light absorbing layer-forming composition includes a polymerizable compound. As the polymerizable compound, a compound that is polymerizable by the action of a radical is preferable. That is, it is preferable that the polymerizable compound is a radically polymerizable compound. As the polymerizable compound, a compound having one or more groups having an ethylenically unsaturated bond is preferable, a compound having two or more groups having an ethylenically unsaturated bond is more preferable, and a compound having three or more groups having an ethylenically unsaturated bond is still more preferable. The upper limit of the number of the groups having an ethylenically unsaturated bond is, for example, preferably 15 or less and more preferably 6 or less. Examples of the group having an ethylenically unsaturated bond include a vinyl group, a styryl group, a (meth)allyl group, and a (meth)acryloyl group. Among these, a (meth) acryloyl group is preferable. The polymerizable compound is preferably a (meth)acrylate compound having 3 to 15 functional groups and more preferably a (meth)acrylate compound having 3 to 6 functional groups.

The polymerizable compound may be in the form of a monomer or a polymer and is preferably a monomer. The molecular weight of the monomer type polymerizable compound is preferably 100 to 3,000. The upper limit is more preferably 2,000 or lower and still more preferably 1,500 or lower. The lower limit is more preferably 150 or higher and still more preferably 250 or higher. In addition, it is preferable that the polymerizable compound is a compound substantially not having a molecular weight distribution. Here, as the compound substantially not having a molecular weight distribution, a compound having a dispersity (weight-average molecular weight (Mw)/number-average molecular weight (Mn)) of 1.0 to 1.5 is preferable, and a compound having a dispersity 1.0 to 1.3 is more preferable.

Examples of the polymerizable compound can be found in paragraphs "0033" and "0034" of JP2013-253224A, the content of which is incorporated herein by reference. As the polymerizable compound, ethyleneoxy-modified pentaerythritol tetraacrylate (as a commercially available product, NK ESTER ATM-35E manufactured by Shin-Nakamura Chemical Co., Ltd.), dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth)acrylate (as a commercially available product, KAYARAD D-310 manufactured by Nippon Kayaku Co., Ltd.), dipentaerythritol hexa(meth)acrylate (as a commercially available product, KAYARAD DPHA manufactured by Nippon Kayaku Co., Ltd., A-DPH-12E, manufactured by Shin-Nakamura Chemical Co., Ltd.), or a compound having a structure in which the (meth)acryloyl group is bonded through an ethylene glycol residue and/or a propylene glycol residue is preferable. In addition, oligomers of the above-described examples can be used. For example, the details of the polymerizable compound can be found in paragraphs "0034" to "0038" of JP2013-253224A, the content of which is incorporated herein by reference. Examples of the compound having an ethylenically unsaturated bond include a polymerizable monomer in paragraph "0477" of JP2012-208494A (corresponding to paragraph "0585" of US2012/0235099A), the contents of which are incorporated herein by reference. In addition, diglycerin ethylene oxide (EO)-modified (meth)acrylate (as a commercially available product, M-460 manufactured by Toagosei Co., Ltd.), pentaerythritol tetraacrylate (A-TMMT manufactured by Shin-Nakamura Chemical Co., Ltd.), or 1,6-hexanediol diacrylate (KAYARAD HDDA manufactured by Nippon Kayaku Co., Ltd.) is also preferable. Oligomers of the above-described examples can be used. For examples, RP-1040 (manufactured by Nippon Kayaku Co., Ltd.) is used.

The polymerizable compound may have an acid group such as a carboxyl group, a sulfo group, or a phosphate group. Examples of a commercially available product of the polymerizable compound having an acid group include ARONIX M-305, M-510, and M-520 (manufactured by Toagosei Co., Ltd.). The acid value of the polymerizable compound having an acid group is preferably 0.1 to 40 mgKOH/g. The lower limit is more preferably 5 mgKOH/g or higher. The upper limit is more preferably 30 mgKOH/g or lower.

In addition, it is also preferable that the polymerizable compound is a compound having a caprolactone structure. The polymerizable compound having a caprolactone structure is not particularly limited as long as it has a caprolactone structure in the molecule thereof, and examples thereof include ε-caprolactone-modified polyfunctional (meth)acrylate obtained by esterification of a polyhydric alcohol, (meth)acrylic acid, and ε-caprolactone, the polyhydric alcohol being, for example, trimethylolethane, ditrimethylolethane, trimethylolpropane, ditrimethylolpropane, pentaerythritol, dipentaerythritol, tripentaerythritol, glycerin, diglycerol, or trimethylolmelamine. Examples of the polymerizable compound having a caprolactone structure can be found in paragraphs "0042" to "0045" of JP2013-253224A, the content of which is incorporated herein by reference. Examples of the polymerizable compound having a caprolactone structure include: DPCA-20, DPCA-30, DPCA-60, and DPCA-120 which are commercially available as KAYARADDPCA series manufactured by Nippon Kayaku Co., Ltd.; SR-494 (manufactured by Sartomer) which is a tetrafunctional acrylate having four ethyleneoxy chains; and TPA-330 which is a trifunctional acrylate having three isobutyleneoxy chains.

As the polymerizable compound, a urethane acrylate described in JP1973-041708B (JP-S48-041708B), JP1976-037193A (JP-S51-037193A), JP1990-032293B (JP-H2-032293B), or JP1990-016765B (JP-H2-016765B), or a urethane compound having an ethylene oxide skeleton described in JP1983-049860B (JP-S58-049860B), JP1981-017654B (JP-S56-017654B), JP1987-039417B (JP-S62-039417B), or JP1987-039418B (JP-S62-039418B) is also preferable. In addition, the compound which has a group having an ethylenically unsaturated bond can be obtained by using an addition-polymerizable compound having an amino structure or a sulfide structure in the molecules described in JP1988-277653A (JP-S63-277653A), JP1988-260909A (JP-S63-260909A), or JP1989-105238A (JP-H1-105238A). Examples of a commercially available product of the polymerizable compound include URETHANE OLIGOMER UAS-10 and UAB-140 (manufactured by Sanyo-Kokusaku Pulp Co., Ltd.), UA-7200 (manufactured by Shin-Nakamura Chemical Co., Ltd.), DPHA-40H (manufactured by Nippon Kayaku Co., Ltd.), UA-306H, UA-306T, UA-3061, AH-600, T-600 and AI-600 (manufactured by Kyoeisha Chemical Co., Ltd.), and 8UH-1006 and 8UH-1012 (manufactured by Taisei Fine Chemical Co., Ltd.).

The content of the polymerizable compound is preferably 0.1 to 40 mass % with respect to the total solid content of the near infrared light absorbing layer-forming composition. For example, the lower limit is preferably 0.5 mass % or higher and more preferably 1 mass % or higher. For example, the upper limit is more preferably 30 mass % or lower and still more preferably 20 mass % or lower. The polymerizable compound may be used alone, or two or more the polymerizable compounds may be used in combination. In a case where two or more polymerizable compounds are used in combination, it is preferable that the total content of the two or more polymerizable compounds is in the above-described range.

(Epoxy Compound)

The near infrared light absorbing layer-forming composition may include a compound having an epoxy group (hereinafter, also referred to as "epoxy compound"). Examples of the epoxy compound include a monofunctional or polyfunctional glycidyl ether compound, a polyfunctional aliphatic glycidyl ether compound, and a compound having an alicyclic epoxy group.

It is preferable that the epoxy compound is a compound having 1 to 100 epoxy groups in one molecule. The upper limit of the number of epoxy groups is, for example, 10 or less or 5 or less. The lower limit is preferably 2 or more.

The epoxy compound may be a low molecular weight compound (for example, molecular weight: lower than 1000) or a high molecular weight compound (macromolecule; for example, molecular weight: 1000 or higher, and in the case of a polymer, weight-average molecular weight: 1000 or higher). The weight-average molecular weight of the epoxy compound is preferably 2000 to 100000. The upper limit of the weight-average molecular weight is preferably 10000 or lower, more preferably 5000 or lower, and still more preferably 3000 or lower.

Examples of a commercially available product of the epoxy compound include EHPE 3150 (manufactured by Daicel Corporation), EPICLON N-695 (manufactured by DIC Corporation), and ADEKA GLYCILOL ED-505 (manufactured by Adeka Corporation). In addition, as the epoxy compound, compounds described in paragraphs "0034" to "0036" of JP2013-011869A, paragraphs "0147" to "0156" of JP2014-043556A, and paragraphs "0085" to "0092" of JP2014-089408A can also be used. The contents of this specification are incorporated herein by reference.

The content of the epoxy compound is preferably 0.1 to 40 mass % with respect to the total solid content of the near infrared light absorbing layer-forming composition. For example, the lower limit is more preferably 0.5 mass % or higher and still more preferably 1 mass % or higher. For example, the upper limit is more preferably 30 mass % or lower and still more preferably 20 mass % or lower. The near infrared light absorbing layer-forming composition may be used alone, or two or more the near infrared light absorbing layer-forming compositions may be used in combination. In a case where two or more near infrared light absorbing layer-forming compositions are used in combination, it is preferable that the total content of the two or more near infrared light absorbing layer-forming compositions is in the above-described range.

In addition, in a case where the near infrared light absorbing layer-forming composition includes the polymerizable compound and the epoxy compound, a mass ratio radically polymerizable compound:epoxy compound is preferably 100:1 to 100:400 and more preferably 100:1 to 100:100.

(Photopolymerization Initiator)

In a case where the near infrared light absorbing layer-forming composition includes the polymerizable compound, it is preferable that the near infrared light absorbing layer-forming composition further includes a photopolymerization initiator. As the photopolymerization initiator, a compound having photosensitivity to light in a range from an ultraviolet range to a visible range is preferable. It is preferable that the photopolymerization initiator is a photoradical polymerization initiator.

Examples of the photopolymerization initiator include a halogenated hydrocarbon derivative (for example, a compound having a triazine skeleton or a compound having an oxadiazole skeleton), an acylphosphine compound, a hexaarylbiimidazole, an oxime compound, an organic peroxide, a thio compound, a ketone compound, an aromatic onium salt, an α-hydroxyketone compound, and an α-aminoketone compound. In addition, from the viewpoint of exposure sensitivity, as the photoradical polymerization initiator, a trihalomethyltriazine compound, a benzyldimethylketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, or a 3-aryl-substituted coumarin compound is preferable, a compound selected from the group consisting of an oxime compound, an α-hydroxy ketone compound, an α-aminoketone compound, and an acylphosphine compound is more preferable, and an oxime compound is still more preferable. The details of the photopolymerization initiator can be found in paragraphs "0065" to "0111" of JP2014-130173A, the content of which is incorporated herein by reference.

Examples of a commercially available product of the α-hydroxyketone compound include IRGACURE-184, DAROCUR-1173, IRGACURE-500, IRGACURE-2959, and IRGACURE-127 (all of which are manufactured by BASF SE). Examples of a commercially available product of the α-aminoketone compound include IRGACURE-907, IRGACURE-369, IRGACURE-379, and IRGACURE-379EG (all of which are manufactured by BASF SE). Examples of a commercially available product of the acylphosphine compound include IRGACURE-819, and DAROCUR-TPO (all of which are manufactured by BASF SE).

As the oxime compound, a compound described in JP2001-233842A, a compound described in JP2000-080068A, a compound described in JP2006-342166A, or a compound described in JP2016-021012A can be used. Examples of the oxime compound which can be preferably used in the present invention include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy) iminobutane-2-one, and 2-ethoxycarbonyloxyimino-1-phenylpropane-1-one. In addition, examples of the oxime compound include a compound described in J.C.S. Perkin II (1979), pp. 1653-1660, J.C.S. Perkin II (1979), pp. 156-162 and Journal of Photopolymer Science and Technology (1995), pp. 202-232, JP2000-066385A, JP2000-080068A, JP2004-534797A, or JP2006-342166A. As a commercially available product of the oxime compound, IRGACURE-OXE01, IRGACURE-OXE02, IRGACURE-OXE03, or IRGACURE-OXE04 (all of which are manufactured by BASF SE) can also be preferably used. In addition, TR-PBG-304 (manufactured by Changzhou Tronly New Electronic Materials Co., Ltd.), ADEKA OPTOMER N-1919 (manufactured by Adeka Corporation, a photopolymerization initiator 2 described in JP2012-014052A) can also be used. As the oxime compound, a compound having no colorability or a compound having high transparency that is not likely to discolor other components can also be preferably used. Examples of a commercially available product of the oxime compound include ADEKA ARKLS NCI-730, NCI-831, and NCI-930 (all of which are manufactured by Adeka Corporation).

In the present invention, an oxime compound having a fluorene ring can also be used as the photopolymerization initiator. Specific examples of the oxime compound having a fluorene ring include a compound described in JP2014-137466A. The content of this specification is incorporated herein by reference.

In the present invention, an oxime compound having a fluorine atom can also be used as the photopolymerization initiator. Specific examples of the oxime compound having a fluorine atom include a compound described in JP2010-262028A, Compound 24 and 36 to 40 described in JP2014-500852A, and Compound (C-3) described in JP2013-164471A. The contents of this specification are incorporated herein by reference.

In the present invention, as the photopolymerization initiator, an oxime compound having a nitro group can be used. It is preferable that the oxime compound having a nitro group is a dimer. Specific examples of the oxime compound having a nitro group include a compound described in paragraphs "0031" to "0047" of JP2013-114249A and paragraphs "0008" to "0012" and "0070" to "0079" of JP2014-137466A, a compound described in paragraphs "0007" to "0025" of JP4223071B, and ADEKA ARKLS NCI-831 (manufactured by Adeka Corporation).

Specific examples of the oxime compound which are preferably used in the present invention are shown below, but the present invention is not limited thereto.

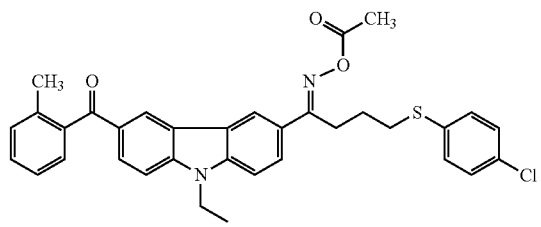

(C-1)

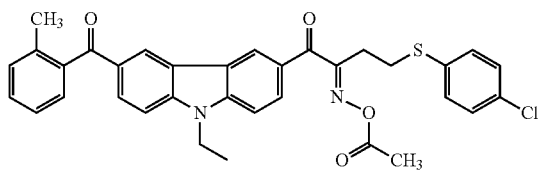

(C-2)

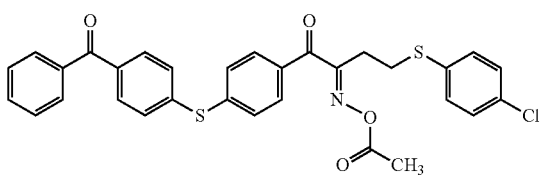

(C-3)

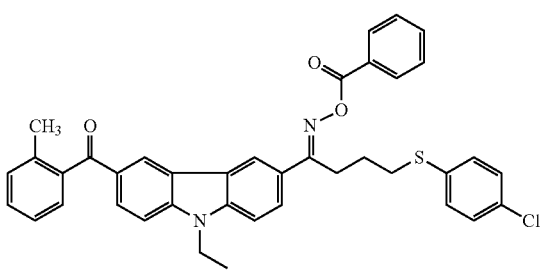

(C-4)

(C-5)
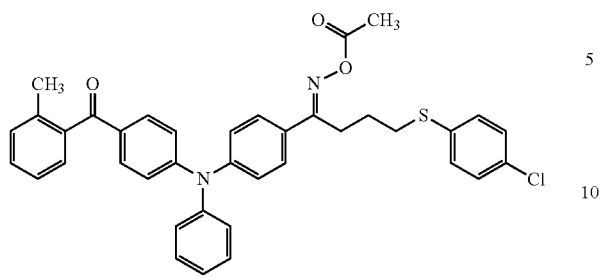
(C-6)
(C-7)
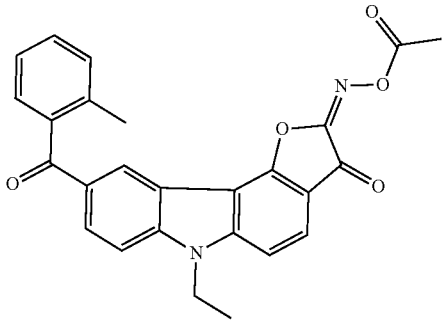
(C-8)
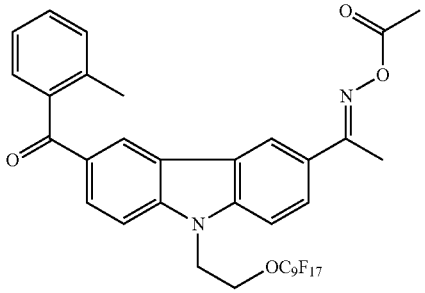
(C-9)
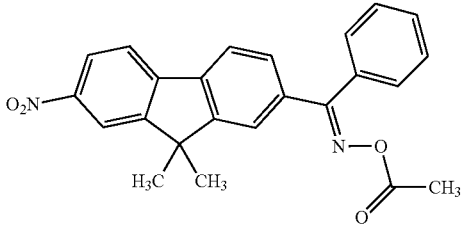
(C-10)
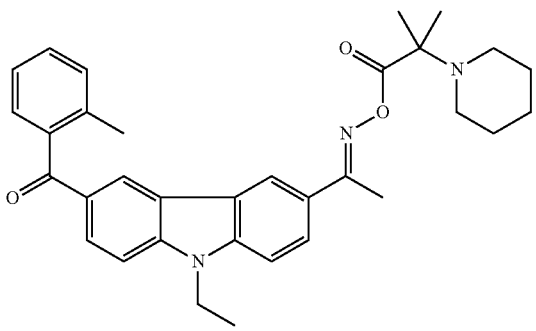
(C-11)
(C-12)
(C-13)
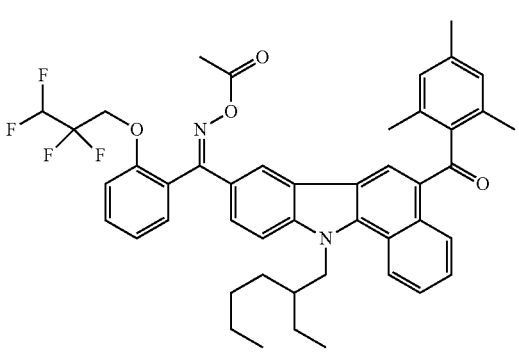
(C-14)
The oxime compound is preferably a compound having an absorption maximum in a wavelength range of 350 nm to 500 nm and more preferably a compound having an absorption maximum in a wavelength range of 360 nm to 480 nm. In addition, the oxime compound is preferably a compound having a high absorbance to light having a wavelength of 365 nm and 405 nm.

The molar absorption coefficient of the oxime compound at 365 nm or 405 nm is preferably 1000 to 300000, more preferably 2000 to 300000, and still more preferably 5000 to 200000 from the viewpoint of sensitivity.

The molar absorption coefficient of the compound can be measured using a well-known method. For example, it is preferable that the molar absorption coefficient can be measured using a spectrophotometer (Cary-5 spectrophotometer, manufactured by Varian Medical Systems, Inc.) and ethyl acetate as a solvent at a concentration of 0.01 g/L.

It is preferable that the photopolymerization initiator includes an oxime compound and an α-aminoketone compound. By using the oxime compound and the α-aminoketone compound in combination, the developability is improved, and a pattern having excellent rectangularity is likely to be formed. In a case where the oxime compound and the α-aminoketone compound are used in combination, the content of the α-aminoketone compound is preferably 50 to 600 parts by mass and more preferably 150 to 400 parts by mass with respect to 100 parts by mass of the oxime compound.

The content of the photopolymerization initiator is preferably 0.1 to 50 mass %, more preferably 0.5 to 30 mass %, and still more preferably 1 to 20 mass % with respect to the total solid content of the near infrared light absorbing layer-forming composition. In a case where the content of the photopolymerization initiator is in the above-described range, sensitivity and pattern formability are excellent. The near infrared light absorbing layer-forming composition may include one photopolymerization initiator or two or more photopolymerization initiators. In a case where the composition includes two or more photopolymerization initiators, it is preferable that the total content of the photopolymerization initiators is in the above-described range.

(Resin)

It is preferable that the near infrared light absorbing layer-forming composition includes a resin. The resin is added, for example, in order to disperse particles of the pigments and the like in the composition or to be added as a binder. The resin which is mainly used to disperse particles of the pigments and the like will also be called a dispersant. However, the above-described uses of the resin are merely exemplary, and the resin can be used for purposes other than the uses.

The weight-average molecular weight (Mw) of the resin is preferably 2000 to 2000000. The upper limit is preferably 1000000 or lower and more preferably 500000 or lower. The lower limit is preferably 3000 or higher and more preferably 5000 or higher.

Examples of the resin include a (meth)acrylic resin, an epoxy resin, an enethiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamide imide resin, a polyolefin resin, a cyclic olefin resin, a polyester resin, and a styrene resin. Among these resins, one of the resins may be used alone, or a mixture of two or more resins may be used. As the cyclic olefin resin, a norbornene resin can be preferably used from the viewpoint of improving heat resistance. Examples of a commercially available product of the norbornene resin include ARTON series (for example, ARTON F4520, manufactured by JSR Corporation). Examples of the epoxy resin include an epoxy resin which is a glycidyl-etherified product of a phenol compound, an epoxy resin which is a glycidyl-etherified product of various novolac resins, an alicyclic epoxy resin, an aliphatic epoxy resin, a heterocyclic epoxy resin, a glycidyl ester epoxy resin, a glycidyl amine epoxy resin, an epoxy resin which is a glycidylated product of a halogenated phenol, a condensate of a silicon compound having an epoxy group and another silicon compound, and a copolymer of a polymerizable unsaturated compound having an epoxy group and another polymerizable unsaturated compound. In addition, for example, as the epoxy resin, MARPROOF G-0150M, G-0105SA, G-0130SP, G-0250SP, G-1005S, G-1005SA, G-1010S, G-2050M, G-01100, or G-01758 (manufactured by NOF Corporation, an epoxy group-containing polymer) can also be used. In addition, as the resin, a resin described in Examples of WO2016/088645A can also be used. In addition, in a case where the resin includes an ethylenically unsaturated group, in particular, a (meth)acryloyl group at a side chain, it is preferable that a main chain and an ethylenically unsaturated group are bonded to each other through a divalent linking group having an alicyclic structure.

The resin used in the present invention may have an acid group. Examples of the acid group include a carboxyl group, a phosphate group, a sulfo group, and a phenolic hydroxy group. Among these, a carboxyl group is preferable. Among these acid groups, one of the acid groups may be used alone, or two or more of the acid groups may be used in combination. The resin having an acid group can also be used as an alkali-soluble resin.

As the resin having an acid group, a polymer having a carboxyl group at a side chain is preferable. Specific examples of the resin include an alkali-soluble phenol resin such as a methacrylic acid copolymer, an acrylic acid copolymer, an itaconic acid copolymer, a crotonic acid copolymer, a maleic acid copolymer, a partially esterified maleic acid copolymer, or a novolac resin, an acidic cellulose derivative having a carboxyl group at a side chain thereof, and a resin obtained by adding an acid anhydride to a polymer having a hydroxy group. In particular, a copolymer of (meth)acrylic acid and another monomer which is copolymerizable with the (meth)acrylic acid is preferable as the alkali-soluble resin. Examples of the monomer which is copolymerizable with the (meth)acrylic acid include an alkyl (meth)acrylate, an aryl (meth)acrylate, and a vinyl compound. Examples of the alkyl (meth)acrylate and the aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, and cyclohexyl (meth)acrylate. Examples of the vinyl compound include styrene, α-methylstyrene, vinyl toluene, glycidyl methacrylate, acrylonitrile, vinyl acetate, N-vinylpyrrolidone, tetrahydrofurfuryl methacrylate, a polystyrene macromonomer, and a polymethyl methacrylate macromonomer. Examples of other monomers include a N-position-substituted maleimide monomer described in JP1998-300922A (JP-H10-300922A) such as N-phenylmaleimide or N-cyclohexylmaleimide. Among these monomers which are copolymerizable with the (meth)acrylic acid, one of the monomers may be used alone, or two or more of the monomers may be used in combination.

The resin having an acid group may further have a polymerizable group. Examples of the polymerizable group include a (meth)allyl group and a (meth)acryloyl group.

Examples of a commercially available product of the resin include DIANAL NR series (manufactured by Mitsubishi Rayon Co., Ltd.), PHOTOMER 6173 (a carboxyl group-containing polyurethane acrylate oligomer; manufactured by Diamond Shamrock Co., Ltd.), VISCOAT R-264 and KS Resist 106 (both of which are manufactured by Osaka Organic Chemical Industry Ltd.), CYCLOMER P series (for example, ACA230AA) and PLAKCEL CF200 series (both of which manufactured by Daicel Corporation), EBECRYL 3800 (manufactured by Daicel-UCB Co., Ltd.), and ACRYCURE RD-F8 (manufactured by Nippon Shokubai Co., Ltd.).

As the resin having an acid group, a copolymer including benzyl (meth)acrylate and (meth)acrylic acid; a copolymer including benzyl (meth)acrylate, (meth)acrylic acid, and 2-hydroxyethyl (meth)acrylate; or a multi-component copolymer including benzyl (meth)acrylate, (meth)acrylic acid, and another monomer can be preferably used. In addition, copolymers described in JP1995-140654A (JP-H7-140654A) obtained by copolymerization of 2-hydroxyethyl (meth)acrylate can be preferably used, and examples thereof include: a copolymer including 2-hydroxypropyl (meth)acrylate, a polystyrene macromonomer, benzyl methacrylate, and methacrylic acid; a copolymer including 2-hydroxy-3-phenoxypropyl acrylate, a polymethyl methacrylate macromonomer, benzyl methacrylate, and methacrylic acid; a copolymer including 2-hydroxyethyl methacrylate, a polystyrene macromonomer, methyl methacrylate, and methacrylic acid; or a copolymer including 2-hydroxyethyl methacrylate, a polystyrene macromonomer, benzyl methacrylate, and methacrylic acid.

As the resin having an acid group, a polymer that includes a repeating unit derived from monomer components including a compound represented by the following Formula (ED1) and/or a compound represented by the following Formula (ED2) (hereinafter, these compounds will also be referred to as "ether dimer") is also preferable.

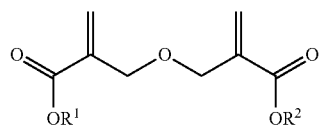

(ED1)

In Formula (ED1), $R^1$ and $R^2$ each independently represent a hydrogen atom or a hydrocarbon group having 1 to 25 carbon atoms which may have a substituent.

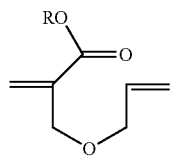

(ED2)

In Formula (ED2), R represents a hydrogen atom or an organic group having 1 to 30 carbon atoms. Specific examples of Formula (ED2) can be found in the description of JP2010-168539A.

Specific examples of the ether dimer can be found in paragraph "0317" of JP2013-029760A, the content of which is incorporated herein by reference. Among these ether dimers, one of the ether dimmers may be used alone, or two or more of the ether dimmers may be used in combination.

The resin having an acid group may include a repeating unit which is derived from a compound represented by the following Formula (X).

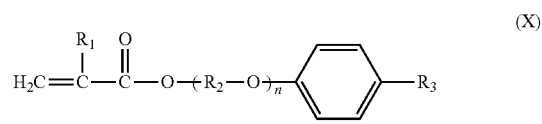

(X)

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms which may have a benzene ring. n represents an integer of 1 to 15.

The details of the resin having an acid group can be found in paragraphs "0558" to "0571" of JP2012-208494A (corresponding to paragraphs "0685" to "0700" of US2012/0235099A) and paragraphs "0076" to "0099" of JP2012-198408A, the contents of which are incorporated herein by reference. In addition, as the resin having an acid group, a commercially available product may also be used. Examples of the commercially available product include ACRYBASE FF-426 (manufactured by Fujikura Kasei Co., Ltd.).

The acid value of the resin having an acid group is preferably 30 to 200 mgKOH/g. The lower limit is preferably 50 mgKOH/g or higher and more preferably 70 mgKOH/g or higher. The upper limit is preferably 150 mgKOH/g or lower and more preferably 120 mgKOH/g or lower.

Examples of the resin having an acid group include resins having the following structures. In the following structural formulae, Me represents a methyl group.

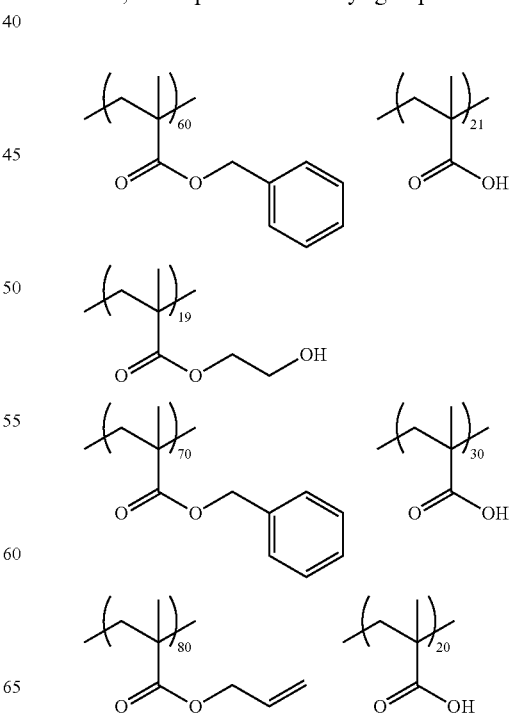

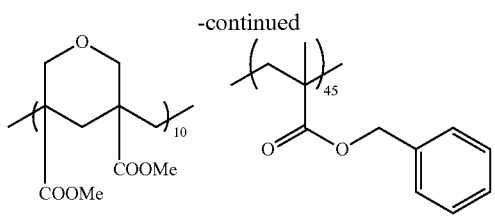

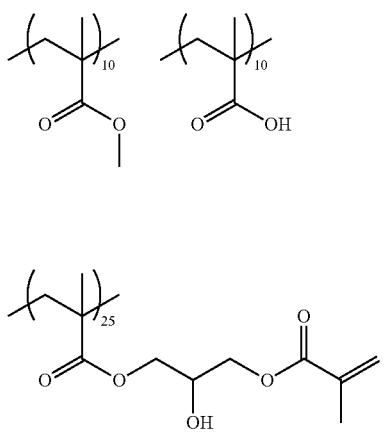

The near infrared light absorbing layer-forming composition may include a resin as a dispersant. In particular, in a case where a pigment is used, it is preferable that the composition includes a dispersant. Examples of the dispersant include an acidic dispersant (acidic resin) and a basic dispersant (basic resin). Here, the acidic dispersant (acidic resin) refers to a resin in which the amount of an acid group is more than the amount of a basic group. In a case where the sum of the amount of an acid group and the amount of a basic group in the acidic dispersant (acidic resin) is represented by 100 mol %, the amount of the acid group in the acidic resin is preferably 70 mol % or higher and more preferably substantially 100 mol %. The acid group in the acidic dispersant (acidic resin) is preferably a carboxyl group. An acid value of the acidic dispersant (acidic resin) is preferably 40 to 105 mgKOH/g, more preferably 50 to 105 mgKOH/g, and still more preferably 60 to 105 mgKOH/g. In addition, the basic dispersant (basic resin) refers to a resin in which the amount of a basic group is more than the amount of an acid group. In a case where the sum of the amount of an acid group and the amount of a basic group in the basic dispersant (basic resin) is represented by 100 mol %, the amount of the basic group in the basic resin is preferably higher than 50 mol %. The basic group in the basic dispersant is preferably an amino group.

It is preferable that the resin A used as the dispersant further includes a repeating unit having an acid group. By the resin, which is used as the dispersant, including the repeating unit having an acid group, in a case where a pattern is formed using a photolithography method, the amount of residues formed in an underlayer of a pixel can be reduced.

It is preferable that the resin used as the dispersant is a graft copolymer. Since the graft copolymer has affinity to the solvent due to the graft chain, the pigment dispersibility and the dispersion stability over time are excellent. The details of the graft copolymer can be found in the description of paragraphs "0025" to "0094" of JP2012-255128A, the content of which is incorporated herein by reference. In addition, specific examples of the graft copolymer include the following resins. The following resin may also be a resin having an acid group (alkali-soluble resin). In addition, other examples of the graft copolymer include resins described in paragraphs "0072" to "0094" of JP2012-255128A, the content of which is incorporated herein by reference.

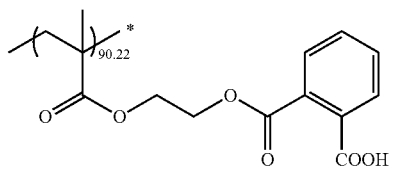

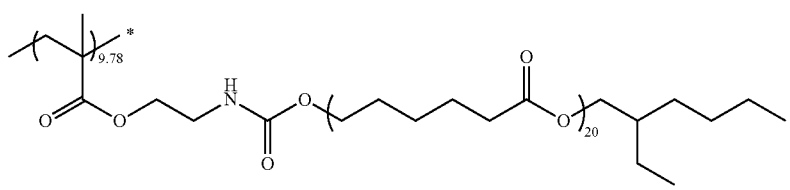

In addition, in the present invention, as the resin (dispersant), an oligoimine dispersant having a nitrogen atom at at least either a main chain or a side chain is also preferably used. As the oligoimine dispersant, a resin, which includes a structural unit having a partial structure X with a functional group (pKa: 14 or lower) and a side chain Y having 40 to 10,000 atoms and has a basic nitrogen atom at at least either a main chain or a side chain, is preferable. The basic nitrogen atom is not particularly limited as long as it is a nitrogen atom exhibiting basicity. The oligoimine dispersant can be found in the description of paragraphs "0102" to "0166" of JP2012-255128A, the content of which is incorporated herein by reference. Specific examples of the oligoimine dispersant are as follows. The following resin may also be a resin having an acid group (alkali-soluble resin). In addition, as the oligoimine dispersant, a resin described in paragraphs "0168" to "0174" of JP2012-255128A can be used.

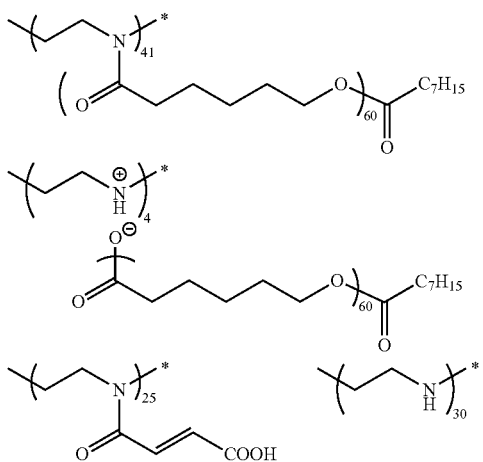

The dispersant is available as a commercially available product, and specific examples thereof include Disperbyk-111 (manufactured by BYK Chemie) and SOLSPERSE 76500 (manufactured by Lubrication Technology Inc.). In addition, a pigment dispersant described in paragraphs "0041" to "0130" of JP2014-130338A can also be used, the content of which is incorporated herein by reference. In addition, the resin having an acid group or the like can also be used as a dispersant.

The content of the resin is preferably 1 to 80 mass % with respect to the total solid content of the near infrared light absorbing layer-forming composition. The lower limit is preferably 5 mass % or higher and more preferably 7 mass % or higher. The upper limit is preferably 50 mass % or lower and more preferably 30 mass % or lower.

In addition, in a case where the curable composition includes a dispersant as the resin, the content of the dispersant is preferably 0.1 to 40 mass % with respect to the total solid content of the near infrared light absorbing layer-forming composition. The upper limit is preferably 20 mass % or lower, and more preferably 10 mass % or lower. The lower limit is preferably 0.5 mass % or higher and more preferably 1 mass % or higher. The content of the dispersant is preferably 1 to 100 parts by mass with respect to 100 parts by mass of the pigment. The upper limit is preferably 80 parts by mass or less and more preferably 60 parts by mass or less. The lower limit is preferably 2.5 parts by mass or more and more preferably 5 parts by mass or more.

(Epoxy Curing Agent)

In a case where the near infrared light absorbing layer-forming composition includes the epoxy compound, it is preferable that the composition further includes an epoxy curing agent. Examples of the epoxy curing agent include an amine compound, an acid anhydride compound, an amide compound, a phenol compound, a polycarboxylic acid, and a thiol compound. From the viewpoints of heat resistance and transparency of a cured product, as the epoxy curing agent, a polycarboxylic acid is preferable, and a compound having two or more carboxylic anhydride groups in a molecule is most preferable. Specific examples of the epoxy curing agent include butanedioic acid. As the epoxy curing agent, a compound described in paragraphs "0072" to "0078" of JP2016-075720A can also be used, the content of which is incorporated herein by reference.

The content of the epoxy curing agent is preferably 0.01 to 20 parts by mass, more preferably 0.01 to 10 parts by mass, and still more preferably 0.1 to 6.0 parts by mass with respect to 100 parts by mass of the epoxy compound.

(Solvent)

The near infrared light absorbing layer-forming composition may include a solvent. Examples of the solvent include an organic solvent. Basically, the solvent is not particularly limited as long as it satisfies the solubility of the respective components and the application properties of the composition. Examples of the organic solvent include esters, ethers, ketones, and aromatic hydrocarbons. The details of the organic solvent can be found in paragraph "0223" of WO2015/166779A, the content of which is incorporated herein by reference. In addition, an ester solvent in which a cyclic alkyl group is substituted or a ketone solvent in which a cyclic alkyl group is substituted can also be preferably used. Specific examples of the organic solvent include dichloromethane, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclohexyl acetate, cyclopentanone, ethyl carbitol acetate, butyl carbitol acetate, propylene glycol monomethyl ether, and propylene glycol monomethyl ether acetate. In the present invention, the organic solvent may be used alone, or two or more of the organic solvents may be used in combination. In this case, it may be preferable that the content of the aromatic hydrocarbon (for example, benzene, toluene, xylene, or ethylbenzene) as the solvent is low (for example, 50 mass parts per million (ppm) or lower, 10 mass ppm or lower, or 1 mass ppm or lower with respect to the total mass of the organic solvent) in consideration of environmental aspects and the like.

In the present invention, a solvent having a low metal content is preferably used. For example, the metal content in the solvent is preferably 10 mass parts per billion (ppb) or lower. Optionally, a solvent having a metal content at a mass parts per trillion (ppt) level may be used. For example, such a high-purity solvent is available from Toyo Gosei Co., Ltd. (The Chemical Daily, Nov. 13, 2015).

Examples of a method of removing impurities such as metal from the solvent include distillation (for example, molecular distillation or thin-film distillation) and filtering using a filter. The pore size of a filter used for the filtering is preferably 10 μm or less, more preferably 5 μm or less, and still more preferably 3 μm or less. As a material of the filter, polytetrafluoroethylene, polyethylene, or nylon is preferable.

The solvent may include an isomer (a compound having the same number of atoms and a different structure). In addition, the organic solvent may include only one isomer or a plurality of isomers.

In the present invention, as the organic solvent, an organic solvent containing 0.8 mmol/L or lower of a peroxide is preferable, and an organic solvent containing substantially no peroxide is more preferable.

The content of the solvent is preferably 10 to 97 mass % with respect to the total mass of the near infrared light absorbing layer-forming composition. The lower limit is preferably 30 mass % or higher, more preferably 40 mass % or higher, still more preferably 50 mass % or higher, still more preferably 60 mass % or higher, and still more preferably 70 mass % or higher. The upper limit is preferably 96 mass % or lower and more preferably 95 mass % or lower.

(Polymerization Inhibitor)

The near infrared light absorbing layer-forming composition may include a polymerization inhibitor. Examples of the polymerization inhibitor include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-t-butylphenol), and N-nitrosophenylhydroxyamine salt (for example, an ammonium salt or a cerium (III) salt). Among these, p-methoxyphenol is preferable. The content of the polymerization inhibitor is preferably 0.001 to 5 mass % with respect to the total solid content of the near infrared light absorbing layer-forming composition.

(Silane Coupling Agent)

The near infrared light absorbing layer-forming composition may include a silane coupling agent. In the present invention, the silane coupling agent refers to a silane compound having a functional group other than a hydrolyzable group. In addition, the hydrolyzable group refers to a substituent directly linked to a silicon atom and capable of forming a siloxane bond due to at least one of a hydrolysis reaction or a condensation reaction. Examples of the hydrolyzable group include a halogen atom, an alkoxy group, and an acyloxy group. Among these, an alkoxy group is preferable. That is, it is preferable that the silane coupling agent is a compound having an alkoxysilyl group. Examples of the functional group other than a hydrolyzable group include a vinyl group, a styryl group, a (meth)acryloyl group, a mercapto group, an epoxy group, an oxetanyl group, an amino group, an ureido group, a sulfide group, an isocyanate group, and a phenyl group. Among these, a (meth)acryloyl group or an epoxy group is preferable. Examples of the silane coupling agent include a compound described in paragraphs "0018" to "0036" of JP2009-288703A and a compound described in paragraphs "0056" to "0066" of JP2009-242604A, the contents of which are incorporated herein by reference.

The content of the silane coupling agent is preferably 0.01 to 15.0 mass % and more preferably 0.05 to 10.0 mass % with respect to the total solid content of the near infrared light absorbing layer-forming composition. The silane coupling agent may be used alone, or two or more of the silane coupling agents may be used. In a case where two or more silane coupling agents are used in combination, it is preferable that the total content of the two or more silane coupling agents is in the above-described range.

(Surfactant)

The near infrared light absorbing layer-forming composition may include a surfactant. As the surfactants, various surfactants such as a fluorine surfactant, a nonionic surfactant, a cationic surfactant, an anionic surfactant, or a silicone surfactant can be used. The details of the surfactant can be found in paragraphs "0238" to "0245" of WO2015/166779A, the content of which is incorporated herein by reference.

It is preferable that the surfactant is a fluorine surfactant. By the near infrared light absorbing layer-forming composition including a fluorine surfactant, liquid characteristics (in particular, fluidity) are further improved, and liquid saving properties can be further improved. In addition, a film having reduced thickness unevenness can be formed.

The fluorine content in the fluorine surfactant is preferably 3 to 40 mass %, more preferably 5 to 30 mass %, and still more preferably 7 to 25 mass %. The fluorine surfactant in which the fluorine content is in the above-described range is effective from the viewpoints of the uniformity in the thickness of the coating film and liquid saving properties, and the solubility thereof in the composition is also excellent.

Specific examples of the fluorine surfactant include a surfactant described in paragraphs "0060" to "0064" of JP2014-041318A (paragraphs "0060" to "0064" of corresponding WO2014/17669A) and a surfactant described in paragraphs "0117" to "0132" of JP2011-132503A, the contents of which are incorporated herein by reference. Examples of a commercially available product of the fluorine surfactant include: MEGAFACE F171, F172, F173, F176, F177, F141, F142, F143, F144, R30, F437, F475, F479, F482, F554, and F780 (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC-1068, SC-381, SC-383, S-393, and KH-40 (all of which are manufactured by Asahi Glass Co., Ltd.); and POLYFOX PF636, PF656, PF6320, PF6520, and PF7002 (all of which are manufactured by OMNOVA Solutions Inc.).

In addition, as the fluorine surfactant, an acrylic compound in which, in a case where heat is applied to a molecular structure which has a functional group having a fluorine atom, the functional group having a fluorine atom is cut and a fluorine atom is volatilized can also be preferably used. Examples of the fluorine surfactant include MEGAFACE DS series (manufactured by DIC Corporation, The Chemical Daily, Feb. 22, 2016, Nikkei Business Daily, Feb. 23, 2016), for example, MEGAFACE DS-21.

As the fluorine surfactant, a block polymer can also be used. Examples of the block polymer include a compound described in JP2011-089090A. As the fluorine surfactant, a fluorine-containing polymer compound can be preferably used, the fluorine-containing polymer compound including: a repeating unit derived from a (meth)acrylate compound having a fluorine atom; and a repeating unit derived from a (meth)acrylate compound having 2 or more (preferably 5 or more) alkyleneoxy groups (preferably an ethyleneoxy group and a propyleneoxy group). For example, the following compound can also be used as the fluorine surfactant used in the present invention.

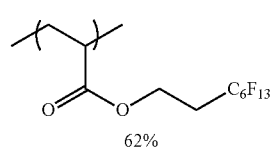

62%

-continued

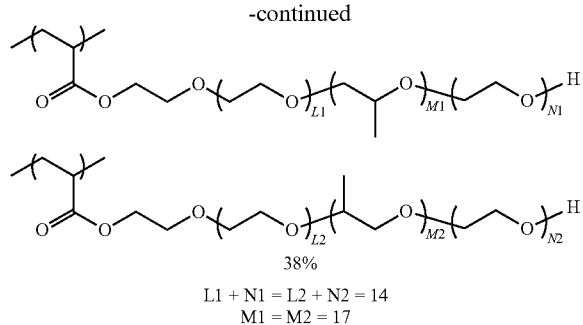

38%

L1 + N1 = L2 + N2 = 14
M1 = M2 = 17

The weight-average molecular weight of the compound is preferably 3,000 to 50,000 and, for example, 14,000. In the compound, "%" representing the proportion of a repeating unit is mol %.

In addition, as the fluorine surfactant, a fluorine-containing polymer having an ethylenically unsaturated group at a side chain can also be used. Specific examples include a compound described in paragraphs "0050" to "0090" and paragraphs "0289" to "0295" of JP2010-164965A, for example, MEGAFACE RS-101, RS-102, RS-718K, and RS-72-K manufactured by DIC Corporation. As the fluorine surfactant, a compound described in paragraphs "0015" to "0158" of JP2015-117327A can also be used.

Examples of the nonionic surfactant include glycerol, trimethylolpropane, trimethylolethane, an ethoxylate and a propoxylate thereof (for example, glycerol propoxylate or glycerol ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, sorbitan fatty acid esters, PLURONIC L10, L31, L61, L62, 10R5, 17R2, and 25R2 (manufactured by BASF SE), TETRONIC 304, 701, 704, 901, 904, and 150R1 (manufactured by BASF SE), SOLSPERSE 20000 (manufactured by Lubrication Technology Inc.), NCW-101, NCW-1001, and NCW-1002 (all of which are manufactured by Wako Pure Chemical Industries, Ltd.), PIONIN D-6112, D-6112-W, and D-6315 (all of which are manufactured by Takemoto Oil&Fat Co., Ltd.), and OLFINE E1010 and SURFYNOL 104, 400, and 440 (all of which are manufactured by Nissin Chemical Co., Ltd.).

The content of the surfactant is preferably 0.001 to 5.0 mass % and more preferably 0.005 to 3.0 mass % with respect to the total solid content of the near infrared light absorbing layer-forming composition. The surfactant may be used alone, or two or more of the surfactants may be used. In a case where two or more surfactants are used in combination, it is preferable that the total content of the two or more surfactants is in the above-described range.

(Ultraviolet Absorber)

The near infrared light absorbing layer-forming composition may include an ultraviolet absorber. As the ultraviolet absorber, for example, a conjugated diene compound, an aminobutadiene compound, a methyldibenzoyl compound, a coumarin compound, a salicylate compound, a benzophenone compound, a benzotriazole compound, an acrylonitrile compound, or a hydroxyphenyltriazine compound can be used. The details can be found in paragraphs "0052" to "0072" of JP2012-208374A and paragraphs "0317" to "0334" of JP2013-068814A, the contents of which are incorporated herein by reference. Examples of a commercially available product of the conjugated diene compound include UV-503 (manufactured by Daito Chemical Co., Ltd.). In addition, as the benzotriazole compound, MYUA series (manufactured by Miyoshi Oil&Fat Co., Ltd.; The Chemical Daily, Feb. 1, 2016) may be used.

The content of the ultraviolet absorber is preferably 0.01 to 10 mass % and more preferably 0.01 to 5 mass % with respect to the total solid content of the near infrared light absorbing layer-forming composition. In the present invention, the ultraviolet absorber may be used alone, or two or more of the ultraviolet absorbers may be used. In a case where two or more ultraviolet absorbers are used in combination, it is preferable that the total content of the two or more ultraviolet absorbers is in the above-described range.

(Other Components)

Optionally, the near infrared light absorbing layer-forming composition may further include a sensitizer, a curing accelerator, a filler, a thermal curing accelerator, a thermal polymerization inhibitor, a plasticizer, an adhesion accelerator, and other auxiliary agents (for example, conductive particles, a filler, an antifoaming agent, a flame retardant, a leveling agent, a peeling accelerator, an antioxidant, an aromatic chemical, a surface tension adjuster, or a chain transfer agent). The details of these components can be found in paragraphs "0101" to "0104" and "0107" to "0109" of JP2008-250074A, the content of which is incorporated herein by reference. In addition, examples of the antioxidant include a phenol compound, a phosphite compound, and a thioether compound. As the antioxidant, a phenol compound having a molecular weight of 500 or higher, a phosphite compound having a molecular weight of 500 or higher, or a thioether compound having a molecular weight of 500 or higher is more preferable. Among these compounds, a mixture of two or more of the compounds may be used. As the phenol compound, any phenol compound which is known as a phenol antioxidant can be used. As the phenol compound, for example, a hindered phenol compound is preferable. In particular, a compound having a substituent at a position (ortho-position) adjacent to a phenolic hydroxyl group is preferable. In addition, as the antioxidant, a compound having a phenol group and a phosphite group in the same molecule is also preferable. In addition, as the antioxidant, a phosphorus antioxidant can also be preferably used. Examples of the phosphorus antioxidant include at least one compound selected from the group consisting of tris[2-[[2,4,8,10-tetrakis(1,1-dimethylethyl)dibenzo[d,f][1,3,2]dioxaphosphepin-6-yl]oxy]ethyl]amine, tris[2-[(4,6,9,11-tetra-tert-butyldibenzo[d,f][1,3,2]dioxaphosphepin-2-yl)oxy]ethyl]amine, and ethyl bis(2,4-di-tert-butyl-6-methylphenyl)phosphite. These antioxidants are available as a commercially available product. Examples of the commercially available product include ADEKA STAB AO-20, ADEKA STAB AO-30, ADEKA STAB AO-40, ADEKA STAB AO-50, ADEKA STAB AO-50F, ADEKA STAB AO-60, ADEKA STAB AO-60G, ADEKA STAB AO-80, and ADEKA STAB AO-330 (all of which are manufactured by Adeka Corporation). The content of the antioxidant is preferably 0.01 to 20 mass % and more preferably 0.3 to 15 mass % with respect to the total solid content of the near infrared light absorbing layer-forming composition. The antioxidant may be used alone, or two or more of the antioxidants may be used. In a case where two or more antioxidants are used in combination, it is preferable that the total content of the two or more antioxidants is in the above-described range.

For example, in a case where a film is formed by coating, the viscosity (23° C.) of the near infrared light absorbing layer-forming composition is preferably 1 to 100 mPa·s. The lower limit is more preferably 2 mPa·s or higher and still more preferably 3 mPa·s or higher. The upper limit is more preferably 50 mPa·s or lower, still more preferably 30 mPa·s or lower, and still more preferably 15 mPa·s or lower.

«Color Filter Layer-Forming Composition»

The color filter layer-forming composition includes the chromatic colorant. Examples of the chromatic colorant include the examples described above regarding the color filter layer. It is preferable that the chromatic colorant is a pigment.

In the color filter layer-forming composition, the content of the chromatic colorant is preferably 1 to 70 mass % with respect to the total solid content of the color filter layer-forming composition. The lower limit is preferably 5 mass % or higher and more preferably 10 mass % or higher. The upper limit is preferably 60 mass % or lower, and more preferably 50 mass % or lower. The chromatic colorant may be used alone, or two or more of the chromatic colorants may be used. In a case where two or more chromatic colorants are used in combination, it is preferable that the total content of the two or more near chromatic colorants is in the above-described range.

In addition, in the color filter layer-forming composition, the content of the colorant compound to which the specific acid group is bonded is preferably 0.1 to 99.9 mass % with respect to the total mass of the compound having a colorant skeleton. The lower limit is preferably 1 mass % or higher, more preferably 3 mass % or higher, and still more preferably 5 mass % or higher. The upper limit is preferably 99 mass % or lower, more preferably 60 mass % or lower, and still more preferably 50 mass % or lower. Here, examples of the compounds having a colorant skeleton in the color filter layer-forming composition include a chromatic colorant and a colorant derivative.

(Colorant Derivative)

The color filter layer-forming composition may further include a colorant derivative. Examples of the colorant derivative include a compound in which a portion of a pigment is substituted with an acid group, a basic group, a group having a salt structure, or a phthalimidomethyl group, and it is preferable that the portion of the colorant is a compound substituted with an acid group (acidic colorant derivative). As the acidic colorant derivative, the compound represented by Formula (B1) is preferable. Examples of the acid group include a sulfo group, a phosphate group, and a carboxyl group. Among these, a sulfo group or a carboxyl group is preferable, and a sulfo group is more preferable.

In a case where the color filter layer-forming composition includes a colorant derivative, the content of the colorant derivative is preferably 1 to 50 parts by mass with respect to 100 parts by mass of the chromatic colorant. The lower limit value is preferably 3 parts by mass or more and more preferably 5 parts by mass or more. The upper limit value is preferably 40 parts by mass or less and more preferably 30 parts by mass or less. In a case where the content of the colorant derivative is in the above-described range, the dispersibility of the chromatic colorant can be improved, and the aggregation of the chromatic colorant can be efficiently suppressed. In addition, the content of the acidic colorant derivative is preferably 1 to 50 parts by mass with respect to 100 parts by mass of the chromatic colorant. The lower limit value is preferably 3 parts by mass or more and more preferably 5 parts by mass or more. The upper limit value is preferably 40 parts by mass or less and more preferably 30 parts by mass or less. In addition, it is preferable that the colorant derivative included in the color filter layer-forming composition substantially consists of only the acidic colorant derivative. The colorant derivative included in the color filter layer-forming composition substantially consists of only the acidic colorant derivative, the content of the acidic colorant derivative is preferably 99 mass % or higher and more preferably 99.9 mass % or higher with respect to the total mass of the colorant derivatives, and it is still more preferable that the colorant derivative consists of only the acidic colorant derivative.

In a case where the color filter layer-forming composition includes the acidic colorant derivative, the content of the acidic colorant derivative is preferably 0.1 to 99.9 mass % with respect to the total mass of the compounds having a colorant skeleton. The lower limit is preferably 1 mass % or higher, more preferably 3 mass % or higher, and still more preferably 5 mass % or higher. The upper limit is preferably 99 mass % or lower, more preferably 60 mass % or lower, and still more preferably 50 mass % or lower. In the color filter layer-forming composition, only one colorant derivative may be used alone, or two or more colorant derivatives may be used. In a case where two or more colorant derivatives are used in combination, it is preferable that the total content of the two or colorant derivatives is in the above-described range.

The color filter layer-forming composition may further include, for example, a polymerizable compound, an epoxy compound, a photopolymerization initiator, a resin, an epoxy curing agent, a solvent, a polymerization inhibitor, a silane coupling agent, a surfactant, an ultraviolet absorber, or an antioxidant. Specific examples and contents of the above-described compounds are the same as those described above regarding the near infrared light absorbing layer-forming composition.

For example, in a case where a film is formed by coating, the viscosity (23° C.) of the color filter layer-forming composition is preferably 1 to 100 mPa·s. The lower limit is more preferably 2 mPa·s or higher and still more preferably 3 mPa·s or higher. The upper limit is more preferably 50 mPa·s or lower, still more preferably 30 mPa·s or lower, and still more preferably 15 mPa·s or lower.

<Storage Container of Composition>

A storage container of each of the compositions is not particularly limited, and a well-known storage container can be used. In addition, as the storage container, in order to suppress infiltration of impurities into the raw materials or the composition, a multilayer bottle in which a container inner wall having a six-layer structure is formed of six of resins or a bottle in which a container inner wall having a seven-layer structure is formed of six of resins is preferably used. Examples of the container include a container described in JP2015-123351A.

<Method of Preparing Composition>

Each of the compositions can be prepared by mixing the above-described components with each other. During the preparation of the composition, all the components may be dissolved or dispersed in a solvent at the same time to prepare the composition. Optionally, two or more solutions or dispersions to which the respective components are appropriately added may be prepared, and the solutions or dispersions may be mixed with each other during use (during application) to prepare the composition.

<Method of Forming Laminate>

Next, a method of forming the laminate according to the embodiment of the present invention will be described. The laminate according to the embodiment of the present invention can be manufactured using a method including: forming a near infrared light absorbing layer on a support using the near infrared light absorbing layer-forming composition;

and forming a color filter layer on the near infrared light absorbing layer using the color filter layer-forming composition, or using a method including: forming a color filter layer on a support using the color filter layer-forming composition; and forming a near infrared light absorbing layer on the color filter layer using the near infrared light absorbing layer-forming composition. In addition, it is preferable that, after forming a laminate including the near infrared light absorbing layer and the color filter layer, an oxygen barrier film is further formed on the laminate. This way, a laminate in which the oxygen barrier film is formed on the laminate including the near infrared light absorbing layer and the color filter layer can be manufactured.

Examples of the support to which each of the compositions is applied in the method of manufacturing the laminate according to the embodiment of the present invention include a substrate formed of a material such as silicon, non-alkali glass, soda glass, PYREX (registered trade name) glass, or quartz glass. For example, an organic film or an inorganic film may be formed on the substrate. Examples of a material of the organic film include the above-described transparent resin. In addition, as the support, a substrate formed of the above-described resin can also be used. In addition, a charge coupled device (CCD), a complementary metal-oxide semiconductor (CMOS), a transparent conductive film, or the like may be formed on the support. In addition, a black matrix that separates pixels from each other may be formed on the support. In addition, optionally, an undercoat layer may be provided on the support to improve adhesiveness with a layer above the support, to prevent diffusion of materials, or to make a surface of the substrate flat. In addition, in a case where a glass substrate is used as the support, it is preferable that an inorganic film is formed on the glass substrate or the glass substrate may be dealkalized to be used. According to this aspect, a film in which the occurrence of foreign matter is suppressed can be easily formed.

As a method of applying the composition, a well-known method can be used. Examples of the well-known method include: a drop casting method; a slit coating method; a spray coating method; a roll coating method; a spin coating method; a cast coating method; a slit and spin method; a pre-wetting method (for example, a method described in JP2009-145395A); various printing methods including jet printing such as an ink jet method (for example, an on-demand method, a piezoelectric method, or a thermal method) or a nozzle jet method, flexographic printing, screen printing, gravure printing, reverse offset printing, and metal mask printing; a transfer method using a mold or the like; and a nanoimprint lithography method. The application method using an ink jet method is not particularly limited, and examples thereof include a method (in particular, pp. 115 to 133) described in "Extension of Use of Ink Jet-Infinite Possibilities in Patent-" (February, 2005, S.B. Research Co., Ltd.) and methods described in JP2003-262716A, JP2003-185831A, JP2003-261827A, JP2012-126830A, and JP2006-169325A.

A composition layer formed by applying the composition may be dried (pre-baked). In a case where pre-baking is performed, the pre-baking temperature is preferably 150° C. or lower, more preferably 120° C. or lower, and still more preferably 110° C. or lower. The lower limit is, for example, 50° C. or higher or 80° C. or higher. The pre-baking time is preferably 10 to 3000 seconds, more preferably 40 to 2500 seconds, and still more preferably 80 to 220 seconds. Drying can be performed using a hot plate, an oven, or the like.

A pattern may be formed on the composition layer that is formed by applying the composition. Examples of a pattern forming method include a pattern forming method using a photolithography method and a pattern forming method using a dry etching method.

(Case where Pattern is Formed using Photolithography Method)

It is preferable that the pattern forming method using a photolithography method includes: a step (exposure step) of exposing the composition layer, which is formed by applying each of the compositions, in a pattern shape; and a step (development step) of forming a pattern by removing a non-exposed portion of the composition layer for development. Optionally, the pattern forming method may further include a step (post-baking step) of baking the developed pattern. Hereinafter, the respective steps will be described.

«Exposure Step»

In the exposure step, the composition layer is exposed in a pattern shape. For example, the composition layer can be exposed in a pattern shape using an exposure device such as a stepper through a mask having a predetermined mask pattern. As a result, an exposed portion can be cured. As radiation (light) used during the exposure, ultraviolet rays such as g-rays or i-rays are preferable, and i-rays are more preferable. For example, the irradiation dose (exposure dose) is preferably 0.03 to 2.5 J/cm$^2$, more preferably 0.05 to 1.0 J/cm$^2$, and most preferably 0.08 to 0.5 J/cm$^2$. The oxygen concentration during exposure can be appropriately selected. The exposure may be performed not only in air but also in a low-oxygen atmosphere having an oxygen concentration of 19 vol % or lower (for example, 15 vol %, 5 vol %, or substantially 0 vol %) or in a high-oxygen atmosphere having an oxygen concentration of higher than 21 vol % (for example, 22 vol %, 30 vol %, or 50 vol %). In addition, the exposure illuminance can be appropriately set and typically can be selected in a range of 1000 W/m$^2$ to 100000 W/m$^2$ (for example, 5000 W/m$^2$, 15000 W/m$^2$, or 35000 W/m$^2$). Conditions of the oxygen concentration and conditions of the exposure illuminance may be appropriately combined. For example, conditions are oxygen concentration: 10 vol % and illuminance: 10000 W/m$^2$, or oxygen concentration: 35 vol % and illuminance: 20000 W/m$^2$.

«Development step»

Next, a pattern is formed by removing a non-exposed portion of the exposed composition layer by development. The non-exposed portion of the composition layer can be removed by development using a developer. As a result, a non-exposed portion of the composition layer in the exposure step is eluted into the developer, and only the photocured portion remains on the support. As the developer, an alkali developer which does not cause damages to a solid image pickup element as an underlayer, a circuit or the like is desired. For example, the temperature of the developer is preferably 20° C. to 30° C. The development time is preferably 20 to 180 seconds. In addition, in order to further improve residue removing properties, a step of shaking the developer off per 60 seconds and supplying a new developer may be repeated multiple times.

Examples of the alkaline agent used as the developer include: an organic alkaline compound such as ammonia water, ethylamine, diethylamine, dimethylethanolamine, diglycolamine, diethanolamine, hydroxyamine, ethylenediamine, tetramethylammonium hydroxide, tetraethylammonium hydroxide, tetrapropylammonium hydroxide, tetrabutylammonium hydroxide, ethyltrimethylammonium hydroxide, benzyltrimethylammonium hydroxide, dimethyl bis(2-hydroxyethyl)ammonium hydroxide, choline, pyrrole, piperidine, or 1,8-diazabicyclo[5.4.0]-7-undecene; and an inorganic alkaline compound such as sodium hydroxide, potassium hydroxide, sodium carbonate, sodium bicarbonate, sodium silicate, or sodium metasilicate. From the viewpoints of environment and safety, it is preferable that the alkaline agent is a compound having a high molecular weight. As the developer, an alkaline aqueous solution in which the above alkaline agent is diluted with pure water is preferably used. A concentration of the alkaline agent in the alkaline aqueous solution is preferably 0.001 to 10 mass % and more preferably 0.01 to 1 mass %. In addition, a surfactant may be used as the developer. Examples of the surfactant include the above-described surfactants. Among these, a nonionic surfactant is preferable. From the viewpoint of easiness of transport, storage, and the like, the developer may be obtained by temporarily preparing a concentrated solution and diluting the concentrated solution to a necessary concentration during use. The dilution factor is not particularly limited and, for example, can be set to be in a range of 1.5 to 100 times. In a case where a developer including the alkaline aqueous solution is used, it is preferable that the layer is rinsed with pure water after development.

After the development, the film can also be dried and then heated (post-baking). Post-baking is a heat treatment which is performed after development to completely cure the film. In a case where post-baking is performed, for example, the post-baking temperature is preferably 100° C. to 240° C. From the viewpoint of curing the film, the post-baking temperature is more preferably 200° C. to 230° C. The film after the development is post-baked continuously or batch-wise using heating means such as a hot plate, a convection oven (hot air circulation dryer), or a high-frequency heater under the above-described conditions.

(Case where Pattern is Formed using Dry Etching Method)

The formation of a pattern using a dry etching method can be performed using a method including: applying the composition to a support to form a composition layer; curing the composition layer to form a cured composition layer; forming a patterned photoresist layer on the cured composition layer; and dry-etching the cured composition layer with etching gas by using the patterned photoresist layer as a mask. It is preferable that pre-baking is performed in order to form the photoresist layer. The details of the pattern formation using the dry etching method can be found in paragraphs "0010" to "0067" of JP2013-064993A, the content of which is incorporated herein by reference.

<Optical Filter>

Next, an optical filter according to the embodiment of the present invention will be described. The optical filter according to the embodiment of the present invention includes the laminate according to the embodiment of the present invention.

The optical filter according to the embodiment of the present invention further includes an infrared transmitting filter in addition to the laminate according to the embodiment of the present invention. In this specification, the infrared transmitting filter refers to a filter that shields visible light and allows transmission of at least a part of near infrared light. The infrared transmitting filter can be formed using a composition described in, for example, JP2014-130338A, JP2013-077009A, or WO2015/166779A, the contents of which are incorporated herein by reference The optical filter according to the embodiment of the present invention can be used in various devices including a solid image pickup element such as a charge coupled device (CCD) or a complementary metal-oxide semiconductor (CMOS), an infrared sensor, or an image display device.

<Solid Image Pickup Element>

A solid image pickup element according to the embodiment of the present invention includes the laminate according to the embodiment of the present invention. The configuration of the solid image pickup element according to the embodiment of the present invention is not particularly limited as long as it includes the laminate according to the embodiment of the present invention and functions as a solid image pickup element. For example, the following configuration can be adopted.

The solid image pickup element includes a plurality of photodiodes and transfer electrodes on the support, the photodiodes constituting a light receiving area of the solid image pickup element, and the transfer electrode being formed of polysilicon or the like. In the solid image pickup element, a light shielding film formed of tungsten or the like which has openings through only light receiving sections of the photodiodes is provided on the photodiodes and the transfer electrodes, a device protective film formed of silicon nitride or the like is formed on the light shielding film so as to cover the entire surface of the light shielding film and the light receiving sections of the photodiodes, and the laminate according to the embodiment of the present invention is formed on the device protective film. Further, a configuration in which light collecting means (for example, a microlens; hereinafter, the same shall be applied) is provided above the device protective film and below the laminate according to the embodiment of the present invention (on a side thereof close the support), or a configuration in which light collecting means is provided on the laminate according to the embodiment of the present invention may be adopted.

<Image Display Device>

An image display device according to the embodiment of the present invention includes the laminate according to the embodiment of the present invention. Examples of the image display device include a liquid crystal display device or an organic electroluminescence (organic EL) display device. The definition and details of the image display device can be found in, for example, "Electronic Display Device (by Akiya Sasaki, Kogyo Chosakai Publishing Co., Ltd., 1990)" or "Display Device (Sumiaki Ibuki, Sangyo Tosho Co., Ltd.)". In addition, the details of a liquid crystal display device can be found in, for example, "Next-Generation Liquid Crystal Display Techniques (Edited by Tatsuo Uchida, Kogyo Chosakai Publishing Co., Ltd., 1994)". The liquid crystal display device to which the present invention is applicable is not particularly limited. For example, the present invention is applicable to various liquid crystal display devices described in "Next-Generation Liquid Crystal Display Techniques". The image display device may include a white organic EL element. It is preferable that the white organic EL element has a tandem structure. The tandem structure of the organic EL element is described in, for example, JP2003-045676A, or pp. 326-328 of "Forefront of Organic EL Technology Development-Know-How Collection of High Brightness, High Precision, and Long Life" (Technical Information Institute, 2008). It is preferable that a spectrum of white light emitted from the organic EL element has high maximum emission peaks in a blue range (430 to 485 nm), a green range (530 to 580 nm), and a yellow range (580 to 620 nm). It is more preferable that the spectrum has a maximum emission peak in a red range (650 nm to 700 nm) in addition to the above-described emission peaks.

<Infrared Sensor>

An infrared sensor according to the embodiment of the present invention includes the laminate according to the embodiment of the present invention. The configuration of the infrared sensor is not particularly limited as long as it functions as an infrared sensor. Hereinafter, an embodiment of the infrared sensor used in the present invention will be described using the drawings.

In FIG. 1, reference numeral 110 represents a solid image pickup element. In an imaging region provided on a solid image pickup element 110, near infrared light absorbing layers 111 and infrared transmitting filter layers 114 are provided. In addition, color filter layers 112 are laminated on the near infrared light absorbing layers 111. Microlenses 115 are disposed on an incidence ray hu side of the color filter layers 112 and the infrared transmitting filter layers 114. A planarizing layer 116 is formed so as to cover the microlenses 115.

Spectral characteristics of the near infrared light absorbing layers 111 can be selected according to the emission wavelength of an infrared light emitting diode (infrared LED) to be used.

On the color filter layer 112, a colored pixel that allows transmission of light having a specific wavelength in a visible range and absorbs the light.

Characteristics of the infrared transmitting filter layers 114 can be selected according to the emission wavelength of the infrared LED to be used. For example, in a case where the emission wavelength of the infrared LED is 850 nm, a maximum value of a light transmittance of the infrared transmitting filter layer 114 in the thickness direction of the film in a wavelength range of 400 to 650 nm is preferably 30% or lower, more preferably 20% or lower, still more preferably 10% or lower and still more preferably 0.1% or lower. It is preferable that the transmittance satisfies the above-described conditions in the entire wavelength range of 400 to 650 nm.

A minimum value of a light transmittance of the infrared transmitting filter layer 114 in the thickness direction of the film in a wavelength range of 800 nm or longer (preferably 800 to 1300 nm) is preferably 70% or higher, more preferably 80% or higher, and still more preferably 90% or higher. It is preferable that the transmittance satisfies the above-described conditions in a part of a wavelength range of 800 nm or longer, and it is more preferable that the transmittance satisfies the above-described conditions at a wavelength corresponding to the emission wavelength of the infrared LED.

In addition, for example, in a case where the emission wavelength of the infrared LED is 940 nm, it is preferable that a maximum value of a light transmittance of the infrared transmitting filter layer 114 in a thickness direction in a wavelength range of 450 to 650 nm is 20% or lower, that a light transmittance of the infrared transmitting filter layer 114 in the thickness direction at a wavelength of 835 nm is 20% or lower, and that a minimum value of a light transmittance of the infrared transmitting filter layer 114 in the thickness direction in a wavelength range of 1000 to 1300 nm is 70% or higher.

In the infrared sensor shown in FIG. 1, a near infrared light absorbing layer (other near infrared light absorbing layer) other than the near infrared light absorbing layer 111 may be further disposed on the planarizing layer 116. As the other near infrared light absorbing layer, for example, a layer containing copper and/or a dielectric multi-layer film may be provided. The details are as described above. In addition, as the other near infrared light absorbing layer, a dual band pass filter may be used.

In addition, in the infrared sensor illustrated in FIG. 1, the position of the near infrared light absorbing layer 111 and the position of the color filter layer 112 may be replaced with each other. In addition, another layer may be arranged between the solid image pickup element 110 and the near infrared light absorbing layer 111 and/or between the solid image pickup element 110 and the infrared transmitting filter layer 114. Examples of the other layer include an organic layer that is formed using a composition including a polymerizable compound, a resin, and a photopolymerization initiator. In addition, a planarizing layer may be formed on the color filter layer 112.

EXAMPLES

Hereinafter, the present invention will be described in detail using examples. Materials, used amounts, ratios, treatment details, treatment procedures, and the like shown in the following examples can be appropriately changed within a range not departing from the scope of the present invention. Accordingly, the scope of the present invention is not limited to the following specific examples. Unless specified otherwise, "part(s)" and "%" represent "part(s) by mass" and "mass %". In addition, in the following structural formulae, Me represents a methyl group, and Ph represents a phenyl group.

Test Example 1

<Preparation of Near Infrared Light Absorbing Layer-Forming Composition (IR Composition)

Raw materials shown in the following table were mixed and stirred at a ratio (part(s) by mass) shown in the following table, and the mixture was filtered through a nylon filter (manufactured by Pall Corporation) having a pore size of 0.45 µm. This way, IR compositions 1 to 20 were prepared.

TABLE 1

|  |  | IR Composition 1 | IR Composition 2 | IR Composition 3 | IR Composition 4 | IR Composition 5 | IR Composition 6 | IR Composition 7 | IR Composition 8 |
|---|---|---|---|---|---|---|---|---|---|
| Near Infrared Absorbing Colorant | No. | A1 | A1/A2 | A3 | A4 | A3 | A3 | A3 | A3 |
|  | Content | 4.81 | 1.20/3.61 | 4.81 | 4.81 | 4.81 | 4.81 | 4.81 | 4.81 |
| Resin | 1 | 27.89 | 27.89 | 27.89 | 27.89 | 27.89 | 27.89 | 27.89 | 27.89 |
|  | 2 | — | — | — | — | — | — | — | — |
|  | 3 | — | — | — | — | — | — | — | — |

TABLE 1-continued

|  |  | IR Composition 1 | IR Composition 2 | IR Composition 3 | IR Composition 4 | IR Composition 5 | IR Composition 6 | IR Composition 7 | IR Composition 8 |
| --- | --- | --- | --- | --- | --- | --- | --- | --- | --- |
| Polymerizable Compound | 1 | 2.00 | 2.00 | 2.00 | 2.00 | 2.00 | 2.00 | 2.00 | 2.40 |
| Photo-polymerization Initiator | 1 | 2.17 | 2.17 | 2.17 | 2.17 | — | — | — | — |
|  | 2 | — | — | — | — | 2.17 | — | — | — |
|  | 3 | — | — | — | — | — | 2.17 | — | — |
|  | 4 | — | — | — | — | — | — | 2.17 | — |
|  | 5 | — | — | — | — | — | — | — | 2.17 |
| Surfactant 1 |  | 2.28 | 2.28 | 2.28 | 2.28 | 2.28 | 2.28 | 0.39 | 0.04 |
| Polymerization Inhibitor |  | 0.001 | 0.001 | 0.001 | 0.001 | 0.001 | 0.001 | 0.001 | 0.001 |
| Solvent 1 |  | 58.00 | 58.00 | 58.00 | 58.00 | 58.00 | 58.00 | 55.54 | 55.54 |

TABLE 2

|  |  | IR Composition 9 | IR Composition 10 | IR Composition 11 | IR Composition 12 | IR Composition 13 | IR Composition 14 | IR Composition 15 | IR Composition 16 |
| --- | --- | --- | --- | --- | --- | --- | --- | --- | --- |
| Near Infrared Absorbing Colorant | No. | A4 | A4 | A3/A4 | A1/A3 | A1/A4 | A1/A3/A4 | A5 | A6 |
|  | Content | 4.81 | 4.81 | 2.40/2.41 | 2.40/2.41 | 2.40/2.41 | 1.60/1.60/1.61 | 4.81 | 4.81 |
| Resin | 1 | 27.89 | 27.89 | 27.89 | 27.89 | 27.89 | 27.89 | 27.89 | 27.89 |
|  | 2 | — | — | — | — | — | — | — | — |
|  | 3 | — | — | — | — | — | — | — | — |
| Polymerizable Compound | 1 | 2.00 | 2.40 | 2.00 | 2.00 | 2.00 | 2.00 | 2.00 | 2.00 |
| Photo-polymerization Initiator | 1 | — | — | 2.17 | 2.17 | 2.17 | 2.17 | 2.17 | 2.17 |
|  | 2 | — | — | — | — | — | — | — | — |
|  | 3 | — | — | — | — | — | — | — | — |
|  | 4 | 2.17 | — | — | — | — | — | — | — |
|  | 5 | — | 2.17 | — | — | — | — | — | — |
| Surfactant 1 |  | 2.28 | 0.04 | 2.28 | 2.28 | 2.28 | 2.28 | 2.28 | 2.28 |
| Polymerization Inhibitor |  | 0.001 | 0.001 | 0.001 | 0.001 | 0.001 | 0.001 | 0.001 | 0.001 |
| Solvent 1 |  | 58.00 | 55.54 | 58.00 | 58.00 | 58.00 | 58.00 | 58.00 | 58.00 |

TABLE 3

|  |  | IR Composition 17 | IR Composition 18 | IR Composition 19 | IR Composition 20 |
| --- | --- | --- | --- | --- | --- |
| Near Infrared Absorbing Colorant | No. | A9 | A1 | A7/A8 | A1 |
|  | Content | 4.81 | 4.00 | 3.61/1.21 | 4.00 |
| Dispersion | 1 | — | 5.36 | — | — |
| Dispersion | 2 | — | — | — | 5.36 |
| Resin | 3 | — | 27.89 | — | 27.89 |
|  | 1 | 27.89 | — | — | — |
|  | 1 | — | — | 27.89 | — |
| Polymerizable Compound | 2 | 2.00 | 2.00 | 2.00 | 2.00 |
| Photopolymerization Initiator | 3 | 2.17 | 2.17 | 2.17 | 2.17 |
|  | 4 | — | — | — | — |
|  | 5 | — | — | — | — |
|  | 4 | — | — | — | — |
|  | 5 | — | — | — | — |
| Surfactant 1 |  | 2.28 | 2.28 | 2.28 | 2.28 |
| Polymerization Inhibitor |  | 0.001 | 0.001 | 0.001 | 0.001 |
| Solvent 1 |  | 60.80 | 58.00 | 58.00 | 58.00 |

The raw materials shown above in the table are as follows.
(Near Infrared Absorbing Colorant)
A1 to A8: compounds having the following structures.
A9: NK-5060 (manufactured by Hayashibara Co., Ltd., Cyanine Compound)
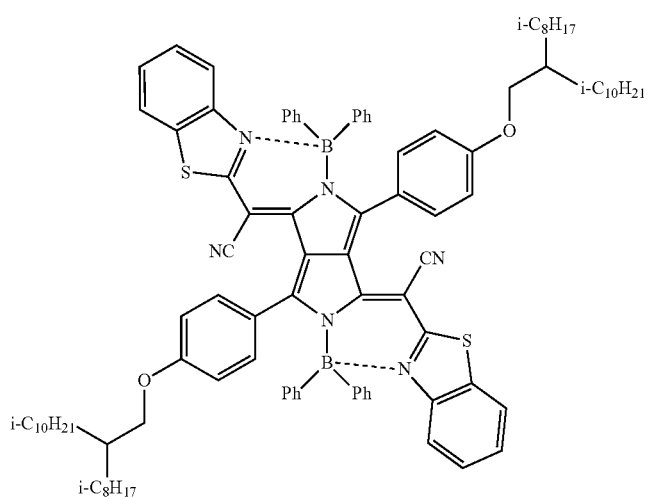
(A1)
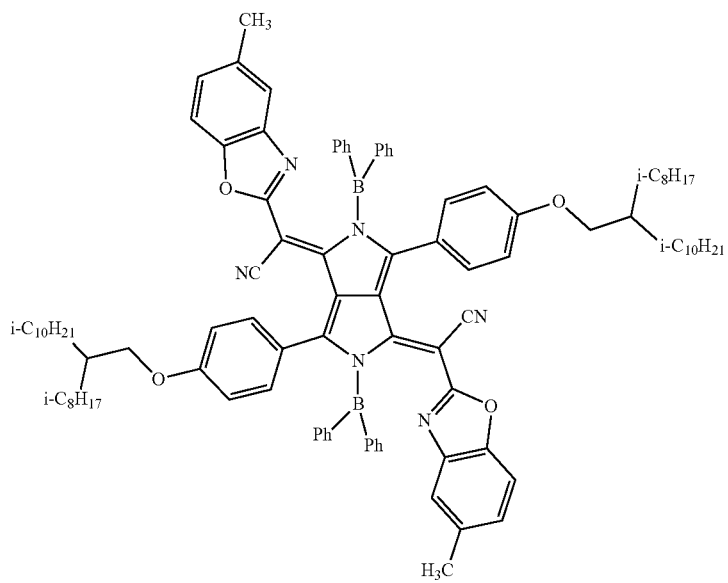
(A2)

(A3)
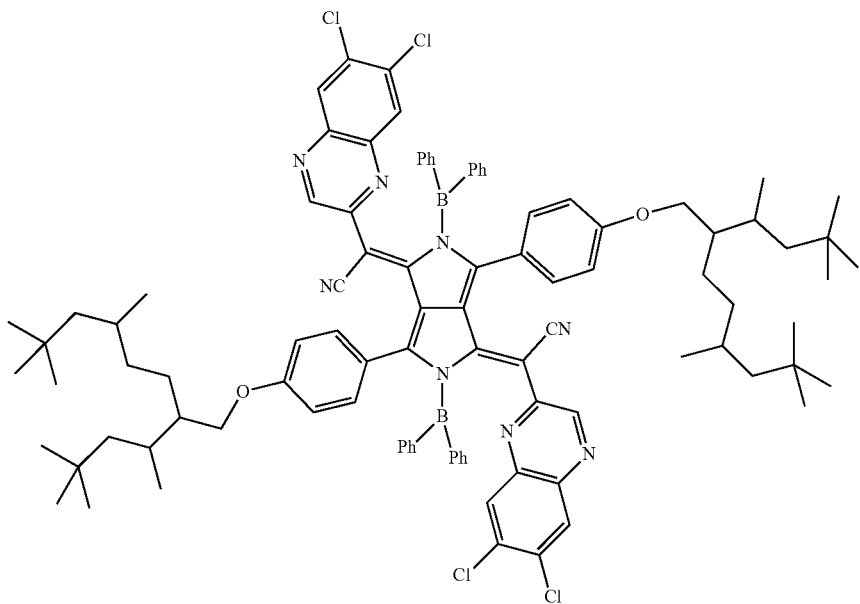
(A4)
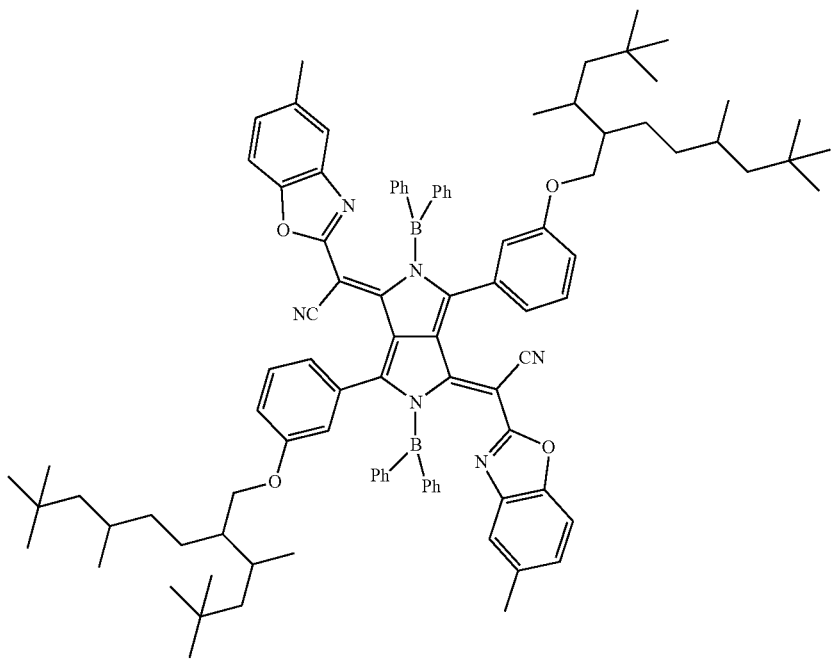
(A5)
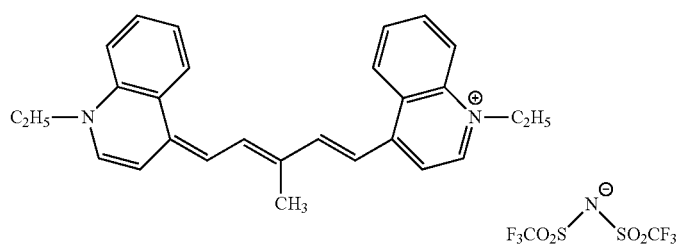

-continued (A6)

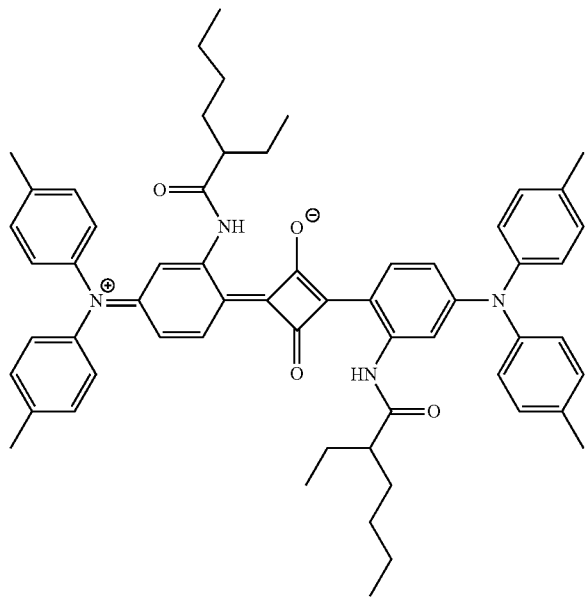

(A7)

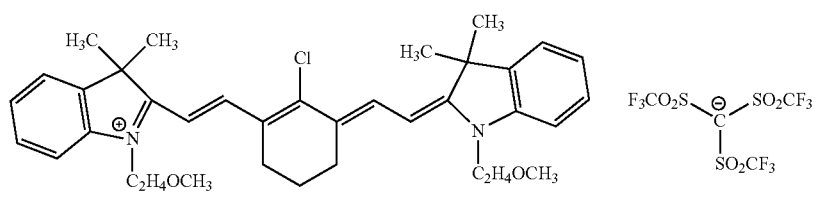

(A8)

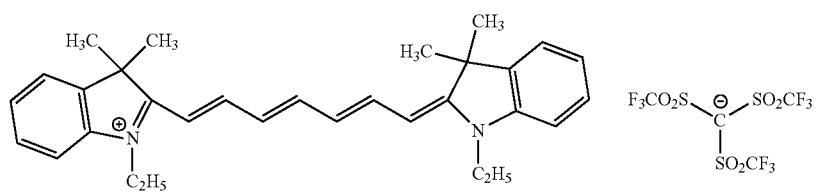

(Resin)
  Resin 1: a cyclopentanone 30 mass % solution of a resin having the following structure (weight-average molecular weight: 41,400; a numerical value added to a repeating unit represents a molar ratio)

(Solvent)
  Solvent 1: cyclopentanone (Polymerization Inhibitor)
  Polymerization Inhibitor 1: p-methoxyphenol (Polymerizable Compound)
  Polymerizable Compound 1: a mixture of the following compounds (a mixture in which a molar ratio between a left compound and a right compound is 7:3)

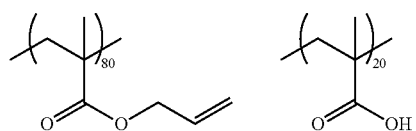

Resin 2: a cyclohexanone 30 mass % solution of ARTON F4520 (manufactured by JSR Corporation)

Resin 3: a cyclohexanone 30 mass % solution of a random polymer having a glycidyl methacrylate skeleton (MARPROOF G-0150M, manufactured by NOF Corporation, weight-average molecular weight: 10,000)

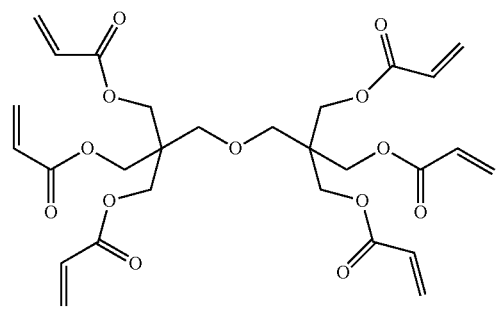

-continued

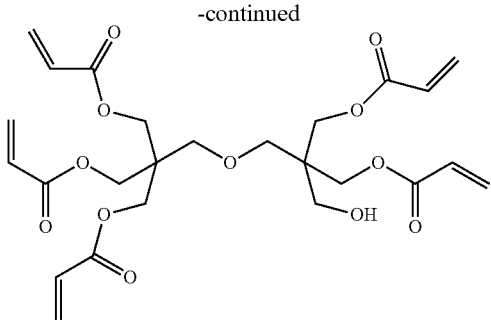

(Photopolymerization Initiator)
Photopolymerization Initiator 1: IRGACURE-OXE 01 (manufactured by BASF SE)
Photopolymerization Initiator 2: a compound having the following structure

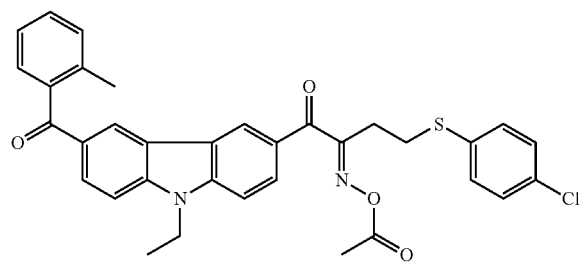 [SMILES: CCn1c2ccc(C(=O)/C(CCSc3ccc(Cl)cc3)=N/OC(C)=O)cc2c2cc(C(=O)c3ccccc3C)ccc21]

Photopolymerization Initiator 3: IRGACURE-369 (manufactured by BASF SE)
Photopolymerization Initiator 4: IRGACURE-651 (manufactured by BASF SE)
Photopolymerization Initiator 5: IRGACURE-184 (manufactured by BASF SE)

(Surfactant)
Surfactant 1: a polymer including a repeating unit represented by Formula the following Formula (B1-1) and a repeating unit represented by the following Formula (B3-1) (weight-average molecular weight=7,400, amount of ethylenically unsaturated group: 3.2 mmol/g, in the following Formula (B3-1), X represents a perfluoromethylene group or a perfluoroethylene group, and r represents the number of repeating units)

B1-1

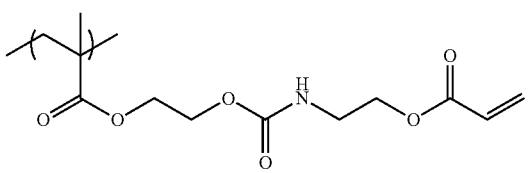

B3-1

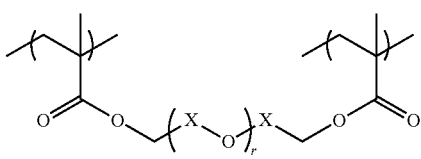

(Dispersion 1)
Raw materials having the following composition were dispersed for 2 hours using a beads mill (a high-pressure disperser with a pressure reducing mechanism, NANO-3000-10 (manufactured by Nippon BEE Chemical Co., Ltd.)) with zirconia beads having a diameter of 0.3 mm. As a result, a dispersion 1 was prepared.

—Composition of Dispersion 1—

| | |
|---|---|
| Near infrared absorbing colorant having the following structure (average primary particle size: 200 nm) | 11.6 parts by mass |

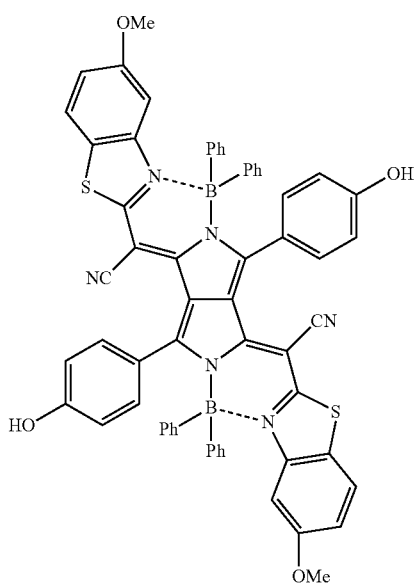

| | |
|---|---|
| Colorant derivative having the following structure (a compound in which a sulfo group was bonded to a colorant skeleton) | 3.5 parts by mass |

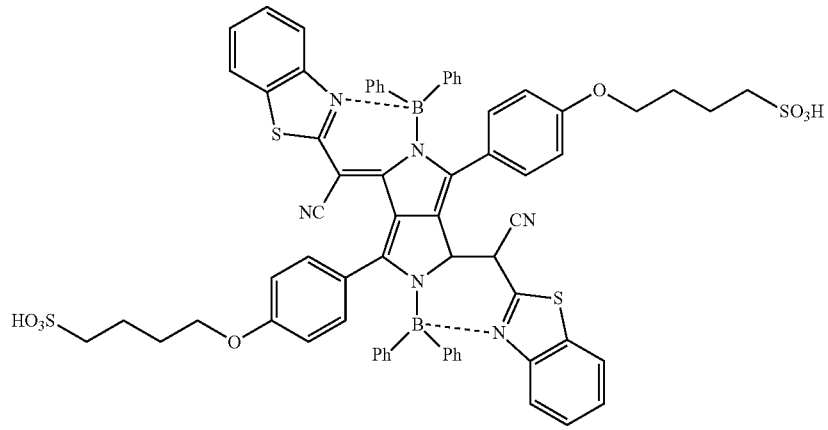

| | |
|---|---|
| Dispersant 1 (a resin having the following structure; weight-average molecular weight: 22,900; a numerical value added to a repeating unit at a main chain represents a molar ratio, and a numerical value added to a repeating unit at a side chain represents the number of the repeating units) | 7.2 parts by mass |

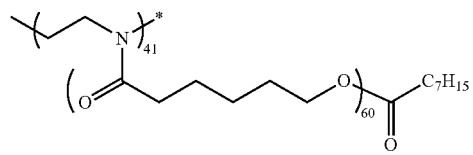

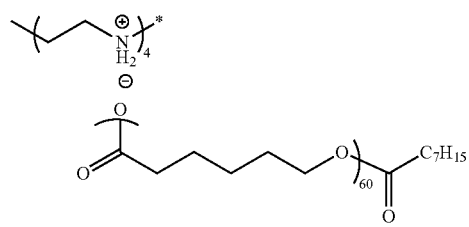

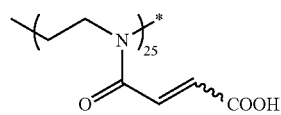

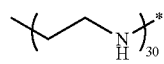

| | |
|---|---|
| Cyclohexanone | 77.77 parts by mass |

(Dispersion 2)

A dispersion 2 was prepared using the same method as that of the dispersion 1, except that a colorant derivative 4 was used as the colorant derivative.

<Preparation of Color Filter Layer-Forming Composition>

[Preparation of Pigment Dispersion] A mixed solution having a composition shown below was mixed for 2 hours using a beads mill (a high-pressure disperser with a pressure reducing mechanism, NANO-3000-10 (manufactured by Nippon BEE Chemical Co., Ltd.)) in which zirconia beads having a diameter of 0.3 mm were used. This way, pigment dispersions 1 to 6 were prepared.

[Composition of Pigment Dispersion 1]

| | |
|---|---|
| C.I. Pigment Green 58 | 11.4 parts by mass |
| C.I. Pigment Yellow 185 | 2.3 parts by mass |
| Colorant Derivative 1 | 1.4 parts by mass |
| Dispersant 1 | 7.2 parts |
| Propylene glycol methyl ether acetate (PGMEA) | 77.77 parts by mass |

[Composition of Pigment Dispersion 2]

| | |
|---|---|
| C.I. Pigment Red 254 | 11.4 parts by mass |
| C.I. Pigment Yellow 139 | 2.3 parts by mass |

-continued

| | |
|---|---|
| Colorant Derivative 2 | 1.4 parts by mass |
| Dispersant 1 | 7.2 parts by mass |
| PGMEA | 77.77 parts by mass |

[Composition of Pigment Dispersion 3]

| | |
|---|---|
| C.I. Pigment Blue 15:6 | 11.4 parts by mass |
| C.I. Pigment Violet 23 | 2.3 parts by mass |
| Colorant Derivative 3 | 1.4 parts by mass |
| Dispersant 1 | 7.2 parts by mass |
| PGMEA | 81.9 parts by mass |

[Composition of Pigment Dispersion 4]

| | |
|---|---|
| C.I. Pigment Green 58 | 11.4 parts by mass |
| C.I. Pigment Yellow 185 | 2.3 parts by mass |
| Colorant Derivative 5 | 1.4 parts by mass |
| Dispersant 1 | 7.2 parts by mass |
| PGMEA | 81.9 parts by mass |

[Composition of Pigment Dispersion 5]

| | |
|---|---|
| C.I. Pigment Red 254 | 11.4 parts by mass |
| C.I. Pigment Yellow 139 | 2.3 parts by mass |
| Colorant Derivative 7 | 1.4 parts by mass |
| Dispersant 1 | 7.2 parts by mass |
| PGMEA | 77.77 parts by mass |

[Composition of Pigment Dispersion 6]

| | |
|---|---|
| C.I. Pigment Blue 15:6 | 11.4 parts by mass |
| C.I. Pigment Violet 23 | 2.3 parts by mass |
| Colorant Derivative 6 | 1.4 parts by mass |
| Dispersant 1 | 7.2 parts by mass |
| PGMEA | 81.9 parts by mass |

[Composition of Pigment Dispersion 7]

| | |
|---|---|
| C.I. Pigment Green 58 | 11.4 parts by mass |
| C.I. Pigment Yellow 185 | 2.3 parts by mass |
| Colorant Derivative 8 | 1.4 parts by mass |
| Dispersant 1 | 7.2 parts by mass |
| PGMEA | 81.9 parts by mass |

[Composition of Pigment Dispersion 8]

| | |
|---|---|
| C.I. Pigment Red 254 | 11.4 parts by mass |
| C.I. Pigment Yellow 139 | 2.3 parts by mass |
| Colorant Derivative 10 | 1.4 parts by mass |
| Dispersant 1 | 7.2 parts by mass |
| PGMEA | 77.77 parts by mass |

[Composition of Pigment Dispersion 9]

| | |
|---|---|
| C.I. Pigment Blue 15:6 | 11.4 parts by mass |
| C.I. Pigment Violet 23 | 2.3 parts by mass |
| Colorant Derivative 9 | 1.4 parts by mass |
| Dispersant 1 | 7.2 parts by mass |
| PGMEA | 81.9 parts by mass |

[Composition of Pigment Dispersion 10]

| | |
|---|---|
| C.I. Pigment Green 58 | 11.4 parts by mass |
| C.I. Pigment Yellow 185 | 2.3 parts by mass |
| Colorant Derivative 4 | 1.4 parts by mass |
| Dispersant 1 | 7.2 parts by mass |
| PGMEA | 81.9 parts by mass |

[Composition of Pigment Dispersion 11]

| | |
|---|---|
| C.I. Pigment Red 254 | 11.4 parts by mass |
| C.I. Pigment Yellow 139 | 2.3 parts by mass |
| Colorant Derivative 4 | 1.4 parts by mass |
| Dispersant 1 | 7.2 parts by mass |
| PGMEA | 77.77 parts by mass |

[Composition of Pigment Dispersion 12]

| | |
|---|---|
| C.I. Pigment Blue 15:6 | 11.4 parts by mass |
| C.I. Pigment Violet 23 | 2.3 parts by mass |
| Colorant Derivative 4 | 1.4 parts by mass |
| Dispersant 1 | 7.2 parts by mass |
| PGMEA | 81.9 parts by mass |

Colorant derivatives 1 to 10: compounds 1 to 10 having the following structures

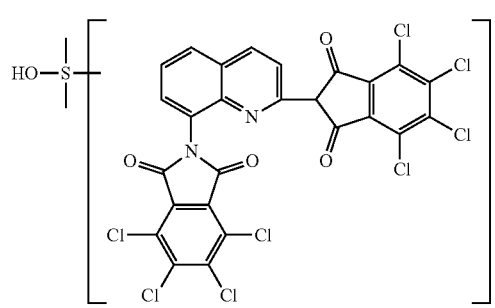

1

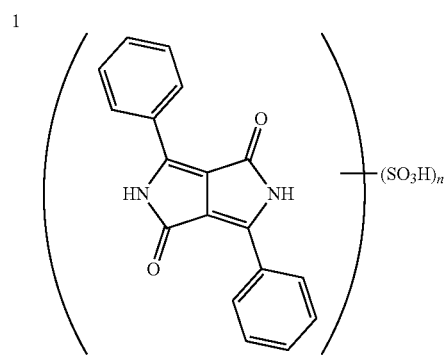

2 n = 1 or 2

-continued
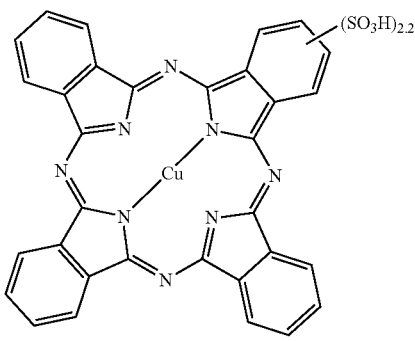
3
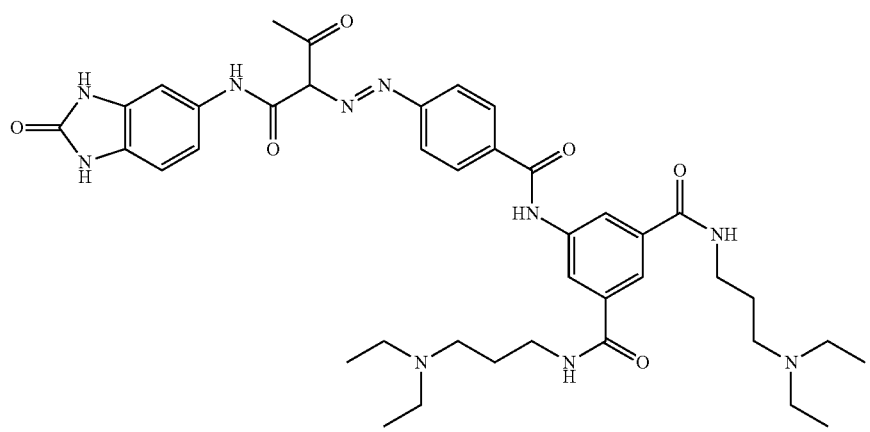
4
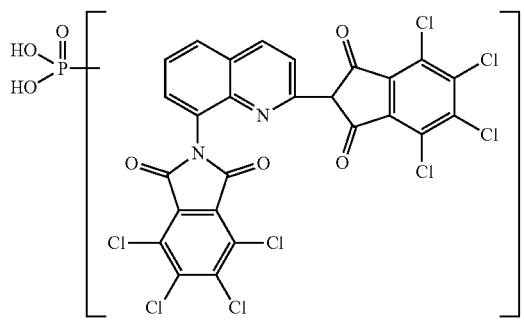
5
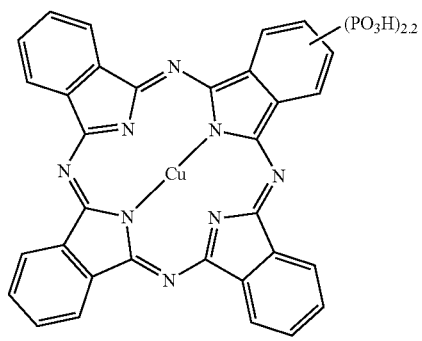
6
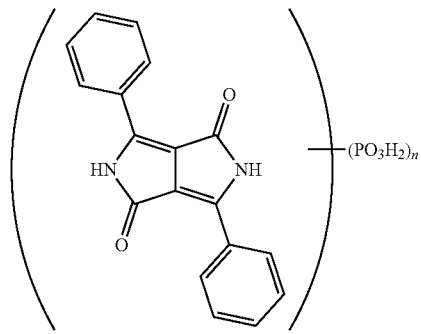
n = 1 or 2
7
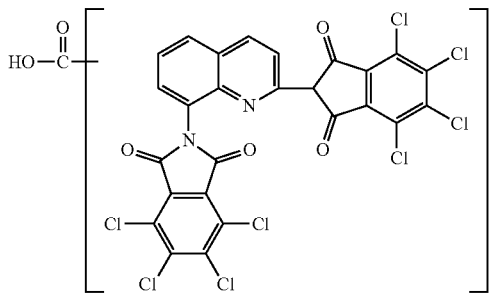
8

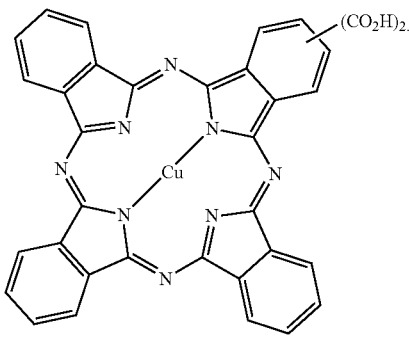

-continued

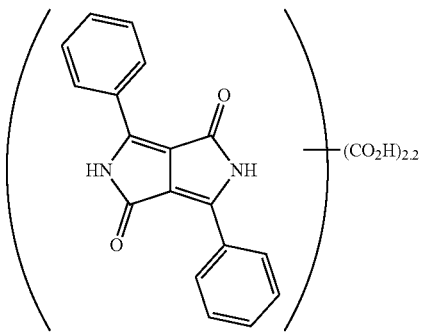

n = 1 or 2

[Preparation of Color Filter Layer-Forming Composition (Green Composition, Red Composition, Blue Composition)]

Raw materials shown in the following table were mixed and stirred at a ratio (part(s) by mass) shown in the following table, and the mixture was filtered through a nylon filter (manufactured by Pall Corporation) having a pore size of 0.45 μm. This way, Green compositions 1, 2, 3, and 4, Red compositions 1, 2, 3, and 4, and Blue compositions 1, 2, 3, and 4 were prepared.

TABLE 4

|  |  | Green Composition 1 | Red Composition 1 | Blue Composition 1 | Green Composition 2 | Red Composition 2 | Blue Composition 2 |
|---|---|---|---|---|---|---|---|
| Pigment Dispersion | 1 | 64.48 | — | — | — | — | — |
|  | 2 | — | 64.48 | — | — | — | — |
|  | 3 | — | — | 64.48 | — | — | — |
|  | 4 | — | — | — | 64.48 | — | — |
|  | 5 | — | — | — | — | 64.48 | — |
|  | 6 | — | — | — | — | — | 64.48 |
|  | 7 | — | — | — | — | — | — |
|  | 8 | — | — | — | — | — | — |
|  | 9 | — | — | — | — | — | — |
|  | 10 | — | — | — | — | — | — |
|  | 11 | — | — | — | — | — | — |
|  | 12 | — | — | — | — | — | — |
| Resin | 11 | 0.20 | 0.20 | 0.20 | 0.20 | 0.20 | 0.20 |
| Polymerizable Compound | 11 | 3.96 | 3.96 | 3.96 | 3.96 | 3.96 | 3.96 |
| Photopolymerization Initiator | 11 | 0.50 | 0.50 | — | 0.50 | 0.50 | — |
|  | 12 | — | — | 0.50 | — | — | 0.50 |
| Polymerization Inhibitor | | — | — | — | — | — | — |
| Solvent 11 | | — | — | — | — | — | — |
| Epoxy Compound | | 0.002 | 0.002 | 0002 | 0.002 | 0.002 | 0.002 |
| Surfactant 11 | | 29.15 | 29.15 | 29.15 | 29.15 | 29.15 | 29.15 |
| Epoxy Compound | | 0.88 | 0.88 | 0.88 | 0.88 | 0.88 | 0.88 |
| Surfactant 11 | | 0.83 | 0.83 | 0.83 | 0.83 | 0.83 | 0.83 |

|  |  | Green Composition 3 | Red Composition 3 | Blue Composition 3 | Green Composition 4 | Red Composition 4 | Blue Composition 4 |
|---|---|---|---|---|---|---|---|
| Pigment Dispersion | 1 | — | — | — | — | — | — |
|  | 2 | — | — | — | — | — | — |
|  | 3 | — | — | — | — | — | — |
|  | 4 | — | — | — | — | — | — |
|  | 5 | — | — | — | — | — | — |
|  | 6 | — | — | — | — | — | — |
|  | 7 | 64.48 | — | — | — | — | — |
|  | 8 | — | 64.48 | — | — | — | — |
|  | 9 | — | — | 64.48 | — | — | — |
|  | 10 | — | — | — | 64.48 | — | — |
|  | 11 | — | — | — | — | 64.48 | — |
|  | 12 | — | — | — | — | — | 64.48 |

TABLE 4-continued

| Resin 11 | 0.20 | 0.20 | 0.20 | 0.20 | 0.20 | 0.20 |
|---|---|---|---|---|---|---|
| Polymerizable Compound 11 | 3.96 | 3.96 | 3.96 | 3.96 | 3.96 | 3.96 |
| Photopolymerization Initiator 11 | 0.50 | 0.50 | — | 0.50 | 0.50 | — |
| Photopolymerization Initiator 12 | — | — | 0.50 | — | — | 0.50 |
| Polymerization Inhibitor | — | — | — | — | — | — |
| Solvent 11 | — | — | — | — | — | — |
| Epoxy Compound | 0.002 | 0.002 | 0.002 | 0.002 | 0.002 | 0.002 |
| Surfactant 11 | 29.15 | 29.15 | 29.15 | 29.15 | 29.15 | 29.15 |
| Epoxy Compound | 0.88 | 0.88 | 0.88 | 0.88 | 0.88 | 0.88 |
| Surfactant 11 | 0.83 | 0.83 | 0.83 | 0.83 | 0.83 | 0.83 |

The raw materials shown above in the table are as follows.

Resin 11: a resin having the following structure (acid value=70 mgKOH/g, Mw=11000, a numerical value added to a main chain represents a molar ratio, the resin was synthesized using a method described in paragraphs "0304" to "0307" of JP2012-173356A)

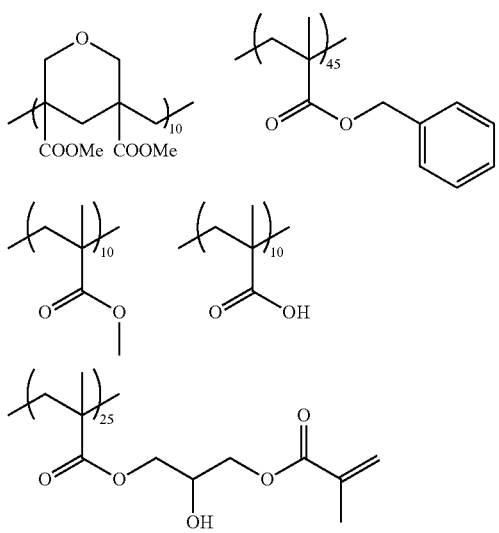

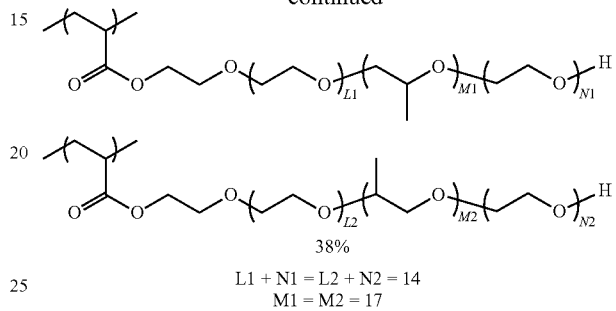

38%

L1 + N1 = L2 + N2 = 14
M1 = M2 = 17

Polymerizable compound 11: ARONIX M-350 (manufactured by Toagosei Co., Ltd.)

Photopolymerization initiator 11: IRGACURE-OXE03 (manufactured by BASF SE)

Photopolymerization initiator 12: IRGACURE-OXE04 (manufactured by BASF SE)

Polymerization inhibitor: p-methoxyphenol

Solvent 11: PGMEA

Epoxy compound: EHPE-3105 (manufactured by Daicel Corporation)

Surfactant 11: the following mixture (Mw=14000, in the following formula, "%" representing the proportion of a repeating unit is mol %)

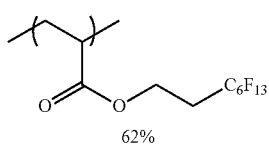

62%

<Manufacturing of Laminate>

A near infrared light absorbing layer-forming composition shown in the following table was applied to a glass substrate using a spin coating method such that the thickness of the formed coating film was 1.0 μm, and then was heated using a hot plate at 100° C. for 2 minutes. Next, the entire surface of the coating film was exposed using an i-ray stepper exposure device FPA-3000 i5+(manufactured by Canon Corporation) at an exposure dose of 1000 mJ/cm². Next, the coating film was heated using a hot plate at 220° C. for 5 minutes to form a near infrared light absorbing layer.

Next, a color filter layer-forming composition shown in the following table was applied to the near infrared light absorbing layer using a spin coating method such that the thickness of the formed coating film was 1.5 μm, and then was heated using a hot plate at 100° C. for 2 minutes. Next, the entire surface of the coating film was exposed using an i-ray stepper exposure device FPA-3000 i5+(manufactured by Canon Corporation) at an exposure dose of 1000 mJ/cm². Next, the coating film was heated using a hot plate at 220° C. for 5 minutes to form a color filter layer.

Next, using a sputtering apparatus (SRV-4300, manufactured by Shinko Seiki Co., Ltd.), SiO₂ was sputtered on the color filter layer to form an oxygen barrier film (SiO₂ film having a thickness of 0.1 μm) having an oxygen permeability of 200 ml/m²·day·atm.

<Heat Resistance>

The transmittance of the obtained laminate in a wavelength range of 400 to 1,300 nm was measured using an ultraviolet-visible-near infrared spectrophotometer U-4100 (manufactured by Hitachi High-Technologies Corporation).

Next, this laminate was heated using a hot plate at 260° C. for 300 seconds, and the transmittance in a wavelength range of 400 to 1,300 nm was measured after heating.

A difference between the transmittances of the laminate in a wavelength range of 400 to 1,300 nm measured before and after heating was calculated, a maximum value (ΔT) of the difference between the transmittances in the above-described range was obtained, and heat resistance was evaluated based on the following standards.

A: ΔT<1%
B: 1%≤ΔT<3%
C: 3%≤ΔT<5%
D: 5%≤ΔT

TABLE 5

| | Near Infrared Light Absorbing Layer-Forming Composition | Color Filter Layer-Forming Composition | Heat Resistance |
|---|---|---|---|
| Example 1 | IR Composition 1 | Green Composition 1 | A |
| Example 2 | IR Composition 2 | Green Composition 1 | A |
| Example 3 | IR Composition 3 | Green Composition 1 | A |
| Example 4 | IR Composition 4 | Green Composition 1 | A |
| Example 5 | IR Composition 5 | Green Composition 1 | A |
| Example 6 | IR Composition 6 | Green Composition 1 | A |
| Example 7 | IR Composition 7 | Green Composition 1 | A |
| Example 8 | IR Composition 8 | Green Composition 1 | A |
| Example 9 | IR Composition 9 | Green Composition 1 | A |
| Example 10 | IR Composition 10 | Green Composition 1 | A |
| Example 11 | IR Composition 11 | Green Composition 1 | A |
| Example 12 | IR Composition 12 | Green Composition 1 | A |
| Example 13 | IR Composition 13 | Green Composition 1 | A |
| Example 14 | IR Composition 14 | Green Composition 1 | A |
| Example 15 | IR Composition 15 | Green Composition 1 | A |
| Example 16 | IR Composition 16 | Green Composition 1 | B |
| Example 17 | IR Composition 17 | Green Composition 1 | B |
| Example 18 | IR Composition 18 | Green Composition 1 | A |
| Example 19 | IR Composition 19 | Green Composition 1 | A |
| Example 20 | IR Composition 5 | Green Composition 2 | B |
| Example 21 | IR Composition 5 | Green Composition 3 | C |
| Comparative Example 1 | IR Composition 15 | Green Composition 4 | D |
| Comparative Example 2 | IR Composition 16 | Green Composition 4 | D |
| Comparative Example 3 | IR Composition 17 | Green Composition 4 | D |
| Comparative Example 4 | IR Composition 20 | Green Composition 4 | D |

TABLE 6

| | Near Infrared Light Absorbing Layer-Forming Composition | Color Filter Layer-Forming Composition | Heat Resistance |
|---|---|---|---|
| Example 101 | IR Composition 1 | Red Composition 1 | A |
| Example 102 | IR Composition 2 | Red Composition 1 | A |
| Example 103 | IR Composition 3 | Red Composition 1 | A |
| Example 104 | IR Composition 4 | Red Composition 1 | A |
| Example 105 | IR Composition 5 | Red Composition 1 | A |
| Example 106 | IR Composition 6 | Red Composition 1 | A |
| Example 107 | IR Composition 7 | Red Composition 1 | A |
| Example 108 | IR Composition 8 | Red Composition 1 | A |
| Example 109 | IR Composition 9 | Red Composition 1 | A |
| Example 110 | IR Composition 10 | Red Composition 1 | A |
| Example 111 | IR Composition 11 | Red Composition 1 | A |
| Example 112 | IR Composition 12 | Red Composition 1 | A |
| Example 113 | IR Composition 13 | Red Composition 1 | A |
| Example 114 | IR Composition 14 | Red Composition 1 | A |
| Example 115 | IR Composition 15 | Red Composition 1 | A |
| Example 116 | IR Composition 16 | Red Composition 1 | B |
| Example 117 | IR Composition 17 | Red Composition 1 | B |
| Example 118 | IR Composition 18 | Red Composition 1 | A |
| Example 119 | IR Composition 19 | Red Composition 1 | A |
| Example 120 | IR Composition 5 | Red Composition 2 | B |
| Example 121 | IR Composition 5 | Red Composition 3 | C |
| Comparative Example 101 | IR Composition 15 | Red Composition 4 | D |
| Comparative Example 102 | IR Composition 16 | Red Composition 4 | D |
| Comparative Example 103 | IR Composition 17 | Red Composition 4 | D |
| Comparative Example 104 | IR Composition 20 | Red Composition 4 | D |

TABLE 7

| | Near Infrared Light Absorbing Layer-Forming Composition | Color Filter Layer-Forming Composition | Heat Resistance |
|---|---|---|---|
| Example 201 | IR Composition 1 | Blue Composition 1 | A |
| Example 202 | IR Composition 2 | Blue Composition 1 | A |
| Example 203 | IR Composition 3 | Blue Composition 1 | A |
| Example 204 | IR Composition 4 | Blue Composition 1 | A |
| Example 205 | IR Composition 5 | Blue Composition 1 | A |
| Example 206 | IR Composition 6 | Blue Composition 1 | A |
| Example 207 | IR Composition 7 | Blue Composition 1 | A |
| Example 208 | IR Composition 8 | Blue Composition 1 | A |
| Example 209 | IR Composition 9 | Blue Composition 1 | A |
| Example 210 | IR Composition 10 | Blue Composition 1 | A |
| Example 211 | IR Composition 11 | Blue Composition 1 | A |
| Example 212 | IR Composition 12 | Blue Composition 1 | A |
| Example 213 | IR Composition 13 | Blue Composition 1 | A |
| Example 214 | IR Composition 14 | Blue Composition 1 | A |
| Example 215 | IR Composition 15 | Blue Composition 1 | A |
| Example 216 | IR Composition 16 | Blue Composition 1 | B |
| Example 217 | IR Composition 17 | Blue Composition 1 | B |
| Example 218 | IR Composition 18 | Blue Composition 1 | A |
| Example 219 | IR Composition 19 | Blue Composition 1 | A |
| Example 220 | IR Composition 5 | Blue Composition 2 | B |
| Example 221 | IR Composition 5 | Blue Composition 3 | C |
| Comparative Example 201 | IR Composition 15 | Blue Composition 4 | D |
| Comparative Example 202 | IR Composition 16 | Blue Composition 4 | D |
| Comparative Example 203 | IR Composition 17 | Blue Composition 4 | D |
| Comparative Example 204 | IR Composition 20 | Blue Composition 4 | D |

As shown in the tables, in the laminates according to Examples in which in the near infrared light absorbing layer and the color filter layer, the content of the colorant compound to which the specific acid group was bonded was 0.1 to 99.9 mass % with respect to the total mass of the compounds having a colorant skeleton, heat resistance was excellent.

In each of Examples, even in a case where the laminate was manufactured by forming the color filter layer on the glass substrate and forming the near infrared light absorbing layer on the color filter layer, the same effects as those of each of Examples were obtained.

In addition, in each of Examples, even in a case where the oxygen permeability of the oxygen barrier film was changed to 150 ml/m²·day·atm, 100 ml/m²·day·atm, or 50 ml/m²·day·atm by adjusting the thickness of the oxygen barrier film, the same effects as those of each of Examples were obtained.

Test Example 2

The IR composition 5 was applied to a silicon wafer using a spin coating method such that the thickness of the formed coating film was 1.0 μm. Next, the coating film was heated using a hot plate at 100° C. for 2 minutes. Next, using an i-ray stepper exposure device FPA-3000 i5+(manufactured by Canon Corporation), the coating film was exposed through a mask of a 2 µm×2 µm Bayer pattern at an exposure dose of 1000 mJ/cm². Next, puddle development was performed at 23° C. for 60 seconds using a tetramethylammonium hydroxide (TMAH) 0.3 mass % aqueous solution. Next, the coating film was rinsed by spin showering and was cleaned with pure water. Next, the coating film was heated using a hot plate at 200° C. for 5 minutes. As a result, a 2 µm×2 µm Bayer pattern (near infrared light absorbing layer) was formed.

Next, the Red composition 1 was applied to the Bayer pattern of the near infrared light absorbing layer using a spin coating method such that the thickness of the formed coating film was 1.0 µm Next, the coating film was heated using a hot plate at 100° C. for 2 minutes. Next, using an i-ray stepper exposure device FPA-3000 i5+(manufactured by Canon Corporation), the coating film was exposed through a mask of a 2 µm×2 µm Bayer pattern at an exposure dose of 1000 mJ/cm². Next, puddle development was performed at 23° C. for 60 seconds using a tetramethylammonium hydroxide (TMAH) 0.3 mass % aqueous solution. Next, the coating film was rinsed by spin showering and was cleaned with pure water. Next, the coating film was heated using a hot plate at 200° C. for 5 minutes. As a result, the Red composition was patterned on the Bayer pattern of the near infrared light absorbing layer. Likewise, the Green composition 1 and the Blue composition 1 were sequentially patterned to form red, green, and blue color patterns to form the color filter layer.

Next, an infrared transmitting filter-forming composition was applied to the silicon wafer on which the color filter layer was formed using a spin coating method such that the thickness of the formed coating film was 2.0 µm. Next, the coating film was heated using a hot plate at 100° C. for 2 minutes. Next, using an i-ray stepper exposure device FPA-3000 i5+(manufactured by Canon Corporation), the coating film was exposed through a mask of a 2 µm×2 µm Bayer pattern at an exposure dose of 1000 mJ/cm². Next, puddle development was performed at 23° C. for 60 seconds using a tetramethylammonium hydroxide (TMAH) 0.3 mass % aqueous solution. Next, the coating film was rinsed by spin showering and was cleaned with pure water. Next, the coating film was heated using a hot plate at 200° C. for 5 minutes. As a result, an infrared transmitting layer was patterned on a portion of the near infrared light absorbing layer where the Bayer pattern was not formed. The obtained filter was incorporated into a solid image pickup element using a well-known method. The obtained solid image pickup element was irradiated with light emitted from a 940 nm infrared light emitting diode (infrared LED) as a light source in a low-illuminance environment (0.001 Lux) to acquire images. Next, the imaging performance of the solid image pickup element was evaluated. The subject was able to be clearly recognized on the image. In addition, incidence angle dependence was good. In addition, this solid image pickup element had an infrared sensing function and a color recognition function.

The infrared transmitting filter-forming composition used in Test Example 2 is as follows.
(Infrared Transmitting Filter-Forming Composition)

The following components were mixed and stirred, and the obtained mixture was filtered through a nylon filter (manufactured by Pall Corporation) having a pore size of 0.45 µm to prepare an infrared transmitting filter-forming composition.

| | |
|---|---|
| Pigment Dispersion 100 | 95.04 parts by mass |
| Polymerizable compound (ARONIX M-305, manufactured by Toagosei Co., Ltd.) | 1.84 parts by mass |
| Resin (a 40 mass % PGMEA solution of a resin having the following structure, acid value = 70 mgKOH/g, Mw = 11000, a numerical value added to a main chain represents a molar ratio) | 1.02 parts by mass |

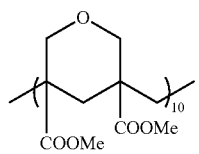

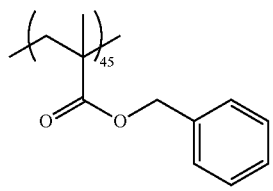

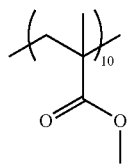

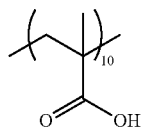

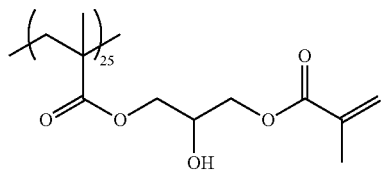

| | |
|---|---|
| Photopolymerization initiator (IRGACURE-OXE01, manufactured by BASF SE) | 0.883 parts by mass |
| Surfactant (a 1 mass % PGMEA solution of the following mixture (Mw: 14000), in the following formula, "%" representing the proportion of a repeating unit is mass %) | 0.04 parts by mass |

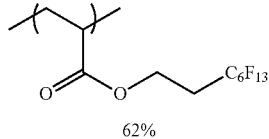

62%

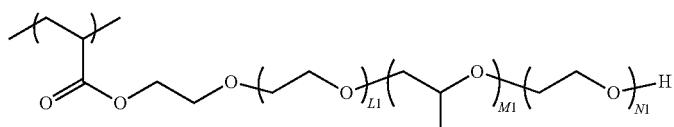

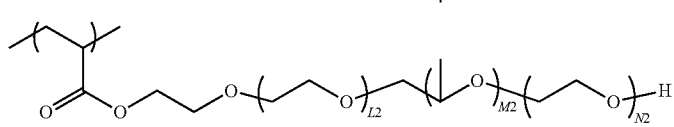

$L1 + N1 + L2 + N2 = 14$
$M1 + M2 = 17$

38%

| | |
|---|---|
| Polymerization inhibitor (p-methoxyphenol) | 0.001 parts by mass |
| PGMEA | 1.18 parts by mass |

Pigment Dispersion 100

A mixed solution having the following composition was mixed and dispersed using a beads mill (a high-pressure disperser with a pressure reducing mechanism, NANO-3000-10 (manufactured by Nippon BEE Chemical Co., Ltd.)), with zirconia beads having a diameter of 0.3 mm, until an average particle size (secondary particles) of a pyrrolopyrrole pigment was 75 nm or less. As a result, a pigment dispersion was prepared. The volume average particle size of a pigment in the pigment dispersion was measured using MICROTRAC UPA 150 (manufactured by Nikkiso Co., Ltd.).

| | |
|---|---|
| Pyrrolopyrrole pigment (the following compound) | 2.1 parts by mass |

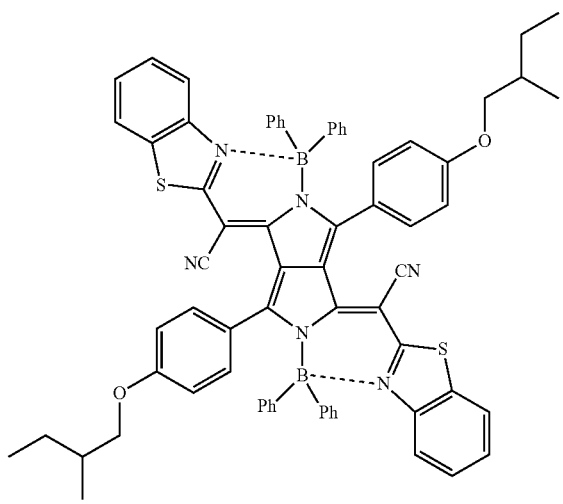

-continued

| | |
|---|---|
| C.I. Pigment Red 254 | 2.1 parts by mass |
| C.I. Pigment Blue 15:6 | 2.1 parts by mass |
| Pigment derivative (a compound having the following structure) | 1.9 parts by mass |

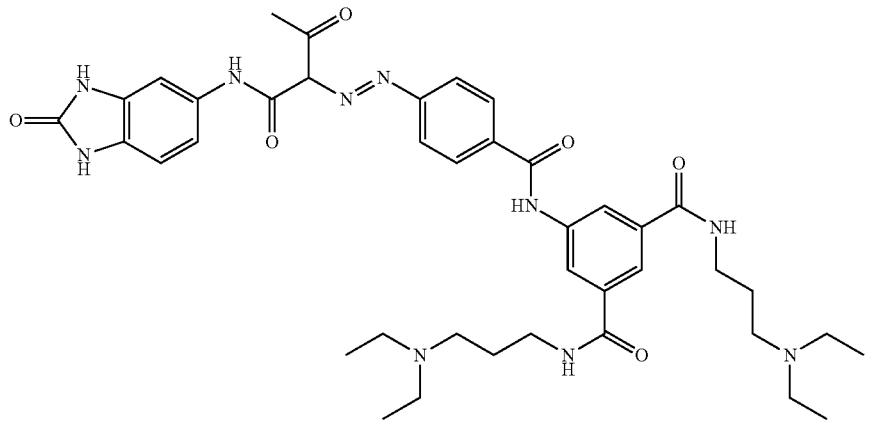 [SMILES: CCN(CC)CCCNC(=O)c1cc(NC(=O)c2ccc(/N=N/C(C(C)=O)C(=O)Nc3ccc4[nH]c(=O)[nH]c4c3)cc2)cc(C(=O)NCCCN(CC)CC)c1]

Resin having the following structure (weight-average molecular weight: 8500, numerical values added to a main chain represent a molar ratio, a numerical value added to a side chain represents the number of repeating units) — 6.8 parts by mass

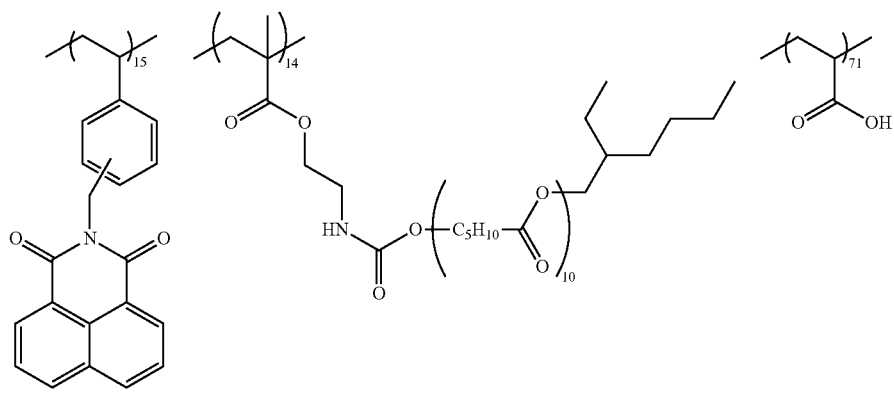

EXPLANATION OF REFERENCES

110: solid image pickup element
111: near infrared light absorbing layer
112: color filter layer
114: infrared transmitting filter layer
115: microlens
116: planarizing layer

What is claimed is:

1. A laminate comprising:
a near infrared light absorbing layer that includes a near infrared absorbing colorant;
a color filter layer that is arranged adjacent to the near infrared light absorbing layer in a thickness direction and includes a chromatic colorant; and
an oxygen barrier film that is formed on a laminate including the near infrared light absorbing layer and the color filter layer in this order,
wherein the near infrared absorbing colorant is a dye,
the near infrared absorbing colorant is at least one selected from the group consisting of a pyrrolopyrrole compound, a cyanine compound, and a squarylium compound,
the color filter layer includes a pigment as the chromatic colorant,
5 to 50 mass % of the chromatic colorant has a sulfo group bonded to a colorant skeleton,
the color filter layer includes colored pixels of multiple colors, and each of the colored pixels does not include the chromatic colorant in which an amino group is bonded to a colorant skeleton of the chromatic colorant or a colorant derivative in which an amino group is bonded to a colorant skeleton of the colorant derivative,
an oxygen permeability of the oxygen barrier film is 200 ml/m²·day·atm or lower,
the oxygen barrier film is formed at least one selected form the group consisting of $SiO_2$, SiN, $Al_2O_3$, CaO, $Fe_2O_3$, MgO, GazO, $ZrO_2$, $TiO_2$, $CaF_2$, tetraethoxysilane, tetraethyl orthotitanate, tetramethoxysilane, ethyltriethoxysilane, and methyl trimethoxysilane, and
the oxygen barrier film is an outmost layer interposed with a planarizing layer and a lens layer.

2. An optical filter comprising:
the laminate according to claim 1.

3. A solid image pickup element comprising:
a sensor and
the laminate according to claim 1.

4. An image display device comprising:
an image display device and
the laminate according to claim 1.

5. An infrared sensor comprising:
a sensor and
the laminate according to claim 1.

6. The laminate according to claim 1,
wherein the oxygen barrier film is formed using $SiO_2$.

7. A kit that is used for manufacturing a laminate,
the laminate including:
a near infrared light absorbing layer that includes a near infrared absorbing colorant,
a color filter layer that is arranged adjacent to the near infrared light absorbing layer in a thickness direction and includes a chromatic colorant, and
an oxygen barrier film that is formed on a laminate including the near infrared light absorbing layer and the color filter layer in this order, in which 5 to 50 mass % of at least one of the near infrared light absorbing colorant and the chromatic colorant has an acid group selected from the group consisting of a sulfo group, a phosphate group, and a carboxyl group bonded to a colorant skeleton, and
the kit comprising:
a near infrared light absorbing layer-forming composition that includes the near infrared absorbing colorant; and
a color filter layer-forming composition that includes the chromatic colorant,
wherein the near infrared absorbing colorant is a dye,
the near infrared absorbing colorant is at least one selected from the group consisting of a pyrrolopyrrole compound, a cyanine compound, and a squarylium compound,
5 to 50 mass % of the chromatic colorant has a sulfo group bonded to the colorant skeleton, and
the color filter layer includes colored pixels of multiple colors, and each of the colored pixels does not include the chromatic colorant in which an amino group is bonded to a colorant skeleton of the chromatic colorant or a colorant derivative in which an amino group is bonded to a colorant skeleton of the colorant derivative,
an oxygen permeability of the oxygen barrier film is 200 $ml/m^2 \cdot day \cdot atm$ or lower,
the oxygen barrier film is formed at least one selected form the group consisting of $SiO_2$, SiN, $Al_2O_3$, CaO, $Fe_2O_3$, MgO, GazO, $ZrO_2$, $TiO_2$, $CaF_2$, tetraethoxysilane, tetraethyl orthotitanate, tetramethoxysilane, ethyltriethoxysilane, and methyl trimethoxysilane, and
the oxygen barrier film is an outmost layer interposed with a planarizing layer and a lens layer.

8. The laminate according to claim 7,
wherein the oxygen barrier film is formed using $SiO_2$.

* * * * *